United States Patent [19]
Sasaoka et al.

[11] Patent Number: 6,010,769
[45] Date of Patent: Jan. 4, 2000

[54] MULTILAYER WIRING BOARD AND METHOD FOR FORMING THE SAME

[75] Inventors: Kenji Sasaoka, Zama; Hiroshi Odaira, Chigasaki; Madoka Fujiwara, Fuchu; Fumitoshi Ikegaya, Ebina; Takahiro Mori, Kawasaki, all of Japan

[73] Assignee: Kabushiki Kaisha Toshiba, Japan

[21] Appl. No.: 08/875,093

[22] PCT Filed: Nov. 18, 1996

[86] PCT No.: PCT/JP96/03378

§ 371 Date: Jul. 16, 1997

§ 102(e) Date: Jul. 16, 1997

[87] PCT Pub. No.: WO97/19579

PCT Pub. Date: May 29, 1997

[30] Foreign Application Priority Data

Nov. 17, 1995 [JP] Japan ................................ 7-299668
May 30, 1996 [JP] Japan ................................ 8-137254
Nov. 1, 1996 [JP] Japan ................................ 8-291634

[51] Int. Cl.[7] .................................................. B32B 3/00
[52] U.S. Cl. ........................... 428/209; 174/262; 427/97; 428/901
[58] Field of Search ................... 174/261, 262; 428/131, 209, 901; 427/97

[56] References Cited

U.S. PATENT DOCUMENTS

| | | | |
|---|---|---|---|
| 3,346,950 | 10/1967 | Schick ..................................... | 174/262 |
| 3,436,819 | 4/1969 | Lunine .................................... | 174/261 |
| 3,764,436 | 10/1973 | Schmidt et al. ........................ | 156/288 |
| 4,706,167 | 11/1987 | Sullivan ................................. | 174/261 |
| 5,117,069 | 5/1992 | Higgins, III ............................ | 174/261 |
| 5,340,947 | 8/1994 | Credle et al. ........................... | 174/262 |
| 5,440,075 | 8/1995 | Kawakita et al. ...................... | 174/261 |
| 5,473,120 | 12/1995 | Ito et al. ................................ | 174/261 |
| 5,478,972 | 12/1995 | Mizutani et al. ....................... | 174/261 |
| 5,527,999 | 6/1996 | Knigga et al. .......................... | 174/262 |
| 5,585,157 | 12/1996 | Taguchi .................................. | 428/131 |

FOREIGN PATENT DOCUMENTS

| | | |
|---|---|---|
| 0379736A1 | 8/1990 | European Pat. Off. . |
| 0608726A1 | 8/1994 | European Pat. Off. . |
| 0620701A2 | 10/1994 | European Pat. Off. . |
| WO94/24704 | 10/1994 | European Pat. Off. . |
| 0647990A1 | 4/1995 | European Pat. Off. . |
| 2722639 | 1/1998 | France . |
| 195 15 159A1 | 11/1995 | Germany . |
| 4-341772 | 11/1992 | Japan . |
| 6-342977 | 12/1994 | Japan . |
| 6-350250 | 12/1994 | Japan . |
| 7-14628 | 1/1995 | Japan . |
| 7-86749 | 3/1995 | Japan . |
| 7-245479 | 9/1995 | Japan . |

OTHER PUBLICATIONS

European Search Report, concerning european application No. 96938496.5.

*Primary Examiner*—Deborah Jones
*Assistant Examiner*—Cathy F. Lam
*Attorney, Agent, or Firm*—Finnegan, Henderson, Farabow, Garrett & Dunner, L.L.P.

[57] ABSTRACT

A multilayered wiring board using conductive pillars for the interconnection of wiring layers. Since through holes are bored in the via lands of the wiring layers of the multilayered wiring board, the stress applied between the conductive pillars and wiring layers can be released at the time of connecting the conductive pillars to the via lands. Since the external side face of each conductive pillar smoothly continues to the surface of the via land at the contact section between the conductive pillar and the via land, the notch effect is relieved. Therefore, the reliability of the interconnection is secured even when a stress is applied to the connections during the manufacturing of the multilayered wiring board, and the mounting of electronic elements, etc.

59 Claims, 33 Drawing Sheets

MULTILAYER WIRING BOARD AND METHOD FOR FORMING THE SAME

TECHNICAL FIELD

The present invention relates to a multilayer wiring board (MLB) and a method for manufacturing the same, and more particularly to a multilayer wiring board in which via hole is not for connection between conductor wiring layers and a method for manufacturing the same. The present invention also relates to prefabricated materials for a multilayer wiring board, and the invention relates more particularly to a prefabricated material for a multilayer wiring board performing a via connection between conductive wiring layers by means of conductive pillars.

In addition, the invention relates to an electronic element, and more particularly to an electronic element provided with connecting portions suitable for high-density mounting to an external circuit.

Furthermore, the invention relates to an electronic element package having at least an electronic element mounted on a wiring board, and for example, relates to such an electronic element package having a highly integrated electronic element mounted on a wiring board such as a chip-sized package (CSP) of a semiconductor device.

Still further, the invention relates to a method for forming a conductive pillar used in a via connection in a multilayer wiring board or a connecting portion between an electronic element and an external circuit, as described above.

BACKGROUND ART

As various electronic equipment becomes smaller in size and higher in function, the demand for higher mounting density of electronic elements has been increased. To meet this demand, a multilayer wiring board in which an insulating layer and a wiring layer are stacked alternately has been widely used. To meet the demands for high mounting density and high performance, the wiring board having multiple wiring layers and each wiring layer is connected by via connection such as a via hole to the other wiring layer.

FIG. 24 is a sectional view showing one example of a construction of conventional multilayer wiring board. This multilayer wiring board 901 is constructed by via connecting wiring circuits formed in five layers. A first wiring layer 901, a second wiring layer 902, a third wiring layer 903, a fourth wiring layer 904, and a fifth wiring layer 905 are each formed by patterning a conductor layer. These wiring circuits are isolated by an insulating layer 906.

A general method for manufacturing a multilayer wiring board having a typical structure as shown in FIG. 24 will be described below.

First, in order to connect the layers of a double faced laminate, in which a conductor layer such as copper foil is bonded to both faces of insulating layer, through holes 907 are formed at portions to be electrically connected of the double faced laminate. Chemical plating is applied to the inside wall surface of the through hole 907, and further electroplating is applied to increase the thickness of a conductor layer 907b on the inside wall surface of the through hole 907, thereby enhancing the reliability of connection between layers.

Then, the conductor layers on both faces are patterned into a predetermined circuit by, for example, the photo-etching process.

Next, an insulating layer such as a prepreg layer is laminated on the patterned conductor layer and further a conductor layer such as copper foil is laminated to achieve integration by heating and pressurization. By repeating the process from the formation of through holes to the patterning of circuit, a multilayer wiring board is formed.

Such a multilayer wiring board, in which via hole is used for connection between wiring layers, has a problem in that it is difficult to respond to high-density mounting of a electronic element.

For example, generally speaking, neither wiring is formed nor electronic elements are mounted in the region where a through hole is provided, so that the increase in wiring density and mounting density is restricted. Also, in recent years, along with high-density mounting of electronic elements, the wiring of wiring board has become dense. If attempts are made to decrease the diameter of through hole in response to high density of wiring, it becomes difficult to assure reliability of connection between layers.

The connection between wiring layers using through holes is redundant because it entails a process for forming through holes and a process for plating, which presents a problem of productivity.

For example, the process for forming through holes requires much time for drilling work because holes are made one after another by using a drill. Also, the position where a through hole is formed requires a high accuracy, and the plating adhesion property etc. on the inside wall surface of through hole must be considered. Therefore, the control of accuracy of through hole formation, forming conditions, etc is troublesome.

In addition, in the plating process where electrical connection between a plurality of wiring layers is formed via through holes, process control such as control of concentration and temperature of chemicals is also troublesome. Further, large-scale equipment is required for forming through holes and plating.

Such connection between layers of multilayer wiring board using through holes decreases the productivity of wiring board (PWB), so that it is difficult to meet the demand for lower cost.

To simplify the electrical connection between wiring layers of multilayer wiring board, a method in which the connection between wiring layers is performed by means of conductive bumps has also been proposed. With this method, conductive bumps are formed on a via land, which is an interlayer connection formed in the wiring circuit, and by inserting an interlayer insulating layer in the thickness direction, the connection with the via land formed on the opposite wiring layer is established.

FIG. 25A and FIG. 25B show one example of a method for manufacturing a multilayer wiring board in which the wiring layers are connected by using such conductive bumps.

First, a double faced wiring board 913, in which wiring circuit 912 consisting of copper is formed on both surfaces of, for example, paper/phenol base insulating resin substrate 911, is prepared as an core layer. The wiring circuit 912 formed on both surfaces of the insulating resin substrate 911 has a via land 912a for interlayer connection. On this via land 912a, a conductive bump 914 formed by printing, for example, conductive paste is formed.

Next, an insulating resin sheet 915 of B stage (semi-cured) and a copper foil 916 are laminated, and on both sides of the double faced wiring board 913, the wiring circuit 912 and the copper foil 916 are arranged via the insulating resin sheet 915 so as to face each other (FIG. 25A).

By pressurizing and heating these laminates, the insulating resin sheet 915 of B stage is cured to integrate all layers. At this time, the conductive bumps 914 pierce the insulating resin sheet 915 of B stage (semi cured) by pressure, and are bonded in integration with the copper foil 916 while producing plastic deformation etc. Thus, the connection between conductor layers is formed by the conductive bumps.

A through hole 917 is formed at a predetermined position, and the through hole 917 is filled with a conductive material such as silver paste 918, or the inside wall of the through hole 917 is coated with a conductive material such as silver paste, by which the conductor layers of outer layer are connected to each other. The copper foil 916 of outer layer is patterned by, for example, the photo-etching process to form a predetermined wiring circuit 916b including the via land 916a, by which a multilayer wiring board in which the conductive bumps and through holes are combined for interlayer connection of wiring circuit is formed (FIG. 25A).

FIG. 26A and FIG. 26B show another example of a method for manufacturing a multilayer wiring board in which the wiring layers are connected by using the conductive bumps.

First, a double faced wiring board 923, in which a wiring circuit 922 is formed by affixing, for example, glass cloth and copper foil to both surfaces of an epoxy resin substrate 921, curing, and patterning, is prepared as an inside layer core. The wiring circuit 922 formed on both surfaces of the double faced wiring board 923 has a via land 922a for interlayer connection.

On the other hand, a copper foil 925 formed with conductive bumps 924 and an epoxy resin prepreg 926 are prepared. The conductive bumps 924 are formed at positions such as to correspond to the via land 922a when the copper foil 925 and the double faced wiring board 923 are laminated.

Next, as shown in FIG. 26A, after the copper foil 925 is arranged on both sides of the double faced wiring board 923 via the prepreg 926, all layers are integrated by pressurization and heating. By this pressurization, the conductive bumps 924 face each other. At this time, the conductive bumps 924 pierce the prepreg 926 of B stage (semi cured) by pressure, and are bonded in integration with the via land 922a while producing plastic deformation etc. Thus, the connection between conductor layers is formed by the conductive bumps.

A through hole 927 is formed at a predetermined position, and the through hole 927 is plated with a conductor layer 918 such as copper, for example, by which the conductor layers are connected to each other.

Thereafter, the copper foil 925 of outer layer is patterned by, for example, the photo-etching process to form a predetermined wiring circuit 926b including the via land 925b, by which a multilayer wiring board in which the conductive bumps and plated through holes are combined for interlayer connection of wiring circuit is formed (FIG. 26B).

Such interlayer connection of wiring circuits employing conductive bumps has advantages of simple construction, high productivity due to a small number of processes, and response to high-density mounting. However, the wiring board in which interlayer connection of wiring layer is made by using the conductive bumps often presents the problems as described below.

For example, in the manufacturing method shown in FIG. 25, the insulating resin layer 915 and the copper foil 916 are laminated on the double faced wiring board 913 in which conductive bumps 914 are formed on the via land 912a, a hard metallic press plates are applied from the outside, and all layers are integrated by pressurizing and heating from both surfaces.

By this pressurizing process, the copper foil 916 exposed to the outer layer becomes substantially flat. However, since the conductive bump 914 is generally harder than the insulating resin substrate 911 of the double faced wiring board 913, the via land 912a is liable to become concave, and cracks are produced on the via land 912a. Thus, the via connection is sometimes damaged.

Such a problem is remarkable especially on the connection on outer layer side. FIG. 27 schematically shows a via connection of the MLB shown in FIG. 7 made concave by the pressurizing process. In the worst case, the connection between the via land 922a and the wiring circuit 922 are broken off, so that the function as multilayer wiring board is sometimes lost. The method shown in FIG. 25 also presents the exactly same problem.

Such a problem greatly decreases the reliability of multilayer wiring board, and is one of the main causes for decreasing the productivity of wiring board.

The present invention was made to solve the above problems, and accordingly an object thereof is to provide a multilayer wiring board capable of being constructed by a simple means and having highly reliable via connection. Another object of the present invention is to provide a manufacturing method with high productivity for a highly reliable multilayer wiring board.

As a problem of a multilayer wiring board using a conventional conductive bump, it is desired to more greatly improve reliability of via connection in case of bearing a thermal load or a mechanical load (stress).

The reliability of the wiring board in which interlayer connection of wiring circuit is made by using the conductive bumps, as shown in FIG. 25 and FIG. 26, especially poses a problem under the ordinary operating conditions.

However, when the wiring board using conductive bumps is used for equipment requiring high reliability, such as industrial electronic equipment, the reliability of interlayer connection is feared.

The wiring board requiring high reliability must sufficiently withstand a severe thermal stress. Even when a thermal cycle test, in which the wiring board is exposed to a high temperature of, for example, about 125° C. and then cooled to about −65° C., is performed, the conductive bump for connecting a plurality of wiring layers must not be peeled off, or the wiring circuit in the same layer must not be impaired.

However, the connection between the conductive bump and the wiring layer connected by this conductive bump is sometimes broken off by the thermal stress, so that it is difficult to assure high reliability such as to withstand the industrial application.

The present invention was made to solve such a problem. Accordingly, an object of the present invention is to provide a wiring board having an improved reliability of interlayer connection, and materials for the wiring board, and a method for manufacturing the wiring board.

In addition, since electronic elements including a semiconductor device have been remarkably highly integrated in recent years, problems in mounting have also appeared. For example, the number of connecting points between an electronic element and an external circuit has been increased with the progress of higher integration. It is demanded to establish a high-density mounting technology capable of performing connection between more electrodes in a smaller area. Additionally, since a conventional mounting method using a solder bump or the like uses solder containing lead, there is a problem that workers' health is injured or it is difficult to dispose it as a waste matter.

SUMMARY OF THE INVENTION

This invention has been carried out to solve these problems described as above.

A multilayer wiring board in the present invention as claimed in claim 1 is a multilayer wiring board having a lamination of wiring layers and at least an insulating layer, comprising: a first insulating layer having a first face; a first wiring layer formed on the first face of the first insulating layer, the first wiring layer having a first via land, and the first via land having a through hole; a second wiring layer formed on the first wiring layer; a second via land formed on the second insulating layer in face with the first via land; and a conductive pillar connecting the first via land and the second via land, the pillar having an intruded zone in the first insulating layer through the hole of the first via land.

A multilayer wiring board in the present invention as claimed in claim 2 is a multilayer wiring board as set forth in claim 1, wherein a rigidity of the conductive pillar is higher than a rigidity of the first insulating layer.

A multilayer wiring board in the present invention as claimed in claim 3 is a multilayer wiring board as set forth in claim 1, wherein the conductive pillar is made of a conductive resin.

A multilayer wiring board in the present invention as claimed in claim 4 is a multilayer wiring board as set forth in claim 1, wherein the contact portion of the outer side surface of the conductive pillar and the surface of the first and the second via land having a shape so as to relax a stress concentration applied between the conductive pillar and the first and the second via land.

A multilayer wiring board in the present invention as claimed in claim 5 is a multilayer wiring board as set forth in claim 1, wherein the contact portion of the outer side surface of the conductive pillar and the surface of the first and the second via land having a part smoothly continuous.

A multilayer wiring board in the present invention as claimed in claim 6 is a multilayer wiring board as set forth in claim 1, wherein an angle of the outer side surface of the conductive pillar and the surface of the first and the second via land is an acute angle.

A multilayer wiring board in the present invention as claimed in claim 7 is a multilayer wiring board having a lamination of wiring layers and at least an insulating layer, comprising: a first insulating layer having a first face; a first wiring layer formed on the first face of the first insulating layer, the first wiring layer having a first via land; a second insulating layer formed on the first wiring layer; a second via land formed on the second insulating layer, and the second via land formed in face with the first via land; a conductive pillar connecting the first via land and the second via land; and a stress releasing means formed in the first or the second via land for releasing a stress applied perpendicular to the surface of the first or the second via land.

A multilayer wiring board in the present invention as claimed in claim 8 is a multilayer wiring board as set forth in claim 7, wherein the stress releasing means is at least one through hole formed in the first via land or second via land.

A multilayer wiring board in the present invention as claimed in claim 9 is a multilayer wiring board as set forth in claim 7, wherein a rigidity of the conductive pillar is higher than a rigidity of the first insulating layer.

A multilayer wiring board in the present invention as claimed in claim 10 is a multilayer wiring board as set forth in claim 7, wherein the conductive pillar is made of a conductive resin.

A multilayer wiring board in the present invention as claimed in claim 11 is a multilayer wiring board as set forth in claim 7, wherein the contact portion of the outer side surface of the conductive pillar and the surface of the first and the second via land having a shape so as to relax a stress concentration applied between the conductive pillar and the first and the second via land.

A multilayer wiring board in the present invention as claimed in claim 12 is a multilayer wiring board as set forth in claim 71 wherein the contact portion of the outer side surface of the conductive pillar and the surface of the first and the second via land having a part smoothly continuous.

A multilayer wiring board in the present invention as claimed in claim 13 is a multilayer wiring board as set forth in claim 7, wherein an angle of the outer side surface of the conductive pillar and the surface of the first and the second via land is an acute angle.

A multilayer wiring board in the present invention as claimed in claim 14 is a multilayer wiring board having a lamination of a wiring layer and an insulating layer, comprising: an insulating layer having a first face and a second face; a first wiring layer formed on the first face of the insulating layer, and the first wiring layer having a first via land; a second wiring layer formed on the second face of the insulating layer, the second wiring layer having a second via land, and the second via land formed in face with the first via land; and a conductive pillar connecting the first via land and the second via land, wherein the contact portion of the outer side surface of the conductive pillar and the surface of the first and the second via land having a shape so as to relax a stress concentration applied between the conductive pillar and the first and the second via land.

A multilayer wiring board in the present invention as claimed in claim 15 is a multilayer wiring board as set forth in claim 14, wherein the conductive pillar is made of a conductive resin.

A multilayer wiring board in the present invention as claimed in claim 16 is a multilayer wiring board as set forth in claim 14, wherein an linear thermal expansion coefficient in the axial direction of the conductive pillar is larger than that of the insulating layer.

A multilayer wiring board in the present invention as claimed in claim 17 is a multilayer wiring board as set forth in claim 14, wherein the shape of the contact portion of the outer side surface of the conductive pillar and the surface of the first and the second via land having a part smoothly continuous.

A multilayer wiring board in the present invention as claimed in claim 18 is a multilayer wiring board as set forth in claim 17, wherein the conductive pillar is made of a conductive resin.

A multilayer wiring board in the present invention as claimed in claim 19 is a multilayer wiring board as set forth in claim 17, wherein an linear thermal expansion coefficient in the axial direction of the conductive pillar is larger than that of the insulating layer.

A multilayer wiring board in the present invention as claimed in claim 20 is a multilayer wiring board as set forth in claim 14, wherein the shape of the contact portion having a part of an angle of the outer side surface of the conductive pillar and the surface of the first and the second via land is an acute.

A multilayer wiring board in the present invention as claimed in claim 21 is a multilayer wiring board as set forth in claim 20, wherein the conductive pillar is made of a conductive resin.

A multilayer wiring board in the present invention as claimed in claim 22 is a multilayer wiring board as set forth in claim 20, wherein an linear thermal expansion coefficient in the axial direction of the conductive pillar is larger than that of the insulating layer.

A prefabricated material for a multilayer wiring board in the present invention as claimed in claim 23 is a prefabricated material for a multilayer wiring board, comprising: a conductor layer; a conductive pillar formed on the conductor layer, the conductive pillar having substantially conical shape; a insulating layer formed so that a part of the conductive pillar is exposed on the insulating layer, the insulating layer is made of a uncured insulating resin, wherein the height of the conductive pillar h is approximately in the range from 1.2 d to 5 d when taking the thickness of the insulating layer as d.

A prefabricated material for a multilayer wiring board in the present invention as claimed in claim 24 is a prefabricated material for a multilayer wiring board as set forth in claim 23, wherein the contact portion of the outer side surface of the conductive pillar and the surface of the conductor layer having a shape so as to relax a stress concentration applied between the conductive pillar and the conductor layer.

A prefabricated material for a multilayer wiring board in the present invention as claimed in claim 25 is a prefabricated material for a multilayer wiring board as set forth in claim 23, wherein a shape of the contact portion of the outer side surface of the conductive pillar and the surface of the conductor layer having a part smoothly continuous.

A method for manufacturing a multilayer wiring board in the present invention as claimed in claim 26 is a method for manufacturing a multilayer wiring board, comprising: a step of forming a first wiring layer having a first via land with a stress releasing means on a first insulating layer; a step of forming a conductive pillar having a substantially conical shape at a region of a conductor layer in face with the first via land when opposed to the first wiring layer; a step of arranging the first insulating layer and the conductor layer so as to face the first via land with the conductive pillar; and a step of pressing the first insulating layer and the conductor layer in the axial direction of the conductive pillar so as to connect the first via land and the conductive pillar.

A method for manufacturing a multilayer wiring board in the present invention as claimed in claim 27 is a method for manufacturing a multilayer wiring board as set forth in claim 26, wherein the stress releasing means is a hole formed in the first via land, and in the step of pressing the first insulating layer and the conductor layer, wherein the first insulating layer and the conductor layer are pressed so that a part of the conductive pillar intrudes into the first insulating layer through the hole of the first via land.

A method for manufacturing a multilayer wiring board in the present invention as claimed in claim 28 is a method for manufacturing a multilayer wiring board, comprising: a step of forming a first wiring layer having a first via land with a stress releasing means on a first face of a first insulating layer; a step of forming a conductive pillar having a substantially conical shape on a first via land; a step of laminating a second insulating layer made of an uncured resin so that a part of the conductive pillar is exposed; a step of opposing the first face of the first insulating layer and a conductor layer; and a step of pressing the first insulating layer and the conductor layer in the axial direction of the conductive pillar so as to connect the conductive pillar and the conductor layer.

A method for manufacturing a multilayer wiring board in the present invention as claimed in claim 29 is a method for manufacturing a multilayer wiring board as set forth in claim 28, wherein the stress releasing means is a hole formed in the first via land, and in the step of pressing the first insulating layer and the conductor layer, wherein the first insulating layer and the conductor layer are pressed so that a part of the conductive pillar intrudes into the first insulating layer through the hole of the first via land.

A method for manufacturing a multilayer wiring board in the present invention as claimed in claim 30 is a method for manufacturing a multilayer wiring board, comprising: a step of forming a first wiring layer having a first via land with a stress releasing means on a first face of a first insulating layer; a step of forming a first conductive pillar having a substantially conical shape on the first via land; a step of forming a second conductive pillar having a substantially conical shape at a region of a conductor layer in face with the first conductive pillar when opposed to the first wiring layer; a step of arranging a second insulating layer made of an uncured resin intervened between the first insulating layer and the conductor layer so as to face the first conductive pillar with the second conductive pillar; and a step of pressing the first insulating layer and the conductor layer in the axial direction of the conductive pillar so as to connect the first conductive pillar and the second conductive pillar.

A method for manufacturing a multilayer wiring board in the present invention as claimed in claim 31 is a method for manufacturing a multilayer wiring board as set forth in claim 30, wherein the stress releasing means is a hole formed in the first or the second via land, and in the step of pressing the first insulating layer and the conductor layer, wherein the first insulating layer and the conductor layer are pressed so that a part of the first conductive pillar intrudes into the first insulating layer through the hole of the first via land.

A method for manufacturing a multilayer wiring board in the present invention as claimed in claim 32 is a method for manufacturing a multilayer wiring board, comprising: a step of forming a first conductive pillar having a substantially conical shape on a first conductor layer so that the contact portion of the outer side surface of the conductive pillar and the first conductor layer having a shape so as to relax a stress concentration applied between the conductive pillar and the second conductive layer; a step of laminating a insulating layer made of an uncured resin so that a part of the conductive pillar is exposed; a step of pressing the conductive pillar in its axial direction so that the exposed part of the conductive pillar is plastically crushed; a step of arranging a second conductor layer on the insulating layer; a step of pressing the first conductor layer and the second conductor layer being connected in the axial direction of the conductive pillar; and a step of curing the insulating layer.

A method for manufacturing a multilayer wiring board in the present invention as claimed in claim 33 is a method for manufacturing a multilayer wiring board as set forth in claim 32, in the step of pressing the first and the second conductor layer, wherein the first and the second conductive layer are pressed so that the contact portion of the outer side surface of the conductive pillar and the second conductor layer having a shape so as to relax a stress concentration applied between the conductive pillar and the second conductive layer.

A method for manufacturing a multilayer wiring board in the present invention as claimed in claim 34 is a method for manufacturing a multilayer wiring board as set forth in claim 32, in the step of pressing the first and the second conductor layer, wherein the first and the second conductive layer are pressed so that a contact portion of the outer side surface of the conductive pillar and the second conductor layer having a part smoothly continuous.

A method for manufacturing a multilayer wiring board in the present invention as claimed in claim 35 is a method for manufacturing a multilayer wiring board as set forth in claim 32, wherein a step of forming the conductive pillar, a height of the conductive pillar h is approximately in the range of 1.2 d≦h≦5 d when taking a thickness of the uncured insulating layer as d.

A method for manufacturing a multilayer wiring board in the present invention as claimed in claim 36 is a method for manufacturing a multilayer wiring board as set forth in claim 32, wherein a step of forming the conductive pillar, an thickness of the uncured insulating layer d is approximately in the range of 0.02 h≦d≦0.8 h when taking a height of the conductive pillar as h.

A method for manufacturing a multilayer wiring board in the present invention as claimed in claim 37 is a method for manufacturing a multilayer wiring board, comprising: a step of forming a first conductive pillar on a first conductor layer so that a contact portion of the outer side surface of the first conductive pillar and the first conductor layer having a part smoothly continuous; a step of forming a second conductive pillar on a second conductor layer so that a contact portion of the outer side surface of the second conductive pillar and the second conductor layer having a part smoothly continuous; a step of arranging a insulating layer made of an uncured resin intervened between the first and the second conductor layer so as to face the first conductive pillar with the second conductive pillar; a step of pressing the first and the second conductor layer in the axial direction of the conductive pillar so as to connect the first conductive pillar and the second conductive pillar; and a step of curing the insulating layer.

A method for manufacturing a multilayer wiring board in the present invention as claimed in claim 38 is a method for manufacturing a multilayer wiring board as set forth in claim 37, wherein a step of forming the conductive pillar, a height of the conductive pillar h is approximately in the range of 1.2 d≦h≦5 d when taking a thickness of the uncured insulating layer as d.

A method for manufacturing a multilayer wiring board in the present invention as claimed in claim 39 is a method for manufacturing a multilayer wiring board as set forth in claim 37, wherein a step of forming the conductive pillar, an thickness of the uncured insulating layer d is approximately in the range of 0.02 h≦d≦0.8 h when taking a height of the conductive pillar as h.

An electronic element in the present invention as claimed in claim 40 is an electronic element, comprising: an electrode formed on a first face of the electronic element; and, a conductive pillar formed on the electrode of the electronic element; wherein the contact portion of the outer side surface of the conductive pillar and the surface of the electrode having a shape so as to relax a stress concentration applied between the conductive pillar and the electrode.

An electronic element as claimed in claim 41 is an electronic element as set forth in claim 40, wherein the contact portion of the outer side surface of the conductive pillar and the surface of the electrode having at least a part smoothly continuous.

An electronic element as claimed in claim 42 is an electronic element as set forth in claim 40, wherein an angle of the outer side surface of the conductive pillar and the surface of the electrode is an acute angle.

An electronic element package as claimed in claim 43 is an electronic element as set forth in claim 40, wherein the electronic element is a semiconductor element.

An electronic element package as claimed in claim 44 is an electronic element package, comprising: an electronic element having an electrode formed on a first face of the electronic element; and a wiring board comprises a first insulating layer having a first face and a second face, the first face of the insulating layer is faced with the first face of the electronic element, a first wiring layer formed on the second face of the first insulating layer, the first wiring layer having a first via land, and a first conductive pillar connecting the first via land and the electrode.

An electronic element package in the present invention as claimed in claim 45 is an electronic element package as set forth in claim 44, wherein the first via land having a stress releasing means.

An electronic element package in the present invention as claimed in claim 46 is an electronic element package as set forth in claim 44, wherein the contact portion of the outer side surface of the first conductive pillar and the surface of the electrode having a shape so as to relax a stress concentration applied between the first conductive pillar and the electrode.

An electronic element package in the present invention as claimed in claim 47 is an electronic element package as set forth in claim 44, wherein the contact portion of the outer side surface of the first conductive pillar and the surface of the electrode having at least a part smoothly continuous.

An electronic element package in the present invention as claimed in claim 48 is an electronic element package as set forth in claim 44, wherein an angle of the outer side surface of the first conductive pillar and the surface of the electrode is an acute angle.

An electronic element package in the present invention as claimed in claim 49 is an electronic element package as set forth in claim 44, wherein the electronic element is a semiconductor element.

An electronic element package in the present invention as claimed in claim 50 is an electronic element package as set forth in claim 49, wherein the semiconductor element is a bear semiconductor chip.

An electronic element package in the present invention as claimed in claim 51 is an electronic element package, comprising: an electronic element having an electrode formed on a first face of the electronic element; and a wiring board, comprises a first insulating layer having a first face and a second face, the first face of the insulating layer is faced with the first face of the electronic element, a first wiring layer formed on the second face of the first insulating layer, the first wiring layer having a first via land, and a first conductive pillar connecting the first via land and the electrode a second insulating layer having a first face and a second face, the first face of the second insulating layer is faced with the second face of the first insulating layer, a second wiring layer formed on the second face of the second insulating layer, the second wiring layer having a second via land, and a second conductive pillar connecting the first via land and the second via land.

An electronic element package in the present invention as claimed in claim 52 is an electronic element package as set forth in claim 51, wherein the first via land having a stress releasing means.

An electronic element package in the present invention as claimed in claim 53 is an electronic element package as set forth in claim 51, wherein the contact portion of the outer side surface of the first conductive pillar and the surface of the electrode having a shape so as to relax a stress concentration applied between the first conductive pillar and the electrode.

An electronic element package in the present invention as claimed in claim 54 is an electronic element package as set forth in claim 51, wherein the contact portion of the outer side surface of the first conductive pillar and the surface of the electrode having at least a part smoothly continuous.

An electronic element package in the present invention as claimed in claim 55 is an electronic element package as set forth in claim 51, wherein an angle of the outer side surface of the first conductive pillar and the surface of the electrode is an acute angle.

An electronic element package in the present invention as claimed in claim 56 is an electronic element package as set forth in claim 51, wherein the electronic element is a semiconductor element.

An electronic element package in the present invention as claimed in claim 57 is an electronic element package as set forth in claim 51, wherein the semiconductor element is a bear semiconductor chip.

A method for forming a conductive pillar in the present invention as claimed in claim 58 is a method for forming a conductive pillar, comprising the steps of: a step of arranging a mask having a through hole onto a conductor layer, the shape of the through hole of the mask is substantially cylindrical; a step of filling a conductive resin into the through hole of the mask; and a step of removing the mask and the conductor layer each other in the normal direction of the conductor layer.

A method for forming a conductive pillar in the present invention as claimed in claim 59 is a method for forming a conductive pillar as set forth in claim 58, wherein the step of removing the mask and the conductor layer each other in the normal direction of the conductor layer so that the conductive resin is forming a substantially conical shape on the conductor layer, and the contact portion of the outer side surface of the conductive resin and the conductor layer having a shape so as to relax a stress concentration applied between the conductive resin and the conductive layer.

A method for forming a conductive pillar in the present invention as claimed in claim 60 is a method for forming a conductive pillar as set forth in claim 58, wherein the step of removing the mask and the conductor layer each other in the normal direction of the conductor layer so that the conductive resin is forming a substantially conical shape on the conductor layer, and the contact portion of the outer side surface of the conductive resin and the surface of the conductive layer having at least a part smoothly continuous.

A method for forming a conductive pillar in the present invention as claimed in claim 61 is a method for forming a conductive pillar as set forth in claim 58, wherein the step of removing the mask and the conductor layer each other in the normal direction of the conductor layer so that the conductive resin is forming a substantially conical shape on the conductor layer, and wherein an angle of the outer side surface of the conductive resin and the surface of the conductive layer is an acute angle.

A method for forming a conductive pillar in the present invention as claimed in claim 62 is a method for forming a conductive pillar as set forth in claim 58, wherein the step of filling a conductive resin, a viscosity of the conductive resin is determined so that a part of the conductive resin remains onto the inner surface of the through hole of the mask when the step of removing the mask and the conductor layer.

A method for forming a conductive pillar in the present invention as claimed in claim 63 is a method for forming a conductive pillar as set forth in claim 58, the step of filling a conductive resin carried by a screen printing.

DETAILED DESCRIPTION

The multilayer wiring board in accordance with the present invention releases stresses acting on the via connection by employing a via land having a stress releasing means, and prevents the breakage of via land and the breakage of connection between the via land and the wiring circuit.

The stress releasing means provided by the via land is, for example, a hole passing through the via land. This hole is generally a small hole having a diameter smaller than the largest diameter of a conductive pillar. This hole may have any shape if the stresses acting on the via land and the wiring circuit connected to the via land, especially the normal stress, can be reduced when the conductive pillar is pressed in its axial direction. For example, the shape may be circular, elliptical, star-shaped, or gourd-shaped, however, a shape which can be drawn by a smooth continuous closed curve is suitable. This is because if there is a notch portion, stresses concentrate at this portion, resulting in the breakage of via land and wiring layer. The number of holes formed in the via land may be single or plural.

The hole formed on the via land should have a diameter such that sufficient electrical connection is established when the conductive pillar is pressure welded. For example, when the conductive pillar is formed on only one of via lands, the average diameter of hole of via land may be set at about 0.1 to 0.25 mm when the diameter of conductive pillar at the portion of the same height as the thickness of a second insulating layer from the bottom is about 0.3 mm and the via land outside diameter is about 0.7 mm.

The interlayer connection of the multilayer wiring board of the present invention employing the conductive pillars can relax the normal stress acting especially on the via land by providing a via land having such a stress releasing means. Also, the conductive pillar intrudes the first insulating layer in a cured state, however cannot pierce easily, so that plastic deformation occurs even in the surface direction of via land. The plastic deformation of the conductive pillar in the surface direction of via land relaxes the tangential stress as well. Therefore, the via land is not broken, and the function thereof can be maintained.

The formation of hole, which is a stress releasing means for via land, is preferably performed at the same time that the wiring layer to which this via land belongs is patterned into a predetermined wiring circuit. This is because the steps of processes need not be increased if the formation is performed at the same time that the wiring circuit is patterned. The hole can be formed in advance at a predetermined position of the conductor layer, however the productivity decreases.

Another feature of the multilayer wiring board in accordance with the present invention is that the via connection employing the conductive pillar is so constructed that the connection between the wiring layer and the conductive pillar is not peeled off. That is, the connection between the outer peripheral surface of conductive pillar having hyperboloid of one sheet or hyperboloid of revolution of one sheet is so formed that the notch effect acting on the connection of intersurface between the conductive pillar and the via land is relaxed. By combining the connection between the conductive pillar having a shape relaxes a stress concentration and the via land and the via land having the above-described stress releasing means, the reliability of the multilayer wiring board is further improved.

The present invention in which the via connection of multilayer wiring board using the conductive pillars is constructed so that the connection between the wiring layer and the conductive pillar is not peeled off was based on the following knowledge obtained by the inventors.

The inventors analyzed the force acting on the connection using the conductive pillars in order to improve the reliability of interlayer connection using the conductive pillars.

The conductive pillar formed through the insulating layer connects a first via land of a first wiring layer separated by the insulating layer with a second via land of a second wiring layer. For example, in the case of solder reflow step in the mounting process, the interlayer connection of such construction is subjected to thermal load, so that a stress resulting from the difference in thermal expansion coefficient occurs.

For example, the thermal expansion coefficient of copper is $19.0 \times 10^{-6}$ [°K.$^{-1}$], that of silver is $17.0 \times 10^{-6}$ [°K.$^{-1}$], and that of aluminum is $23.0 \times 10^{-6}$ [°K.$^{-1}$].

On the other hand, for the thermal expansion coefficient of insulating resin, for example, in the case of FR-4 (NEMA standard), the coefficients of thermal expansion in the longitudinal direction $\alpha 1=1.3 \times 10^{-5}$ [°K.$^{-1}$] and $\alpha 2=1.5 \times 10^{-6}$ [°K.$^{-1}$], the coefficients of thermal expansion in the transverse direction $\alpha 1=1.8 \times 10^{-5}$ [°K.$^{-1}$] and $\alpha 2=1.4 \times 10^{-5}$ [°K.$^{-1}$], and the coefficients of thermal expansion in the thickness direction $\alpha 1=5.1 \times 10^{-5}$ [°K.$^{-1}$] and $\alpha 2=2.6 \times 10^{-4}$ [°K.$^{-1}$]. Here, $\alpha 1$ is the thermal expansion coefficient for temperatures not higher than the glass transition temperature Tg, and $\alpha 2$ is the thermal expansion coefficient for temperatures not lower than the glass transition temperature Tg. The glass transition temperature of FR-4 is about 125° C.

The longitudinal direction is the elongated direction of a glass cross in a plane of the glass cross. The transverse direction is perpendicular to the longitudinal direction in the same plane.

Thus, the thermal expansion coefficient of the resin material for insulating layer is higher than the thermal expansion coefficient of the conductor metal composing the wiring layer including via land and the principal portion of conductive pillar. In particular, the thermal expansion coefficient in the thickness direction (normal direction of sheet) of the insulating layer, which relates closely to the reliability of via connection, is far larger than the thermal expansion coefficient of the general conductor metal used for the wiring layer, being higher by one to two orders of magnitude. Also, the thermal expansion coefficient in the thickness direction of the insulating resin layer at temperatures higher than the glass transition temperature Tg is far higher than the thermal expansion coefficient at temperatures lower than the glass transition temperature Tg. This tendency is the same for insulating resin materials such a trend as this is seen in the same way also in an insulating resin material such as GPY, FR-5, CEM-3, CEM-1, FR-3, FR-2, XXXPC, FR-1, XPC, G-10, and the like.

That is, the thermal expansion coefficient in the axial direction of the conductive pillar is lower than the thermal expansion coefficient of resin material composing the insulating layer as described above not only when the material forming the conductive pillar is a metal but also even when the material is a conductive resin composition in which conductive metal powder is dispersed in binder resin.

Therefore, when a thermal load is applied to the via connection using the conductive pillars, a large stress is produced in the central axis direction (in parallel with the normal direction of insulating layer) of the conductive pillar due to the difference between the thermal expansion coefficient of conductive pillar and that of the insulating layer. This stress generally acts so as to peel the conductive pillar from the connection of the first and second via land. That is, a tension acts in the normal direction on the intersurface between the conductive pillar and the first via land, which is a face perpendicular to the central axis of conductive pillar, and the intersurface between the conductive pillar and the second via land.

Also, such a stress acting on the via connection using the conductive pillars caused by thermal load is highest at the point where three parts of insulating layer, conductive pillar, and wiring layer meet. That is, when a thermal load is applied to the via connection using the conductive pillars, the triple junction where materials with different physical properties meet is a point where the greatest stress acts because the three parts of insulating layer, conductive pillar, and wiring layer have different physical properties such as thermal expansion coefficient and rigidity.

The inventor analyzed the stress produced on the via connection by simulation using the physical property constants of materials. The analysis result revealed that the stress action acting so as to peel the conductive pillar from the wiring layer depends on the angle formed between the via land surface and the outer peripheral surface of conductive pillar at the portion where the wiring layer (via land) connects to the conductive pillar.

That is, when the hyperboloid shaped outer peripheral surface of conductive pillar connects smoothly and continuously to the surface of via land, the strength against peeling is high, but if there is a notch at the connection between the outer peripheral surface of conductive pillar and the via land, stresses concentrate at this portion, resulting in a decrease in the peeling strength. The sharper the notch is, the greater the decrease in peeling strength is. It was also found that if the outer peripheral surface of conductive pillar connects smoothly to the surface of via land as a whole, the peeling strength can be maintained even if there is a microscopic notch. The connection between the outer peripheral surface of conductive pillar and the surface of via land draws an approximately circular closed curve, and when all parts on this closed curve connect smoothly, the maximum peeling strength is obtained. Anyway, if at least a part of this closed curve connects smoothly, the peeling strength can be increased as compared with the case where the closed curve connects while all parts thereof have a notch of a shape such that the stress concentration factor is great.

The multilayer wiring board in accordance with the present invention was provided based on the above-described knowledge. Therefore, the multilayer wiring board of this invention has a via connection using a conductive pillar, and at least a part of the portion where the outer peripheral surface of conductive pillar connects to the surface of via land connects smoothly.

Such a joint between the conductive pillar and the via land can be obtained by once pressing the tip end of conductive pillar by means of, for example, a hard stainless steel plate for plastic deformation, and by pressing a metallic foil for wiring layer in this state. Also, by properly setting the height of conductive pillar in formation with respect to the thickness of insulating layer which is pierced by the conductive pillar, the joint between the conductive pillar and the via land, which relax the notch effect, can be achieved easily. Here, the notch effect means a effect that stresses concentrate at the notch portion and deformation and breakage is liable to occur when an external force is applied to a solid having a notch. For the multilayer wiring board in accordance with the present invention, the shape of the connection between the conductive pillar and the conductor layer or via land is formed by controlling so as to decrease the stress concentration factor.

For the wiring layer composing the multilayer wiring board of the present invention, a metallic material that can be used as a wiring material, including copper and aluminum, can be used. Also, a conductive resin can be used. By patterning the conductor layer by photo-etching process or by screen printing the conductive resin, a wiring layer having a wiring circuit of a predetermined pattern can be formed.

The conductive pillar used for the interlayer connection of the multilayer wiring board of the present invention can be formed by a conductive materials such as conductive resin and conductive paste. It can also be formed by various metallic materials.

For the conductive materials, the binders consisting of resin material etc. include conductive powder such as silver, gold, copper, and solder powder and conductive resin in which conductive fine particles are mixed or dispersed. A plurality of metals and alloys combined can be used as the conductive material.

The resins for binder component generally include thermoplastic resins such as polycarbonate resin, polysulfone resin, polyester resin, and phenoxy resin, and thermosetting resins such as phenolic resin, polyimide resin, and epoxy resin. In addition to these resins, ultraviolet curing type resins or electron beam irradiation curing type resins such as methyl methacrylate, diethylmethyl methacrylate, trimethylolpropane triacrylate, diethylene glycol diethyl acrylate, methyl acrylate, diethylene glycol ethoxylate acrylate, acrylate of $\epsilon$-caprolactone modified dipentaerythritol can be included. In addition, a solvent may be used in response to demand.

In order to form a conductive pillar by using such a conductive resin, the conductive resin may be screen-printed using a mask, such as a metal mask, for example. A conductive pillar can be formed in a desired shape by adjusting the metal mask in shape, hole diameter, and thickness as well as adjusting the conductive resin layer in viscosity, thixotropy, surface tension, or adjusting the mask in such physical properties as surface tension and the like. In order to control the shape of a conductive pillar, it is preferable to make the conductive resin greater in viscosity than in case that it is usually used. In addition, a conductive resin material having thixotropy can be also used as adjusting the conductive resin material in thixotropy by means of ultrasonic vibration and the like.

A conductive resin which a hole of the mask is filled with in such a way is deformed as being stretched between the conductor layer and the metal mask by drawing the mask and the conductive layer apart from each other in the normal direction of the conductive layer and as a result a conductive pillar having a nearly conical shape is formed on the conductive layer. Such a method can give a conductive pillar which has a small contact angle $\theta$ to the conductive layer and has a joining shape so as to reduce a notch effect.

In case of attempting to form a conductive pillar having a higher aspect ratio, it can do to adjust the shape of the mask holes, physical properties of the conductive resin and the like or it can do also to relocate the mask at the same position and repeat a screen printing.

And a conductive pillar may be formed by not only a screen printing but also a stamping method which presses out a conductive paste into holes of the mask, or other methods. By such a method also, a conductive pillar having a high aspect ratio can be formed out of a conductive paste, a conductive resin or the like in the same way as a screen printing. In addition, a conductive pillar of metal may be formed by means of a plating method or the like.

The conductive pillar may be formed on the conductor layer such as copper foil, or may be formed on the patterned wiring layer.

Also, the conductive pillar is formed on, for example, a synthetic resin sheet having good peeling property (e.g. Teflon resin such as polyvinylidene fluoride), the conductive pillar is embedded in a semi-cured state insulating resin layer, and copper foil and wiring layer may be pressed on the bottom thereof.

A conductive pillar can be used not only for via connection in a multilayer wiring board but also for connection between an electronic element such as a semiconductor device and a wiring circuit having the electronic element mounted on it by forming the conductive pillar on an electrode of the electronic element.

For the insulating layer electrically separating wiring layers connected by the conductive pillar, composing the multilayer wiring board of the present invention, for example, general insulating resin materials can be used. The thickness thereof may be set as necessary, for example, may be set at about 40 to 800 $\mu$m. Also, the thickness of the insulating layer may be set together with the height of the conductive pillar.

The thermoplastic resin materials that can be used as the insulating layer include polycarbonate resin, polysulfone resin, thermoplastic polyimide resin, polyethylene resin 4-fluoride, polyethylene resin 6-fluoride, and polyether etherketone resin. These insulating resin materials formed into a sheet shape can be used.

The thermosetting resin materials include epoxy resin, bismaleimide triazine resin, polyimide resin, phenol resin, polyester resin, and melamine resin, or butadiene rubber and butyl rubber. Also, raw rubber sheets of natural rubber, neoprene rubber, or silicone rubber can be used as the thermosetting resin materials.

These insulating resin materials may be used independently, or may be used by filling an insulating inorganic or organic substance. Further, they can be used by combining with a reinforcing material such as glass cloth or glass mat, synthetic fiber or mat, and paper.

An electronic element of the invention is an electronic element in which a conductive pillar having an approximately conical shape as described above has been formed on an electrode or pads formed on a connecting portion to an external circuit. In addition, an electronic element package of the invention is an electronic element package in which an electronic element is mounted by means of conductive pillars.

A contact portion between a conductive pillar and an electrode of an electronic element is so shaped as to reduce a stress concentration generated between the conductive pillar and the electrode. The shape of the contact portion between the conductive pillar and the electrode can do with a shape having an area where the outside surface of the conductive pillar and the surface of the electrode are smoothly joined with each other. In addition, for example the shape may also have a portion in which an angle θ made between the outside surface of the conductive pillar and the surface of the electrode is an acute angle.

An electronic element of the invention having such a shape of a connecting portion to an external circuit can give an electronic element package of the invention by being mounted on a multilayer wiring board by means of the same method as a multilayer-manufacturing process for making a multilayer wiring board of the invention.

For example, first, a wiring layer of a predetermined pattern having a via land at a position corresponding to an electrode of an electronic element and the electronic element having a conductive pillar formed on the electrode are arranged so as to be opposite to each other with an unhardened insulating resin layer between them. In addition, when they are pressed from both sides of them, the conductive pillar penetrates the semicured insulating resin layer and is connected to the via land as being deformed by plastic deformation. At the same time, the insulating resin layer is cured completely by heating.

As described above, an electronic element and an electronic element package of the invention have a great advantage that soldering is not needed in mounting. In addition, since wiring of lead wires from an electronic element can be performed on a plurality of wiring layers by mounting the electronic element on a multilayer wiring board of the invention, the mounting density is remarkably improved. In this case, it is possible to consider an electronic element mounted on the wiring board as an equivalent to the outermost one layer of the multilayer wiring board in composition. Accordingly, wiring of lead wires from an electronic element can be performed three-dimensionally between a plurality of wiring layers by performing via connection, through a conductive pillar, between a via land of a wiring layer to be connected with an electrode of an electronic element through a conductive pillar and a via land of another wiring layer.

BRIEF DESCRIPTION OF THE DRAWINGS

The accompanying drawings provide a further understanding of the invention and, together with the detailed description, explain the principles of the invention. In the drawings:

FIG. 20A is a first perspective view of an electronic element consistent with the present invention, while

BEST MODE FOR CARRYING OUT THE INVENTION

EXAMPLE 1

Figure 1:
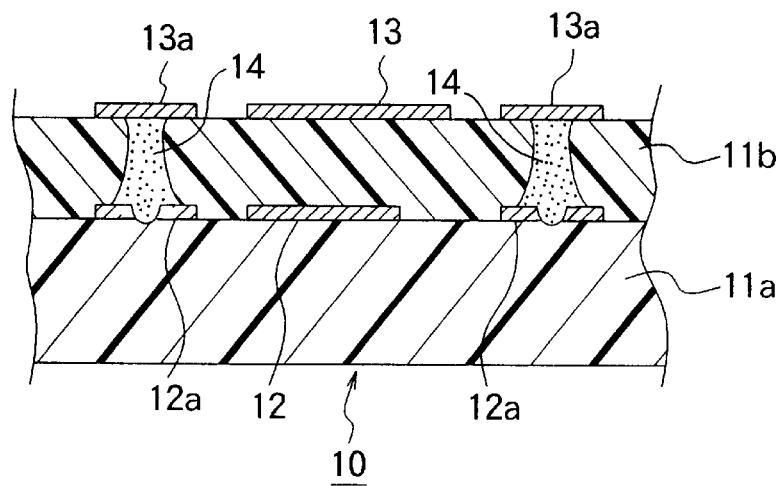
FIG. 1 is a cross-sectional view of a multilayer wiring board consistent with the present invention.

FIG. 1 schematically shows a construction of a multilayer wiring board in accordance with the present invention, in which wiring layers consisting of conductors are laminated via insulating layers.

For this multilayer wiring board 10, a first wiring layer 12 is formed on a first insulating layer 11a, and the first wiring layer 12 is provided with a first via land 12a as a part of its circuit pattern. A second insulating layer 11b is formed on the first wiring layer 12, and a second wiring layer 13 is formed on the second insulating layer 11b. The second wiring layer is provided with a second via land 13a at a position corresponding to the via land 12a of the first wiring layer.

The first and second via lands arranged in face with each other via the second insulating layer 11b are connected to each other by a conductive pillar 14. That is, this multilayer wiring board 10 makes interlayer connection of different wiring layers by the conductive pillar 14.

One feature of the multilayer wiring board of the present invention is that the first via land 12a has a means for releasing a stress applied in the axial direction of the conductive pillar 14, and in this case, the first via land 12a is formed with a through hole 12b.

Figure 2:
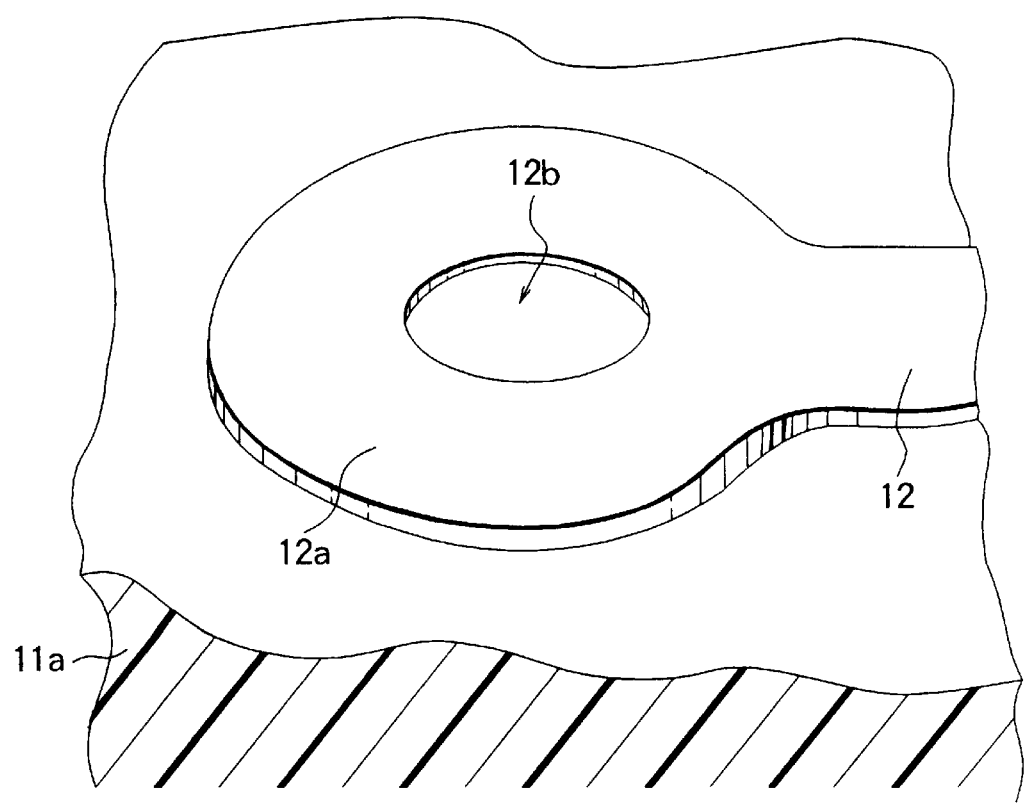
FIG. 2 is a diagram showing an example of the shape of a first via land.
Figure 3A:
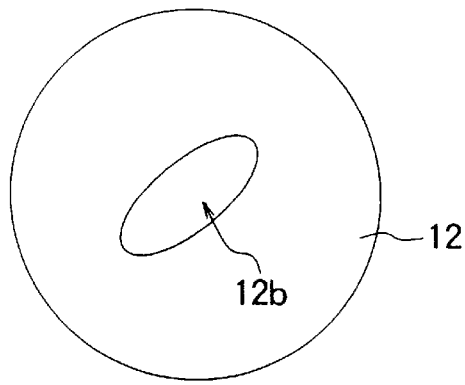
FIG. 3A, FIG. 3B, FIG. 3C, FIG. 3D, and FIG. 3E are diagrams showing other examples of the shape of the first via land.
Figure 3B:
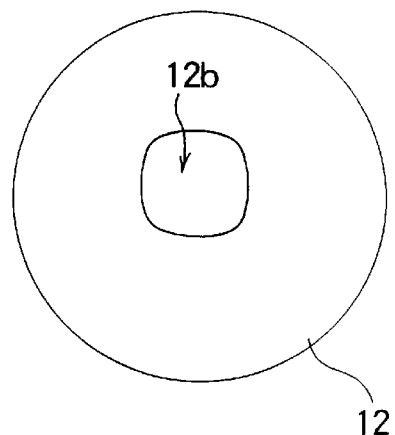
Figure 3C:
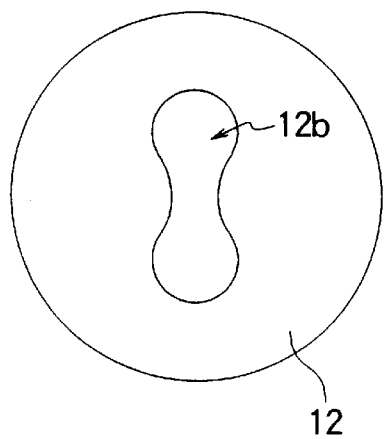
Figure 3D:
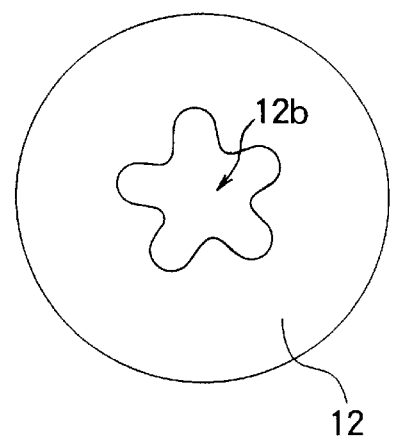
Figure 3E:
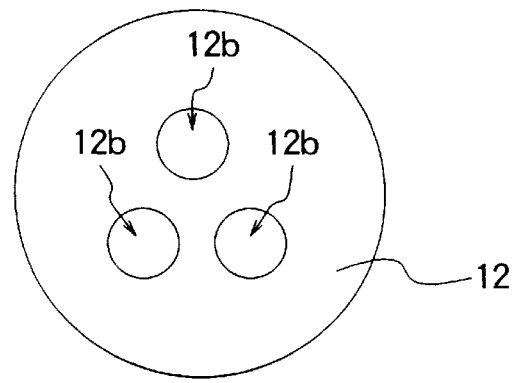

FIG. 2 schematically shows one example of the shape of the first via land, showing a state in which the first via land is patterned on the first insulating layer 11a. This first via land 12a has one substantially circular through hole 12b, however, the shape and number of the through hole 12b is not limited to those shown in the figure. The shape of the through hole 12b may be elliptical, star-shaped, or gourd-shaped as well as circular. In addition, the through hole 12b preferably has a shape having no angular portion or notch to prevent stresses from concentrating at a specific portion.

The first via land 12a may have a plurality of through holes 12b. FIG. 3A, FIG. 3B, FIG. 3C, FIG. 3D, and FIG. 3E show several examples of the shape of via land to release a stress.

Figure 4:
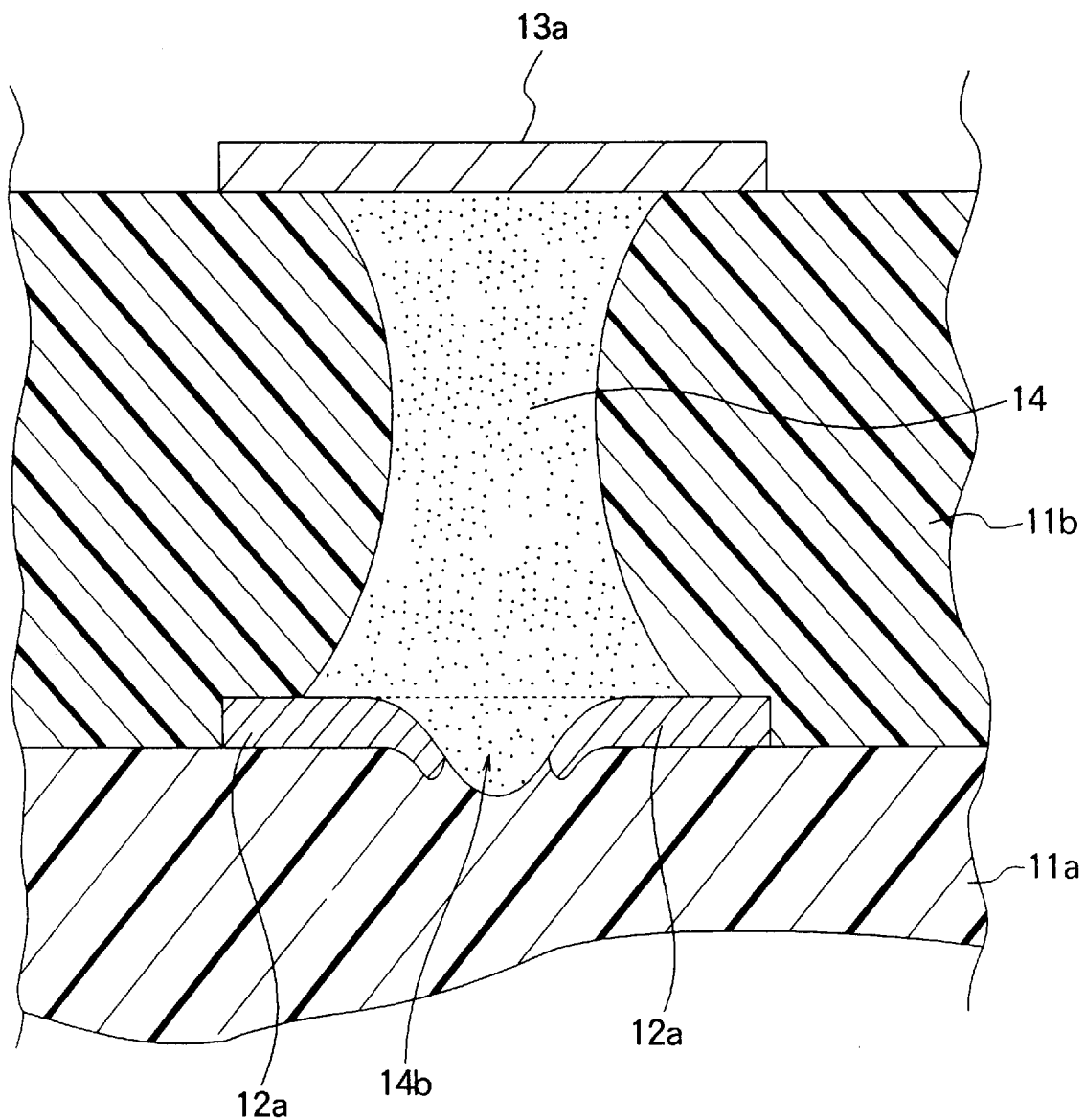
FIG. 4 is an enlarged cross-sectional view of a via connecting portion of the multilayer wiring board of FIG. 1.

FIG. 4 is an enlarged view of an interlayer connection of the multilayer wiring board of the present invention shown in FIG. 1. The first via land 12a and the second via land 13b are via connected to each other by the conductive pillars 14. The conductive pillar 14 has an intruded zone 14b which intrudes in the first insulating layer 11a through the hole 12b formed in the first via land 12a. This intruded zone is, for example, formed by pressurizing the first insulating layer and the second wiring layer in the axial direction of the conductive pillar with the conductive pillar intervening between the first via land and the second via land. For the multilayer wiring board of the present invention using such a construction, even if a pressure load is applied in the direction of interlayer connection of multilayer wiring board, that is, in the axial direction of the conductive pillar 14, a part of the conductive pillar penetrates to the first insulating layer side, while being plastically deformed, through the through hole 14b, which is a stress releasing means formed in the first via land 12a, by which the breakage of the first via land 12a can be prevented. Therefore, the reliability of interlayer connection of the multilayer wiring board is improved. Also, if the stress releasing means which the first via land 12a has is formed simultaneously with the patterning of the first wiring layer 12, the number of processes need not be increased. The rigidity of conductive pillar is higher than that of the first insulating layer, However it should preferably be set so that the conductive pillar is plastically deformed to some degree so as to reduce a stress when intruding.

EXAMPLE 2

Figure 5:
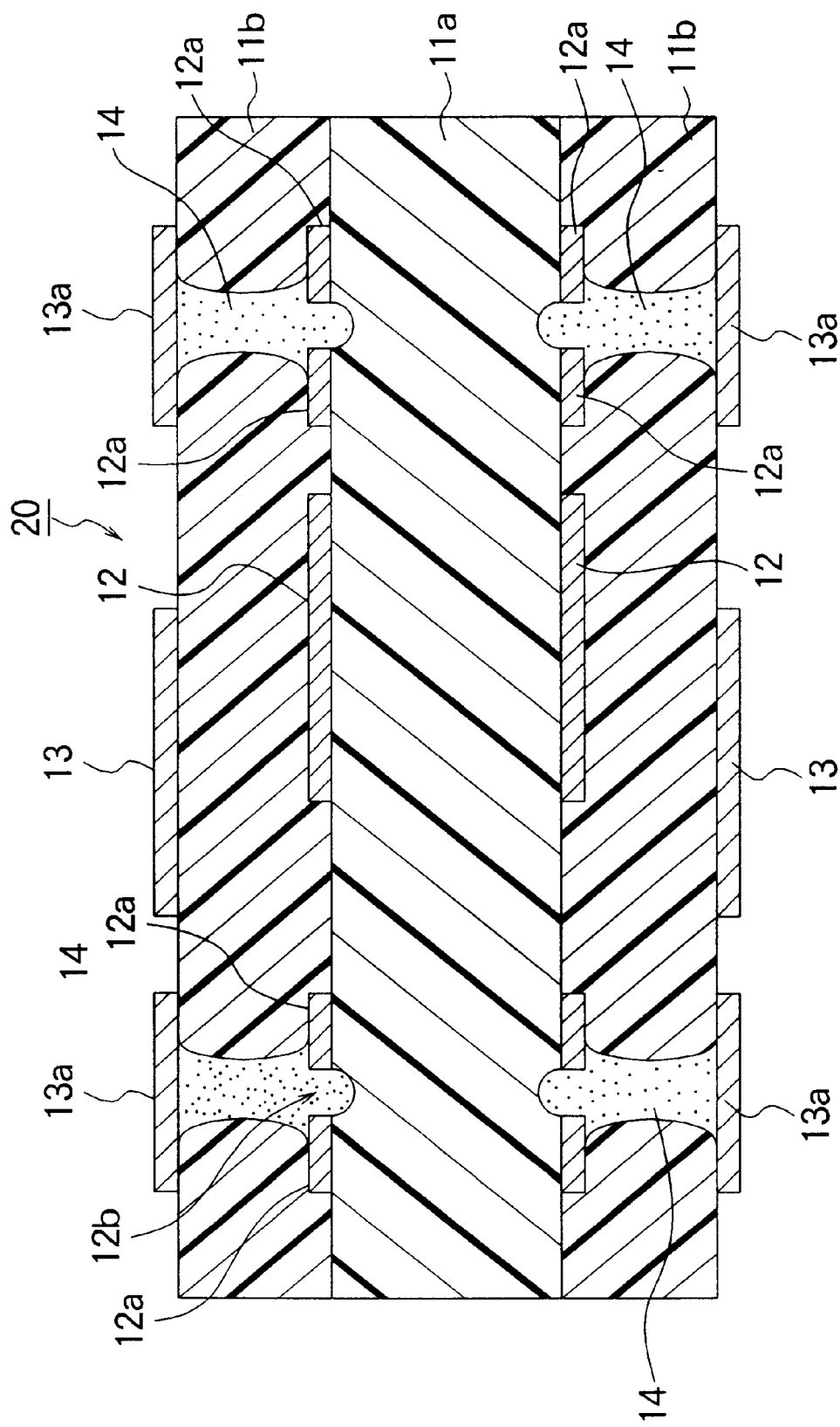
FIG. 5 is a cross-sectional view of another multilayer wiring board consistent with the present invention.

FIG. 5 is a sectional view schematically showing another example of a multilayer wiring board of the present invention. This multilayer wiring board 20 has four wiring layers consisting of conductors. Each wiring layer has a via land provided as a part of their circuit patterns, and interlayer connection of wiring layers is made by connecting a pair of via lands in face with each other via an insulating layer 11 by means of a conductive pillar 14.

On both surfaces of a first insulating layer 11, a first wiring layer 12 having a first via land 12a is formed. This first via land 12a is formed with a through hole 12b, as typically shown in FIG. 3 for example, as a stress releasing means. A second insulating layer 11b is formed on the first wiring layer 12, and a second wiring layer 13 having a second via land 13a is formed on the second insulating layer 11b. The first via land 12a and the second via land 13a are formed in face with each other via the second insulating layer 11b, and connected to each other by the conductive pillars 14.

Here, both of the wiring layers formed on both sides of the first insulating layer 11a are explained as the first wiring layer 12. Needless to say, however, the circuit patterns of the first wiring layers 12 formed on both sides of the first insulating layer 11a may be different. Similarly, the circuit patterns of the second wiring layers 13 formed on the outside layer may be different. That is, each wiring layer has a via land at the interlayer connection, and the circuit pattern is formed as necessary. This is true even when not specially described.

EXAMPLE 3

Figure 6A:
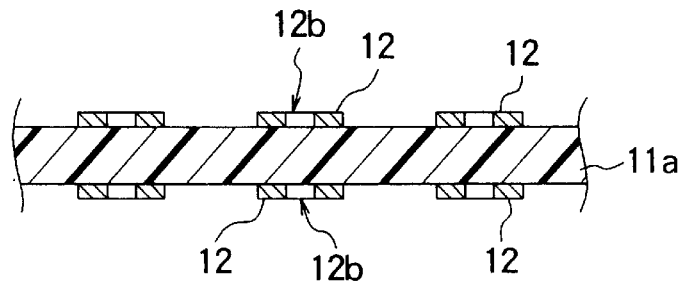
FIG. 6A, FIG. 6B, and FIG. 6C are diagrams for explaining a manufacturing process of the multilayer wiring board of FIG. 5.
Figure 6B:
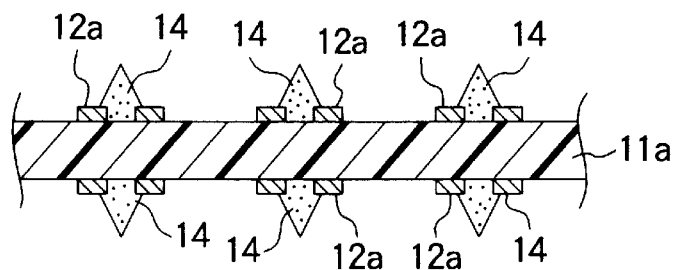
Figure 6C:
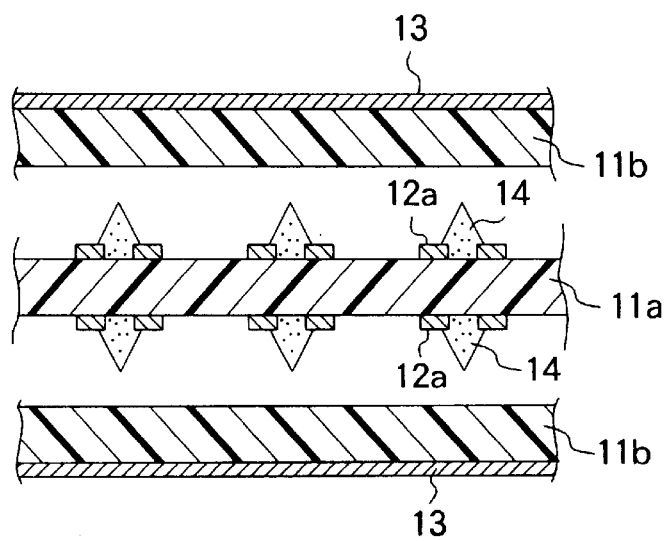

One example of a method for manufacturing the multilayer wiring board 20 of the present invention, typically shown in FIG. 5, will be described. FIG. 6A, FIG. 6B, and FIG. 6C are views for illustrating the manufacturing process for the multilayer wiring board 20 of the present invention shown in FIG. 5.

First, a double faced coppered laminate is prepared as a core substrate in which conductor layers are affixed on both surfaces of an insulating layer. Here, a double faced coppered laminate (trade name, paper/phenol resin coppered laminate R-8705E, manufactured by Matsushita Electric Works), in which a 35 μm-thick electrolytic copper foil patterned into the first wiring layer 12 is affixed on both surfaces of a 1.2 mm-thick paper/phenol resin insulating board, was prepared.

Next, the copper foil, which is the first wiring layer 12, affixed on the core substrate is patterned into a predetermined wiring circuit by, for example, the photo-etching process. Here, a predetermined pattern of resist was formed on the copper foil by screen printing, the copper foil was selectively removed by etching with this resist being used as a mask and ferric chloride solution being used as an etchant, and then the resist was removed to form the first wiring layer 12 having a predetermined circuit pattern (FIG. 6A). At this time, the first via land 12a was also formed as part of the circuit pattern of the first wiring layer 12. The first via land 12a was formed into a substantially circular shape with a diameter of about 0.7 mm, and a hole 12b with a diameter of about 0.2 mm was formed at the center thereof.

Here, both of the wiring circuits formed on both sides of the first insulating layer 11a are explained as the first wiring circuit, but the circuit patterns of the first wiring layers on both sides of the first insulating layer were formed into a different pattern.

Next, conductive pillars 14 having a substantially conical shape were formed on the first via land 12a of the first wiring circuit 12. This conductive pillar 14 was formed by arranging a metal mask forming a pit at the position corresponding to the first via land 12a and by screen printing a conductive resin. For the metal mask, a stainless steel mask with a thickness of about 300 $\mu$m, in which a hole with a diameter of about 0.3 mm was formed, was used. For the conductive resin, in this example, phenol resin conductive paste with silver powder being used as a filler was used. However, both of the filler consisting of a conductor and the binder resin may be selected as necessary. After the printed conductive paste was dried, the process in which printing at the same position with the same mask and drying were performed was repeated three times. After heating, the conductive pillars 14 with a height of about 0.3 mm having a substantially conical shape were formed on the first via land 12a (FIG. 6B). The conductive pillar 14 can be formed into a desired shape by adjusting, for example, the pit diameter and thickness of the mask used, the viscosity and other physical properties of the printed conductive resin, and the number of printing operations.

After the conductive pillars 14 were formed, the second insulating layer 11b and the second wiring circuit 13 are laminated on both sides of the core substrate. Here, an epoxy resin sheet (B stage) with a thickness of about 70 $\mu$m was used as the second insulating layer 11b, and an electrolytic copper foil with a thickness of about 35 $\mu$m was used as the second wiring layer 13 not patterned yet.

The second insulating layer 11b and the second wiring layer 13 are arranged so that the second wiring layer 13 is in face with the first wiring layer 12 via the second insulating layer 11b (FIG. 6C), and the whole construction is pressurized from the outside of the second wiring layer 13 by being held with a press plate while being heated. By the heating and pressurizing, the second insulating layer 11b is cured into C stage. At this time, the substantially conical shape conductive pillar 14 pierces the second insulating layer 11b in semi-cured state, and connects to the facing second via land 13a. Since the second insulating layer 11b begins to cure after the core substrate and the second wiring layer 13 come in contact with both sides of the second insulating layer 11b, the conductive pillar 14 formed on the first wiring layer 12 can pierce the second insulating layer 11b relatively easily.

Here, it is preferable to use, for example, a metal plate varying a little in size or shape such as a stainless steel plate, a brass plate or the like, or a heat resisting resin plate varying a little in size or shape such as a polyimide resin plate (sheet), a polytetrafluoroethylene resin plate (resin sheet) or the like as a holding plate to be used in a pressing process.

And when performing a pressing process in a state where the insulating layer is softened by heating, the tip of a conductive pillar becomes easy to penetrate the insulating layer.

Next, a predetermined circuit is formed by patterning the second wiring layer 13. Here, a predetermined pattern of resist was formed on the copper foil, which was the second wiring layer 13, by screen printing, the copper foil was selectively removed by etching with this resist being used as a mask and ferric chloride solution being used as an etchant, and then the resist was removed to form a predetermined circuit pattern having the second via land. At this time, the first via land 13a was also formed at the same time as part of the wiring circuit pattern.

By carrying out the above process, a four-layer multilayer wiring board, in which each wiring layer has 1000 via connections using the conductive pillars, was formed (see FIG. 5).

The wiring circuit of the multilayer wiring board 20 thus manufactured had a connection resistance of about 2.1 $\Omega$. Considering the pattern resistance of copper foil (wiring layer resistance per one conductive pillar 1 m$\Omega$), the conductive pillar resistance was 1 m$\Omega$ on the average, and both of the conductive pillar resistance and the copper foil pattern resistance were less varied.

The state of the interlayer connection was observed by cutting the multilayer wiring board in a plane parallel with the axial direction of the conductive pillar. As the result, it was found that as schematically shown in FIG. 4, the conductive pillar 14 was joined closely to the first via land and the second via land, and joint condition was good. The second via land 12a formed a slight hollow to the side of the first insulating layer, but the occurrence of cracks was not found. A part of the conductive pillar 14 intruded in the first insulating layer 11a through the hole 12b formed in the second via land 12a.

For comparison, a multilayer wiring board having the same construction except that the first via land 12a is not formed with a stress releasing means was manufactured under the same conditions. The wiring pattern of this four-layer multilayer wiring board having 1000 via connections using the conductive pillars had a connection resistance of 5.1 $\Omega$, being about 3 $\Omega$ greater than the connection resistance of the multilayer wiring board of the present invention typically shown in FIG. 5. The state of the via connection was observed by cutting the multilayer wiring board in which the first via land is not provided with a stress releasing means. The observation result was that the part of the first via land 12a formed a great hollow to the side of the first insulating layer 11a, and a crack was created on the first via land 12a.

Thus, the multilayer wiring board of the present invention can release the stress (pressure) to the via land applied in the axial direction of the conductive pillar by providing the via land having a stress releasing means. Also, the stress applied in the tangential direction of the via land (tangential stress) is relaxed mainly by the plastic deformation of the conductive pillar. Therefore, the wiring circuit including the via land is less prone to be broken, so that highly reliable interlayer connection can be established. Since the interlayer connection by through hole can be restricted to the necessary minimum, the multilayer wiring board of the present invention can respond to high-density mounting.

According to the method for manufacturing the multilayer wiring board in accordance with the present invention, the occurrence of poor connection can be inhibited while high productivity of manufacturing method for the multilayer wiring board using the conductive pillar is maintained, and further the productivity can be promoted.

EXAMPLE 4

FIG. 7A, FIG. 7B, FIG. 7C and FIG. 7D are views for illustrating another example of a method for manufacturing the multilayer wiring board of the present invention.

First, a double faced coppered laminate is prepared as a core substrate in which conductor layers are affixed on both surfaces of an insulating layer. Here, a double faced coppered laminate (trade name, paper/phenol resin coppered laminate R-8705E, manufactured by Matsushita Electric Works), in which a 35 μm-thick electrolytic copper foil patterned into the first wiring layer 12 is affixed on both surfaces of a 1.2 mm-thick paper/phenol resin insulating board, was prepared.

Figure 7A:
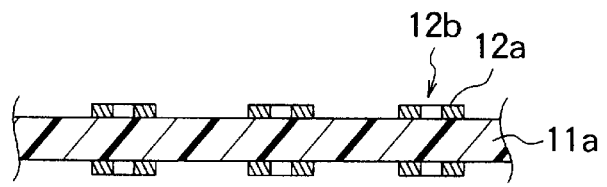
FIG. 7A, FIG. 7B, FIG. 7C and FIG. 7D are diagrams for explaining another manufacturing process of a multilayer wiring board consistent with the present invention.

Next, the copper foil affixed on the core substrate is patterned into a predetermined wiring circuit by, for example, the photo-etching process. Here, a predetermined pattern of resist was formed on the copper foil by screen printing, the copper foil was selectively removed by etching with this resist being used as a mask and ferric chloride solution being used as an etchant, and then the resist was removed to form the first wiring layer 12 having a predetermined circuit pattern (FIG. 7A). At this time, the first via land 12a was also formed as part of the wiring circuit pattern of the first wiring layer 12. The first via land 12a was formed into a substantially circular shape with a diameter of about 0.7 mm, and a hole 12b with a diameter of about 0.2 mm was formed at the center thereof.

Here, both of the wiring circuits formed on both sides of the first insulating layer 11a are explained as the first wiring circuit, but the circuit patterns of the first wiring layers on both sides of the first insulating layer were formed into a different pattern.

On the other hand, an electrolytic copper foil with a thickness of about 35 μm was prepared as the second wiring layer 13, and a conductive pillars 14 having a substantially conical shape were formed on this electrolytic copper foil.

The conductive pillar 14 was formed at a position such as to correspond to the first via land formed on the first wiring layer 12 when the second conductor layer 13 is stacked with the first wiring layer 12.

Figure 7B:
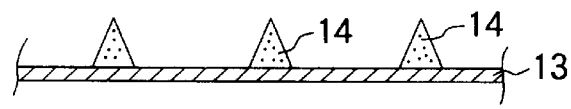

The conductive pillar 14 was formed by arranging a metal mask forming a pit and by screen printing a conductive resin. For the metal mask, a stainless steel mask with a thickness of about 300 μm, in which a hole with a diameter of about 0.3 mm was formed, was used. For the conductive resin, in this example, phenol resin conductive paste with silver powder being used as a filler was used. After the printed conductive paste was dried, the process in which printing at the same position with the same mask and drying were performed was repeated three times. After heating, the conductive pillar 14 with a height of about 0.3 mm having a substantially conical shape was formed on the first via land 12a (FIG. 7B).

Figure 7C:
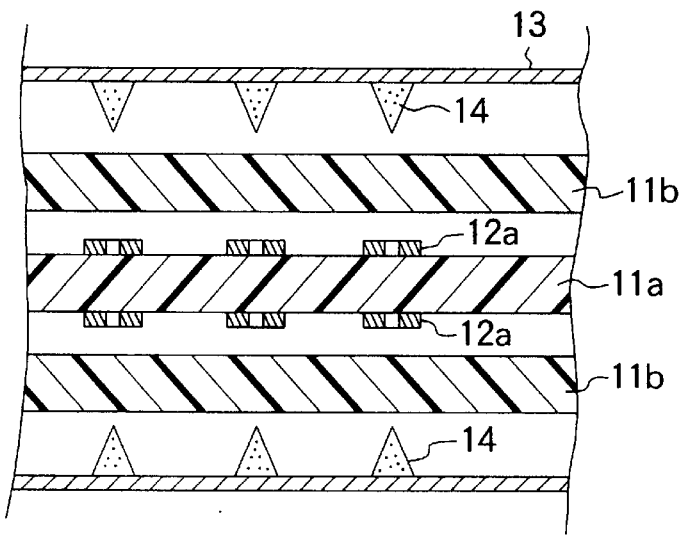

After the core substrate in which the first wiring layer 12 is formed on both surfaces of the first insulating layer 11a and the second wiring layer (non-patterning) forming the conductive pillars 14 are prepared, the second wiring layer is arranged on both sides of the core substrate via the second insulating layer 11b as shown in FIG. 7C. The arrangement is performed by making alignment so that the first via land 12a is in face with the conductive pillar 14.

For the second insulating layer 11b, a prepreg of B stage with a thickness of about 100 μm in which glass cloth is impregnated with epoxy resin was used.

The whole construction is pressurized from the outside of the second wiring layer 13 by being held with a press plate while being heated. By the heating and pressurizing, the second insulating layer 11b is cured into C stage. At this time, the substantially conical shape conductive pillar 14 pierces the semi-cured state second insulating layer 11b, and connects to the facing first via land 12a. Since the second insulating layer 11b begins to cure after the core substrate and the second wiring layer 13 come in contact with both sides of the second insulating layer 11b, the conductive pillar 14 formed on the second wiring layer 13 can pierce the second insulating layer 11b relatively easily.

The tip end of the conductive pillar 14 is inserted in the through hole 12b, which is a stress releasing means, formed in the first via land 12a, and comes in close contact with the first via land 12a while being plastically deformed. Here, the conductive pillar 14 pierces into the first insulating layer 11a while being plastically deformed, but it is not so hard as to be capable of easily penetrating the first insulating layer 11a, so that it can come in contact with the first via land 12a without breaking the first via land.

Next, a predetermined circuit is formed by patterning the second wiring layer. Here, a predetermined pattern of resist was formed on the copper foil, which was the second wiring layer 13, by screen printing, the copper foil was selectively removed by etching with this resist being used as a mask and ferric chloride solution being used as an etchant, and then the resist was removed to form a predetermined circuit pattern having the second via land.

Figure 7D:
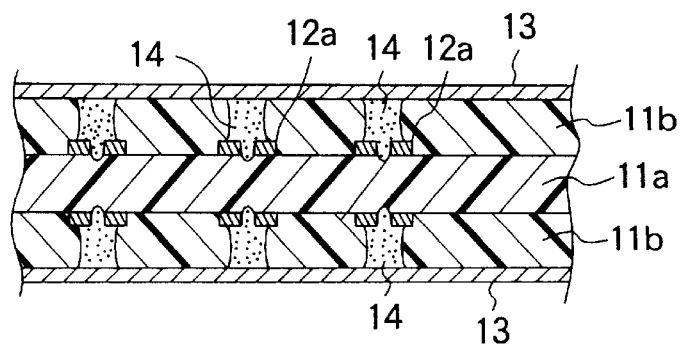

By carrying out the above process, a four-layer multilayer wiring board, in which each wiring layer has 1000 via connections using the conductive pillars, was formed (FIG. 7D).

A connection resistance of a wiring circuit of a multilayer wiring board manufactured in such a way was about 2.1 ohms. This connection resistance is equivalent to a resistance obtained by connecting one thousand conductive pillars with each other in series through wires of copper foil, and when considering a pattern resistance of the copper foil, the average of connection resistance per conductive pillar was about 1 mΩ. In addition, both connection resistances of the pillars and pattern resistances of the copper foil were a little in variation.

Figure 8:
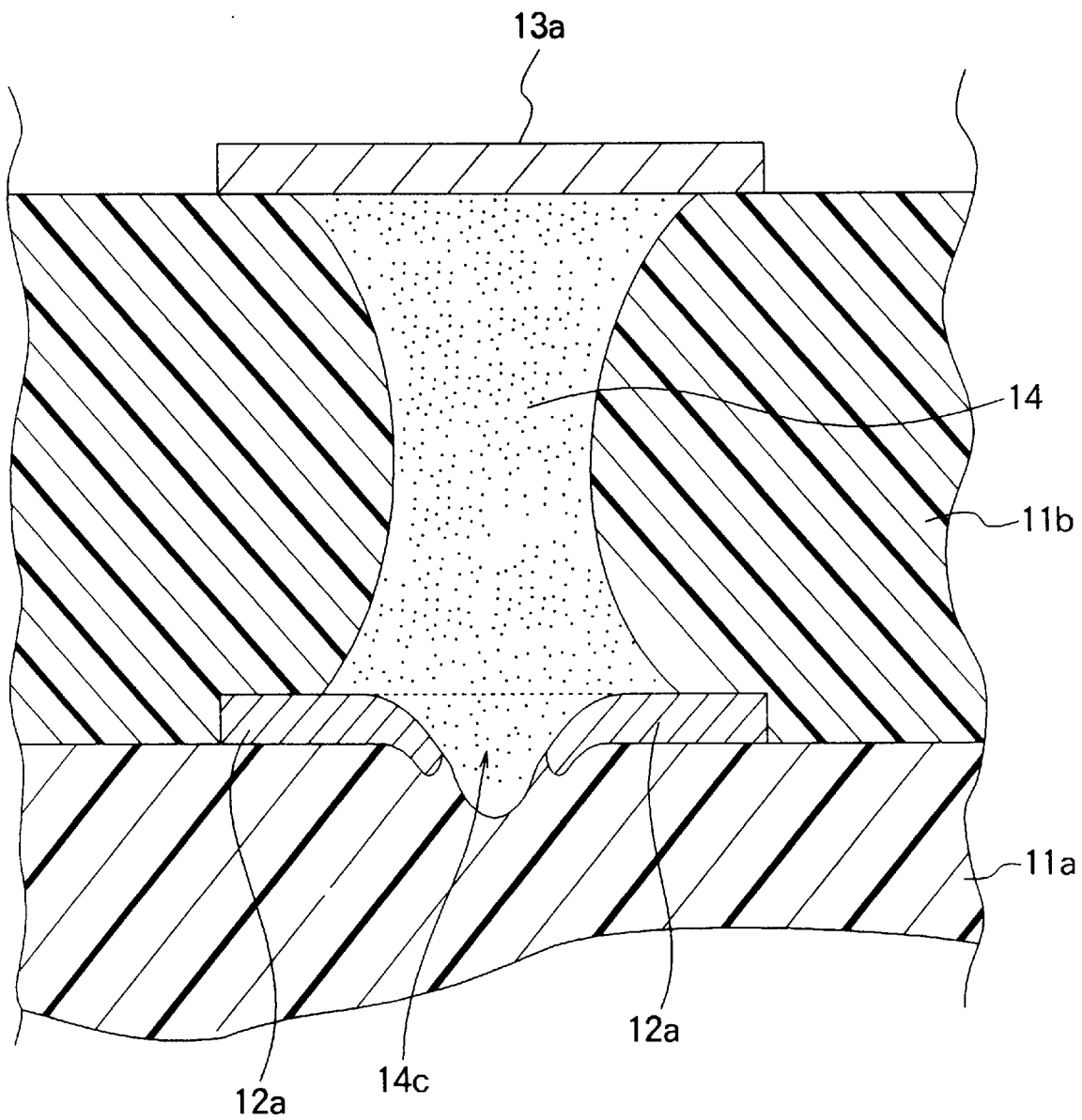
FIG. 8 is an enlarged cross-sectional view of a via connecting portion of the multilayer wiring board of FIG. 7D, taken along a plane parallel with the axial direction of a conductive pillar.

FIG. 8 schematically shows the state of interlayer connection observed by cutting the multilayer wiring board shown in FIG. 7D in a plane in parallel with the axial direction of the conductive pillar. A part of the conductive pillar 14 had a portion piercing to the first insulating layer 11a through the hole 12b formed in the first via land 12a, and the conductive pillar 14 was joined closely to the first via land and the first via land, and joint condition was well established. The first via land 12a formed a slight hollow to the side of the first insulating layer, but the occurrence of cracks was not found. This is because the conductive pillar 14 intruded into the first insulating layer 11a through the hole 12b formed in the first via land 12a, and is plastically deformed along the first via land 12a.

Figure 27:
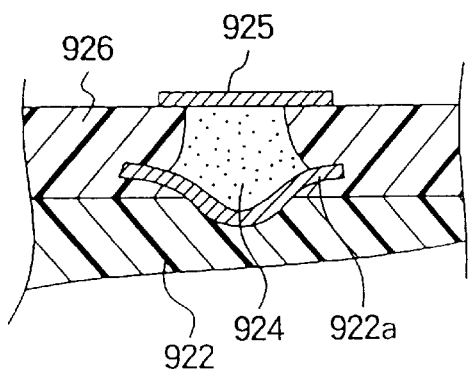
FIG. 27 is a cross-sectional view of a via connecting portion of a multilayer wiring board in which a via land is formed by a pressurizing process.

For comparison, a multilayer wiring board having the same composition as FIG. 7D except that a stress distributing means was not formed on the first via land 12a was manufactured under the same conditions. The connection resistance of wiring patterns of a multilayer wiring board of 4 layers having 1000 via connection points made by the conductive pillars was 5.1 ohms and was about 3 ohms greater than the connection resistance of a multilayer wiring board of the invention shown as an example in FIG. 7D. In addition, when cutting a multilayer wiring board not provided with a stress distributing means on the first via land and observing the state of a via connection of it, it was found that the first via land portion 12a was greatly hollowed to the first insulating layer side 11a. A crack was generated in the first via land 12a (see FIG. 27).

In such a way, a multilayer wiring board of the invention can distribute a stress acting on a conductive pillar in its axial direction by being provided with a via land provided with a stress distributing means. Therefore, it can establish a via connection of high reliability which makes a wiring circuit including via lands difficult to break. In addition, since it is possible to minimize within necessity the number of via connection points using through holes, it can cope with high-density mounting.

And according to a method for manufacturing a multilayer wiring board of the invention, it is possible to suppress occurrence of defective connections and furthermore greatly improve the productivity as keeping a high productivity of a method for manufacturing a multilayer wiring board using conductive pillars.

The present invention is not limited to the above embodiments, and various modifications can be made without departing from the spirit and scope of the present invention. For example, the wiring layer may be formed by a conductive composition, or the conductive pillar may be made of a metal. Further, the insulating layer is not limited to epoxy resin, and a thermosetting resin, thermoplastic resin, etc. can be selected for use as necessary.

EXAMPLE 5

Figure 9A:
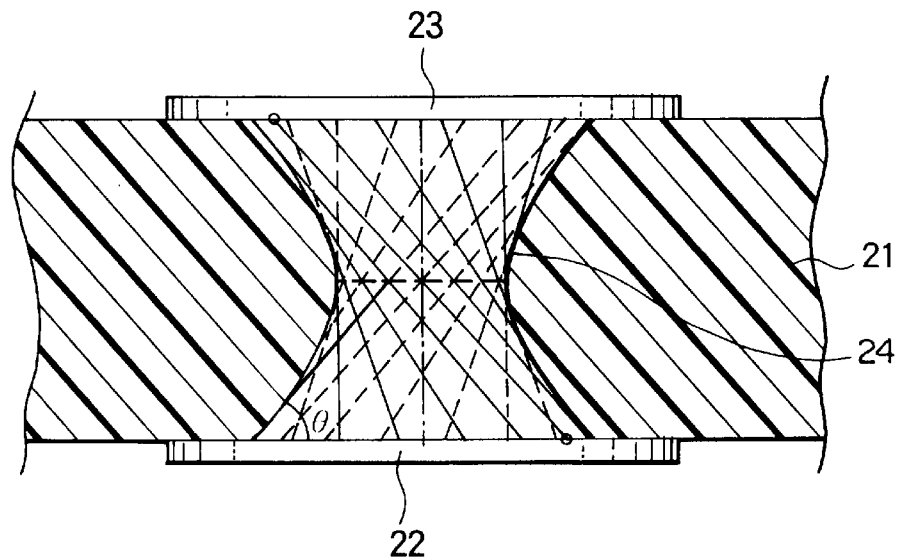
FIG. 9A is a cross-sectional view of a via connecting portion of a multilayer wiring board consistent with the present invention.
Figure 9B:
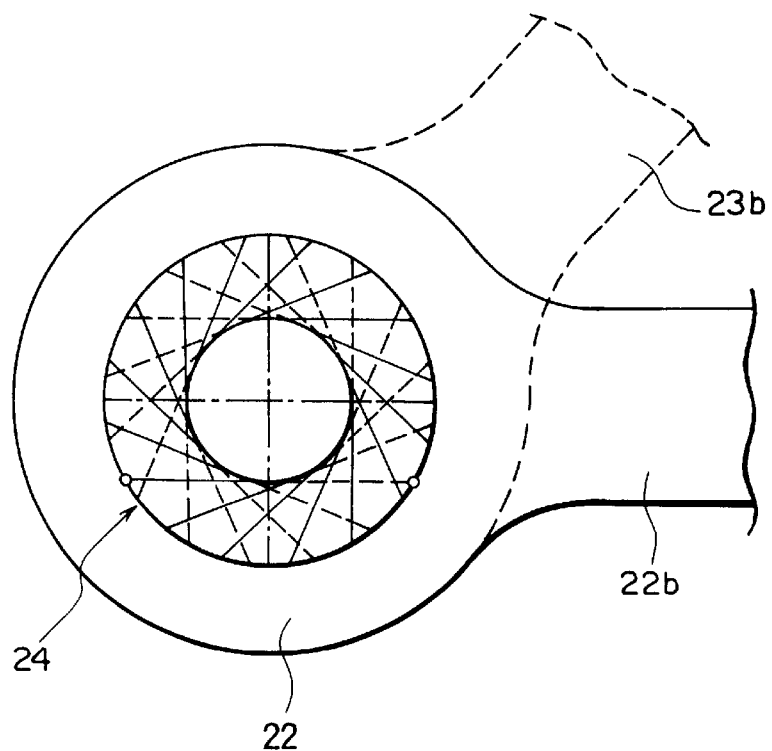
FIG. 9B is a cross-sectional view of the via connecting portion of FIG. 9A.
Figure 9C:
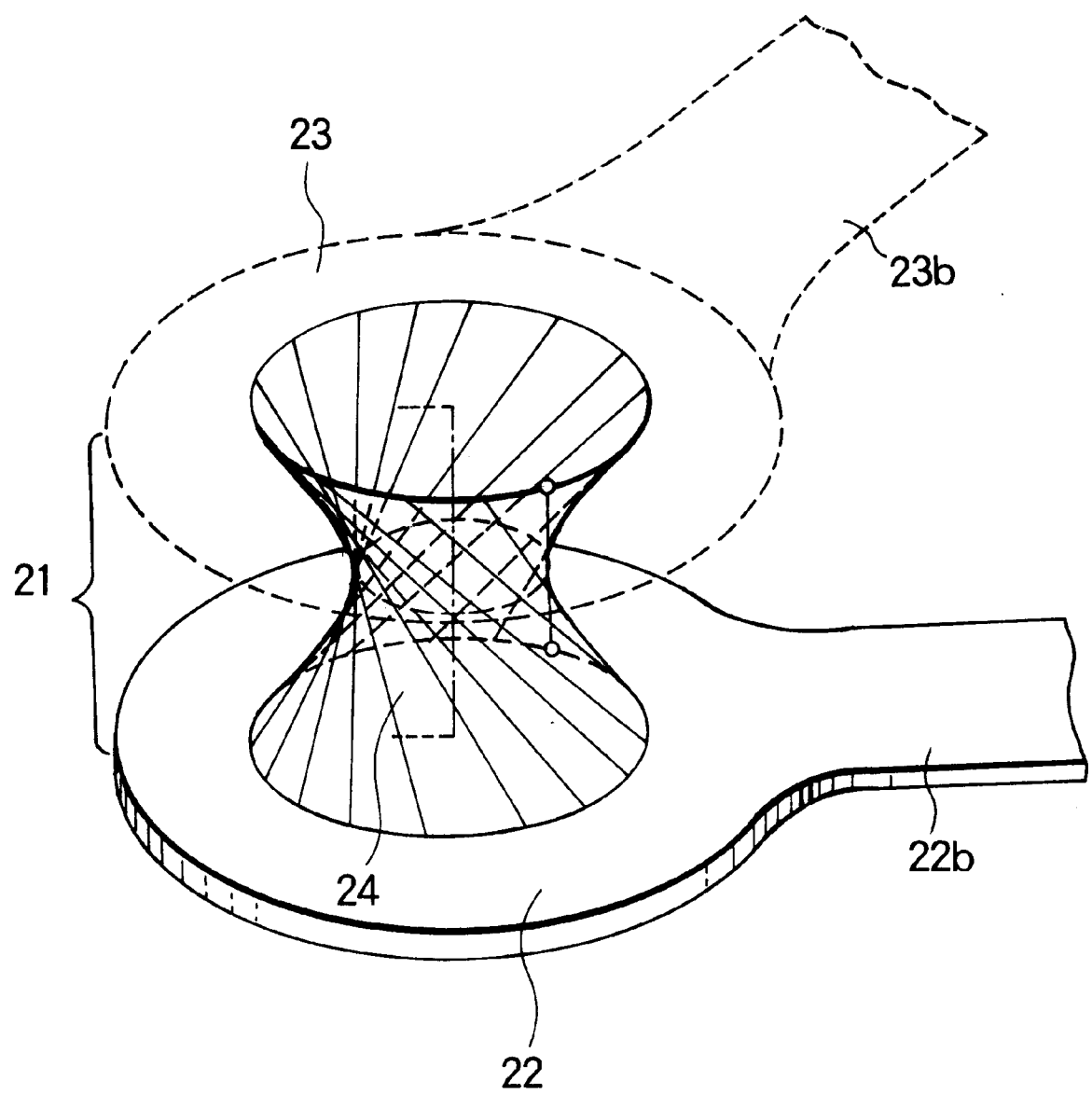
FIG. 9C is a perspective view of the via connecting portion of FIG. 9A.

FIG. 9A is a view schematically showing a sectional construction of interlayer connection of a multilayer wiring board in accordance with the present invention. FIG. 9B is a view schematically showing a sectional construction of interlayer connection shown in FIG. 9A, and FIG. 9C is a perspective view schematically showing a construction of interlayer connection shown in FIG. 9A.

This multilayer wiring board comprises an insulating layer 21, a first land 22 formed on the first face of the insulating layer 21, and a second land 23 formed on the second face of the insulating layer 21 in the region in face with the first land 22. The first land 22 is formed as a part of the circuit pattern of a first wiring layer, and the second land 23 is formed as a part of the circuit pattern of a second wiring layer, which is not fully shown.

The interlayer connection between the first wiring layer and the second wiring layer is established by conductive pillars 24 consisting of a conductor formed through the insulating layer 21 so that the first land 22 and the second land 23 are connected to each other. The shape of the portion where the outer side surface of the conductive pillar 24 comes in contact with the surfaces of the first land 22 and the second land 23 is formed so that stresses do not concentrate on the solid-solid intersurface of connection between the conductive pillar 24 and the first land 22 or the second land 23.

In order to prevent the stress concentration on the intersurface of connection between the conductive pillar 24 and the first land 22 or the second land 23, for example, the contact angle between the outer side surface of the conductive pillar 24 and the surfaces of the first land 22 and the second land 23 on the side of the insulating layer 21 should be set so that the stress concentration factor decreases to the utmost.

Figure 10A:
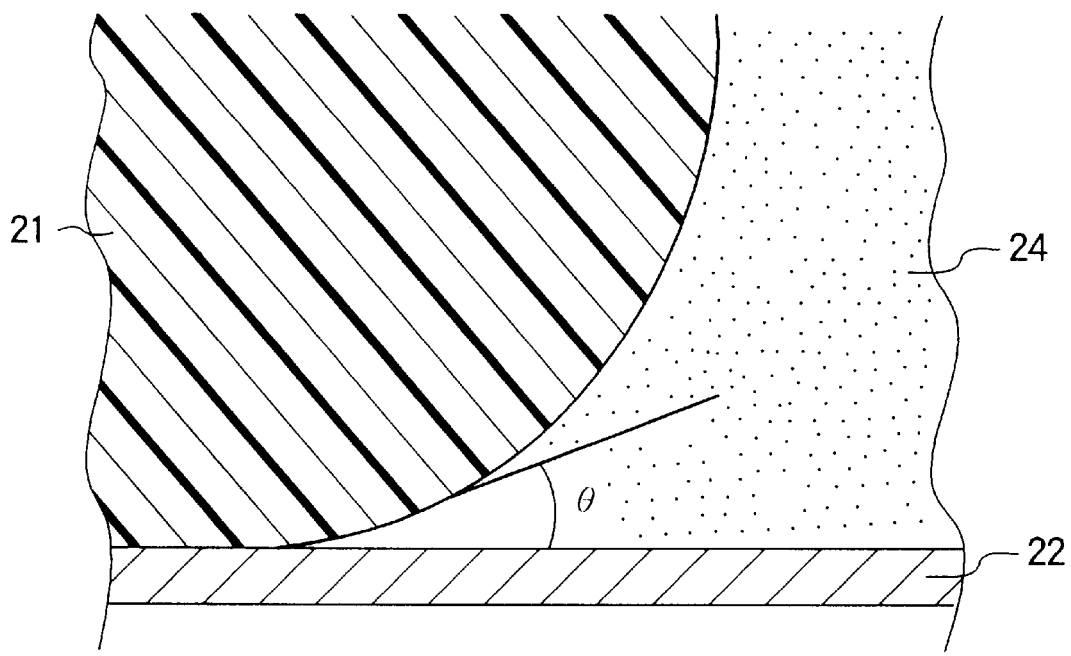
FIG. 10A, FIG. 10B, and FIG. 10C are diagrams showing examples of the shape of a connecting portion between a conductive pillar and a first or second via land.
Figure 10B:
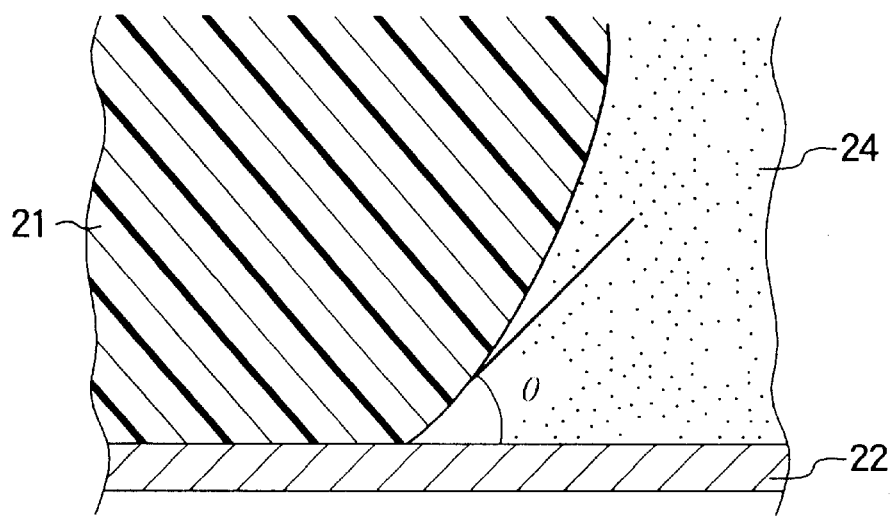
Figure 10C:
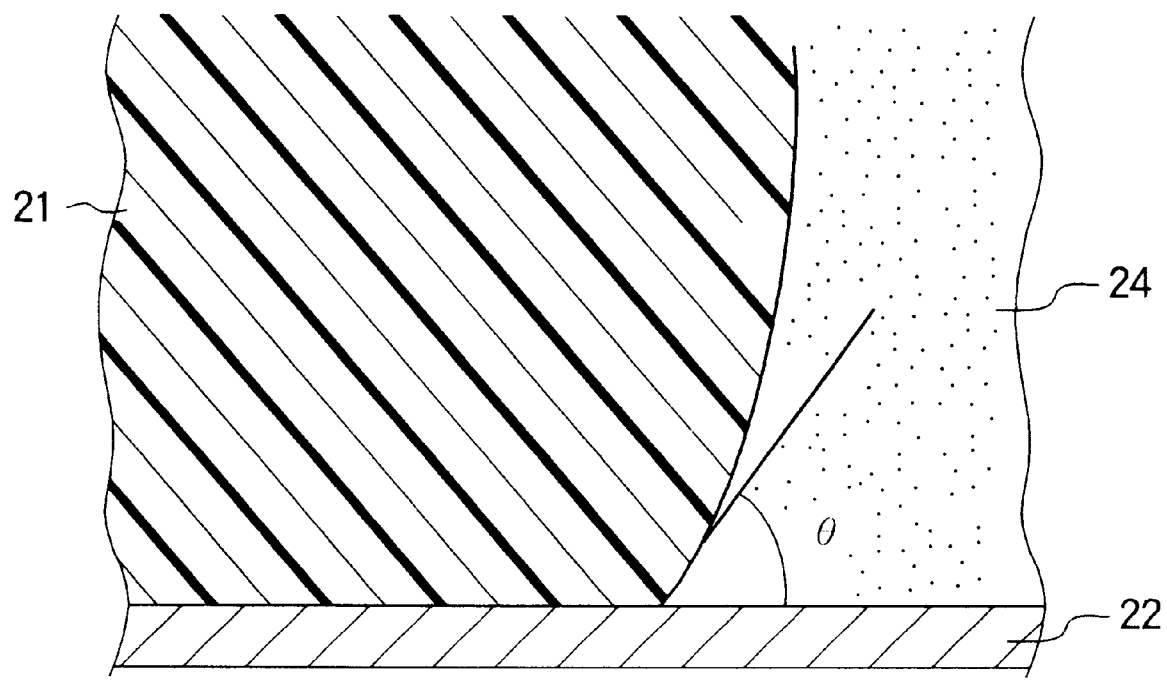

FIG. 10A, FIG. 10B, and FIG. 10C schematically show examples of connection between the conductive pillar 24 and the first land 22 (or the second land 23).

The inventor analyzed the stress produced at the via connection using the conductive pillars by simulation using the physical property constant for each material. As a result, it was found that the stress acting so as to peel the conductive pillar 24 from the wiring layer or via land depends on the angle formed between the via land surface and the outer peripheral surface of conductive pillar at the portion where the conductive pillar 24 is connected to the wiring layer (via land). Therefore, in the present invention, the contact angle θ between the outer peripheral surface of conductive pillar having a hyperboloid shape and the via land surface is controlled so as to decrease the stress concentration factor.

For example, if the contact angle θ is set so as to be small in such a manner that the outer side surface of conductive pillar 24 connects to the surface of via land 22 smoothly and continuously, the joining strength and peeling strength can be improved. For example, the via connection having the shape shown in FIG. 10B has a higher strength against peeling than the via connection having the shape shown in FIG. 10C. Similarly, the via connection having the shape shown in FIG. 10A has a higher strength against peeling than the via connection having the shape shown in FIG. 10B. Anyway, even the via connection having the shape shown in FIG. 10C has a far higher peeling strength than the via connection having the shape shown in FIG. 11.

That is, when the outer peripheral surface of conductive pillar connects to the surface of via land smoothly and continuously, the strength against peeling is high. If there is a notch at the junction between the outer peripheral surface of conductive pillar and the via land, stresses concentrate at this portion, resulting in a decrease in peeling strength. The sharper the notch is, the greater the peeling strength decreases.

The inventors found that in the case where the outer peripheral surface of conductive pillar connects to the surface of via land smoothly as a whole, the peeling strength can be maintained even if there is a microscopic notch. For example, the connection between the outer peripheral surface of conductive pillar and the surface of via land draws a closed curve, such as a circle. When all parts on this closed curve are connected smoothly, the peeling strength becomes the maximum. Anyway, if at least a part of this closed curve connects smoothly, the peeling strength can be made higher compared with the case where all the parts of closed curve have a notch of a shape such that the stress concentration factor is high. For example, the shapes shown in FIG. 12A and FIG. 12B have a notch macroscopically (contact angle φ), but the outer side surface of conductive pillar 24 and the surface of via land are connected to each other smoothly and continuously as a whole (contact angle θ). Therefore, even if a thermal stress such as solder reflow is applied in the mounting process, the via connection between the wiring layers can be maintained stably.

EXAMPLE 6

Figure 13A:
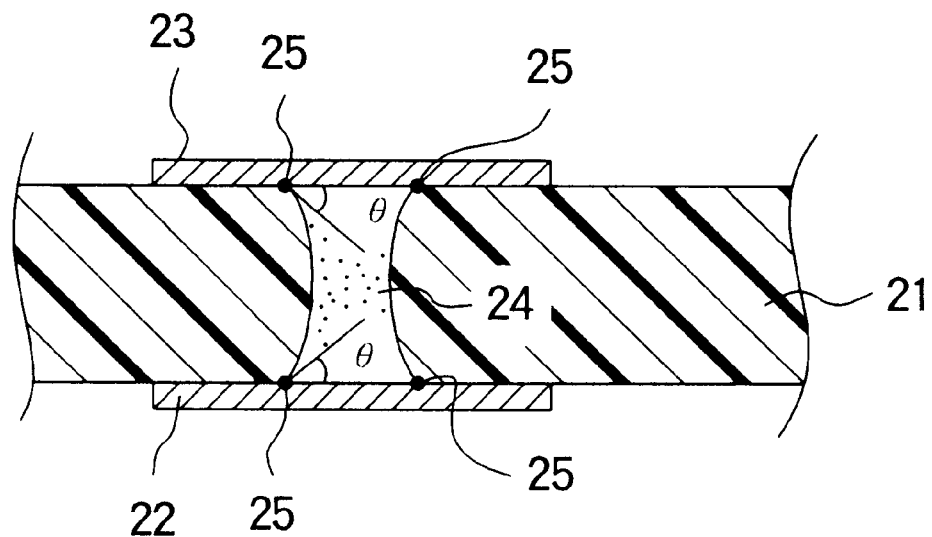
FIG. 13A is a cross-sectional view of another multilayer wiring board consistent with the present invention.
Figure 13B:
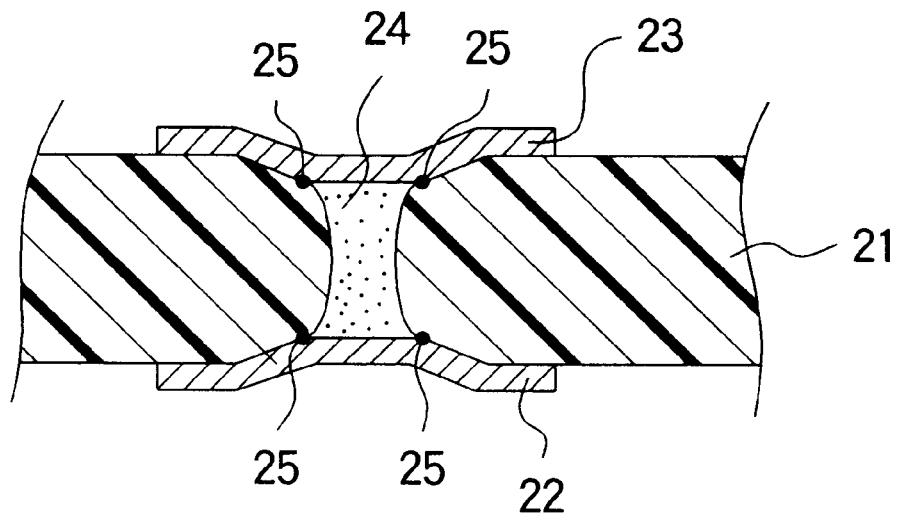
FIG. 13B is a cross-sectional view of the multilayer wiring board of FIG. 13A during a state in which a thermal load is imposed on the wiring board.

FIG. 13A schematically shows one example of a construction of a multilayer wiring board in accordance with the present invention, and FIG. 13B schematically shows a state in which a thermal load is applied to the multilayer wiring board shown in FIG. 13A. This multilayer wiring board has 3000 points of via connections using conductive pillars 24.

The interlayer connection of the multilayer wiring board shown in FIG. 13A has the same construction as that of the multilayer wiring board of the present invention shown in FIG. 9A. The conductive pillar 24 formed by passing through the insulating layer 21 connects the first via land 22 of the first wiring layer and the second via land 23, which are separated by the insulating layer 21, to each other. Both of the connections between the conductive pillar 24 and the first via land 22 and between the conductive pillar 24 and the second via land 23 have a shape such as to relax the stress applied to the triple junction 25. In this example, both of the angle between the outer peripheral surface of conductive pillar 24 and the surface of first via land 22 and the angle between the outer peripheral surface of conductive pillar 24 and the surface of second via land 23 are formed into an acute angle.

When various electronic elements are mounted on such a multilayer wiring board, especially in the case of solder reflow process, the interlayer connection is subjected to a thermal load, so that a stress is produced by the difference in thermal expansion coefficient, and stresses concentrate especially at the triple junction 25.

The multilayer wiring board shown in FIG. 13A employs an insulating resin substrate of FR-4 standard as the insulating layer 21, a copper foil as the wiring layer, a conductive resin with fine silver particles being dispersed as a filler as the conductive pillar.

The thermal expansion coefficient $\alpha 1$ of FR-4 in the normal direction of the insulating layer 21 at temperatures lower than the glass transition temperature Tg (about 125° C.) is $5.1 \times 10^{-5}$ [°K.$^{-1}$]. Also, the thermal expansion coefficient $\alpha 2$ of FR-4 in the thickness direction at temperatures higher than Tg is $2.6 \times 10^{-4}$ [°K.$^{-1}$], being far higher than $\alpha 1$.

On the other hand, the thermal expansion coefficient of silver composing the principal part of the conductive pillar is $17.0 \times 10^{-6}$ [°K.$^{-1}$]. Therefore, when a thermal load is applied to the multilayer wiring board shown in FIG. 13A, the insulating layer 21 expands more than the conductive pillar 24. Especially at temperatures higher than the glass transition temperature Tg, the thermal expansion coefficient of the insulating layer 21 is higher than that of silver by a factor of 15 or more. The FR-4 glass transition temperature is 125° C. The eutectic temperature of a Pb-Sn eutectic solder alloy, which is common as solder, is 183° C., so that the multilayer wiring board is subjected to a thermal load of about 220 to 240° C. in solder reflow (FIG. 13B).

Therefore, a high stress occurs in the axial direction of the conductive pillar 24 (in parallel with the normal direction of insulating layer) due to the difference in thermal expansion coefficient between the conductive pillar 24 and the insulating layer 21. This stress acts on the junction between the conductive pillar and the first via land and between the conductive pillar and the second via land as a tension. Also, such a stress becomes the maximum at the triple junction where three parts of the insulating layer 21, conductive pillar 24, and via land 22, 23 meet.

The via connection was investigated by heating the multilayer wiring board shown in FIG. 13A at 240° C. for 20 seconds. The result was that all the via connections maintained conduction and the resistance value was also maintained.

For the first via land 22 and the second via land 23, a means for releasing a pressure applied between the conductive pillar and the via land, as typically shown in FIG. 2, may be provided. For example, if a through hole 12 is formed in the first via land 22 or the second via land 23, even when a pressure is applied between the conductive pillar and the via land, or even when a tension is applied, the breakage of via connection is prevented, so that the function of interlayer connection can be maintained stably.

FIG. 9 to FIG. 13 show the interlayer connection of wiring layers formed on both surfaces of one-layer insulating layer, but the above-described via connection can be applied similarly to the multilayer wiring board having wiring layers of three or more layers.

EXAMPLE 7

The following is a description of a method for manufacturing the multilayer wiring board of the present invention having a shape such as to relax the stress applied to the junction between the conductive pillar and the first and second via lands.

FIG. 14A, FIG. 14B, FIG. 14C, FIG. 14D, FIG. 14E, FIG. 14F, and FIG. 14G are views for illustrating one example of a method for manufacturing the multilayer wiring board of the present invention.

Figure 14A:
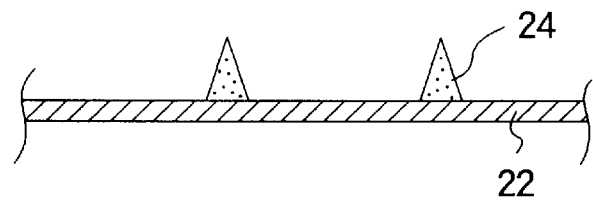
FIG. 14A, FIG. 14B, FIG. 14C, FIG. 14D, FIG. 14E, FIG. 14F, FIG. 14G, and FIG. 14H are diagrams for explaining another manufacturing process of a multilayer wiring board consistent with the present invention.

An electrolytic copper foil with a thickness of about 35 $\mu$m forming the first wiring layer 22 was prepared, and conductive pillars were formed at predetermined positions on this copper foil. This conductive pillar 24 was formed into a substantially conical shape with a bottom diameter of 250 $\mu$m and a height of 250 $\mu$m by screen printing conductive paste with fine silver particles (average particle size 10 $\mu$m in diameter) being used as a conductive filler (FIG. 14A).

Figure 14B:
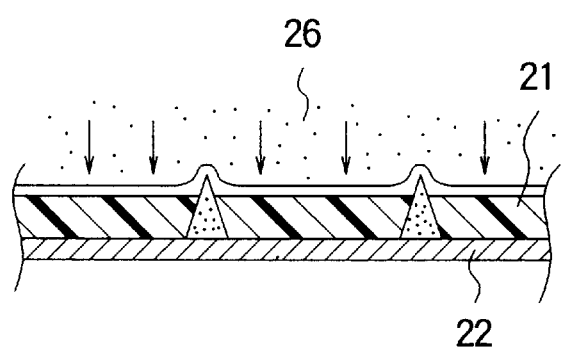

After the conductive pillar 24 was dried, a thermosetting prepreg (trade name, Garaepoprepreg HE, manufactured by Toshiba Chemical) in which a glass cloth with a thickness of about 114 $\mu$m was impregnated with epoxy resin was prepared as the insulating layer 21, and it was laminated on the surface of the first wiring layer 22 on which the conductive pillars 24 were formed. At this time, the insulating layer 21 of B stage was heated to about 100° C. (<Tg), and the conductive pillar 24 was allowed to penetrate through the insulating layer 21 by pressing the conductive pillar 24 by a flexible pressing body 26 so as to prevent deformation (FIG. 14B). At this time, the insulating layer 21 is not cured completely, a semi-cured state being kept. This corresponds to a pre-fabric material for the multilayer wiring board of the present invention.

Figure 14C:
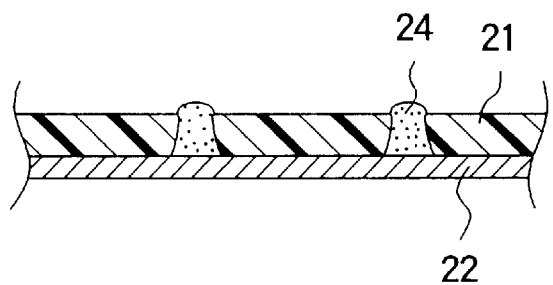

Here, a prefab material means a material prefabricated for forming a multilayer wiring board, and means a material in a state of FIG. 14B or FIG. 14C, for example. A multilayer wiring board of the invention can be easily made by using such prefab materials for a multilayer wiring board of the invention. For example, a multilayer wiring board having 4 wiring layers of the invention can be made by laminating the prefab materials of FIG. 14C on both sides of a double-sided laminate.

Thereafter, the tip end of the conductive pillar 24 protruding from the insulating layer 21 was pressed in the central axis direction of the conductive pillar 24 and deformed. In this example, a hard stainless steel plate with a thickness of about 1 mm was placed on the conductive pillar 24, and flat plate pressing was performed at ordinary temperature so that the tip end of conductive pillar was deformed in such a manner as to be collapsed (FIG. 14C). At this time, the collapsed head of the conductive pillar 24 was slightly swollen from the surface of the insulating layer 21 and exposed. In this state as well, this can be used as pre-fabric parts for the multilayer wiring board.

Figure 14D:
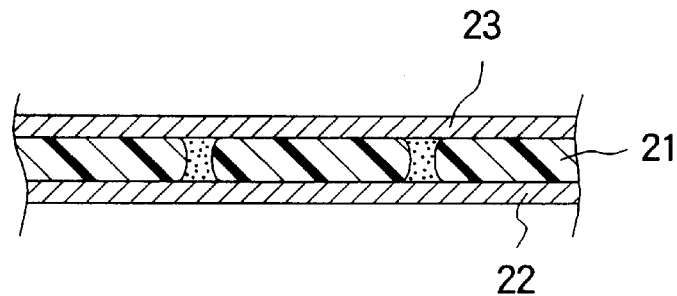

Next, an electrolytic copper foil with a thickness of about 35 $\mu$m forming the second wiring layer was arranged on the surface of the insulating layer 21 to which the tip end of the conductive pillar 24 was exposed. This laminate was pressed from the outside of the first wiring layer 22 and the second wiring layer 23 while being heated so as to completely cure the semi-cured insulating layer 21 by heating, and the conductive pillar 24 and the second wiring layer were pressed (FIG. 14D). By the above-described process, a double faced coppered board, in which the first wiring layer 22 and the second wiring layer 23 are connected to each other via the insulating layer 21 by the conductive pillars 24, can be obtained. The conductive pillar 24 is formed by controlling the shape thereof. First, the head protruding from the insulating layer 21 is collapsed, and then the conductive pillar 24 is plastically deformed at many stages by being pressed together with the second wiring layer 23. Thus, a shape such that stresses do not concentrate at the junction between the conductive pillar 24 and the wiring layer can be obtained.

Figure 14E:
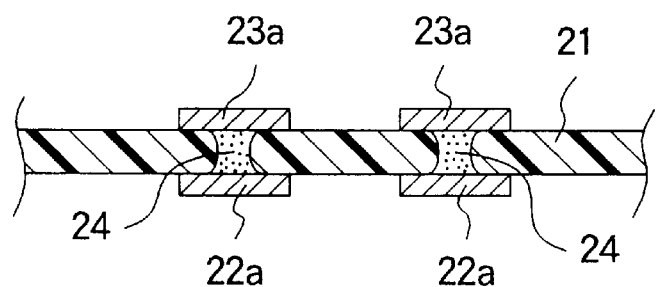
Figure 14F:
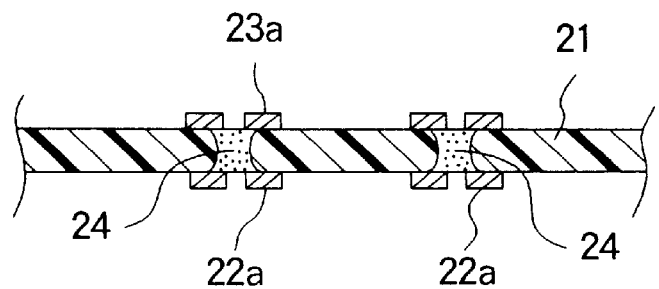

Next, the first wiring layer 22 and the second wiring layer 23 were patterned into a predetermined wiring circuit including the first via land 22a and the second via land 22b (FIG. 14E). In this manufacturing example, a mask was formed by screen printing a general etching resist ink (PSR-4000H, manufactured by Taiyo Ink K.K.) so as to obtain a predetermined wiring circuit pattern, the copper foil was etched by ferric chloride, and the resist mask was removed. When a multilayer wiring board having more wiring layers is manufactured with the two-layer wiring board having the first wiring layer 22 and the second wiring layer 23 as shown in FIG. 14E being used as a core substrate, it is preferable to form a stress releasing means, for example, shown in FIG. 2 in the first via land 22a and the second via land 23a simultaneously with the patterning of wiring circuit (FIG. 14F). The formation of the stress releasing means prevent the breakage of via land and wiring circuit caused when the interlayer connection with the outside wiring layer is formed, resulting in the improvement in reliability of multilayer wiring board.

A continuity test of via connection was made by the conventional method in the state shown in FIG. 14E. As a result, abnormality was not found on the interlayer connection having all (3000 points) conductive pillars. Also, abnormal resistance value was not observed.

EXAMPLE 8

The following is a description of an example of a four-layer multilayer wiring board having third wiring layers 27a and 27b on both sides of the core substrate, manufactured with the multilayer wiring board in the state shown in FIG. 14E being used as the core substrate.

Pre-fabric parts, in which the third wiring layer 27a, 27b forming conducive pillars 24 at predetermined positions and an insulating layer 21b are laminated as shown in FIG. 14C by the same method as described before, are prepared. In this example, a prepreg of the same material as that of the insulating layer 21 was used for the insulating layer 21b, but an insulating material with different properties can be used as necessary.

Figure 14G:
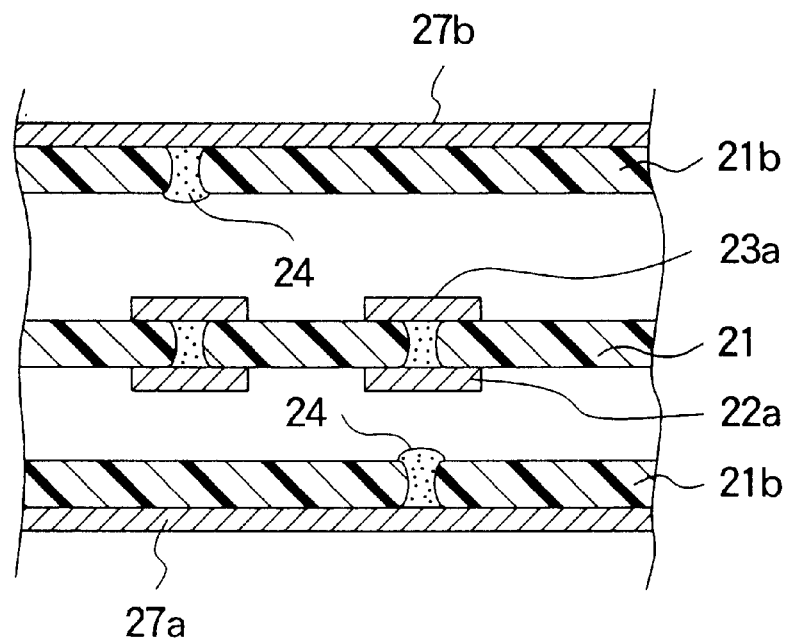

The double faced wiring board shown in FIG. 14E is used as a core substrate, and on both sides of the core substrate, the third wiring layer 27a, 27b and the insulating layer 21b are arranged. At this time, they are arranged so that the via connection of the first wiring layer 22 and the second wiring layer 23 is in face with the via connection of the third wiring layers 27a and 27b, respectively (FIG. 14G).

Next, this laminate was pressed from the outside of the third wiring layers 27a and 27b while being heated so as to completely cure the semi-cured state insulating layer 21b by heating, and the conductive pillar 24 and the third wiring layer 27a, 27b were pressed.

Figure 14H:
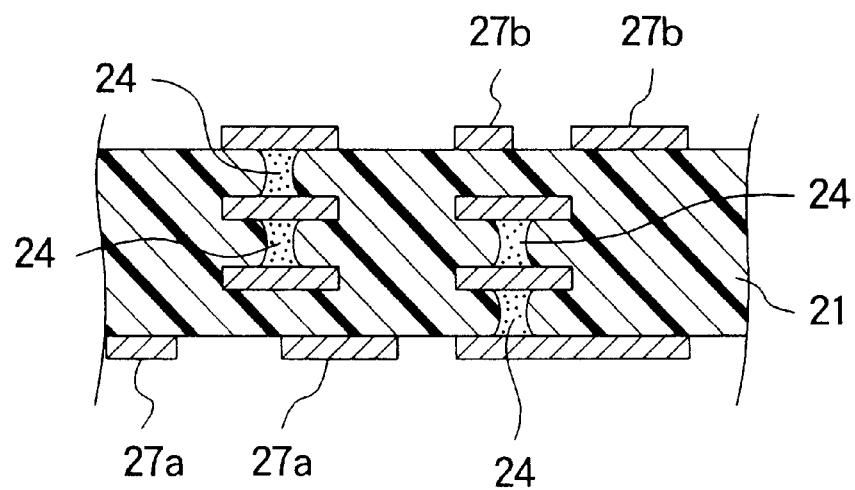

By patterning the third wiring layers 27a and 27b into a predetermined wiring circuit, a multilayer wiring board having four wiring layers, in which the first wiring layer 22 and the second wiring layer 23 are connected to the third wiring layers 27a and 27b via the insulating layer 21b by the conductive pillars 24, can be obtained (FIG. 14H).

EXAMPLE 9

A method for manufacturing the multilayer wiring board of the present invention, which has a joint shape having a higher peeling strength, will be described in more detail. First, the joint between the first wiring layer 22 and the conductive pillar 24 will be described, and then the joint shape for the second wiring layer and the conductive pillar 24 will be described.

In the example shown in FIG. 14, the joint shape for the first wiring layer 22 and the conductive pillar 24 is determined when the conductive pillars are formed on the first wiring layer 22 such as a copper foil. For example, when the conductive pillars are formed by using a mask such as a metal mask and by screen printing conductive resin, conductive paste, etc., the desired shape of conductive pillar can be formed by adjusting the shape, aperture diameter, and thickness of metal mask, and on the other hand by adjusting the physical properties of conductive resin layer such as viscosity and surface tension.

Here, a method for forming a conductive pillar is described. In this case, a method for forming a conductive pillar is described, taking a multilayer wiring board as an example.

FIG. 15A, FIG. 15B, FIG. 15C, FIG. 15D and FIG. 15E are views for illustrating one example of a process for forming the conductive pillar 24.

A metal mask 31 having a nearly cylinder-shaped through hole (pit) 31a was disposed on a first wiring layer 22. Here, the metal mask was made of a stainless steel sheet of 300 $\mu$m in thickness and the through hole 31a was set at 300 $\mu$m in diameter.

Figure 15A:
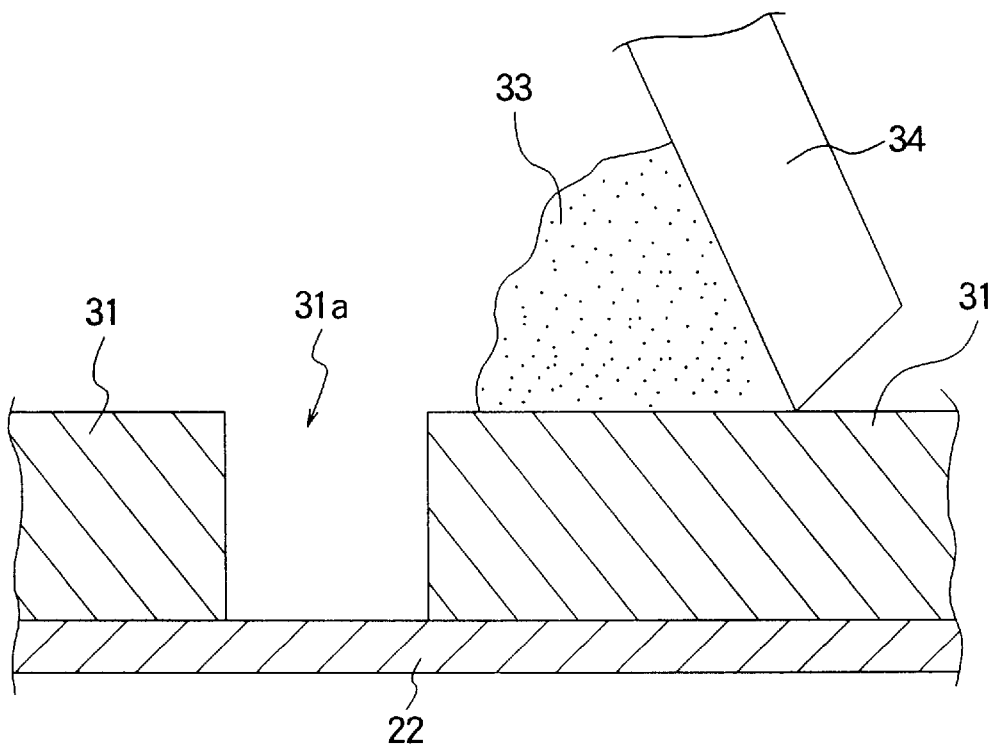
FIG. 15A, FIG. 15B, FIG. 15C, FIG. 15D, and FIG. 15E are diagrams for explaining an example of a process for forming a conductive pillar 24.
Figure 15B:
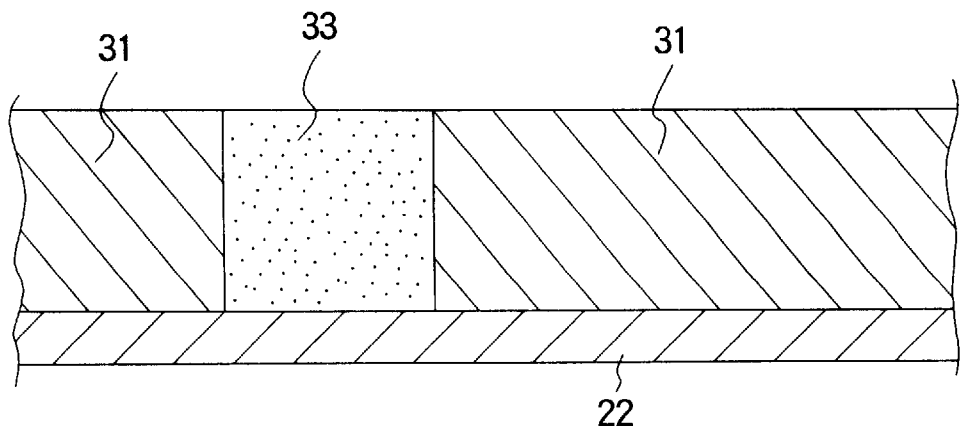

And the hole 31a of the metal mask 31 was filled with a conductive resin 33 through a screen 32 by a squeezer 34 (FIG. 15A and FIG. 15B).

Figure 15C:
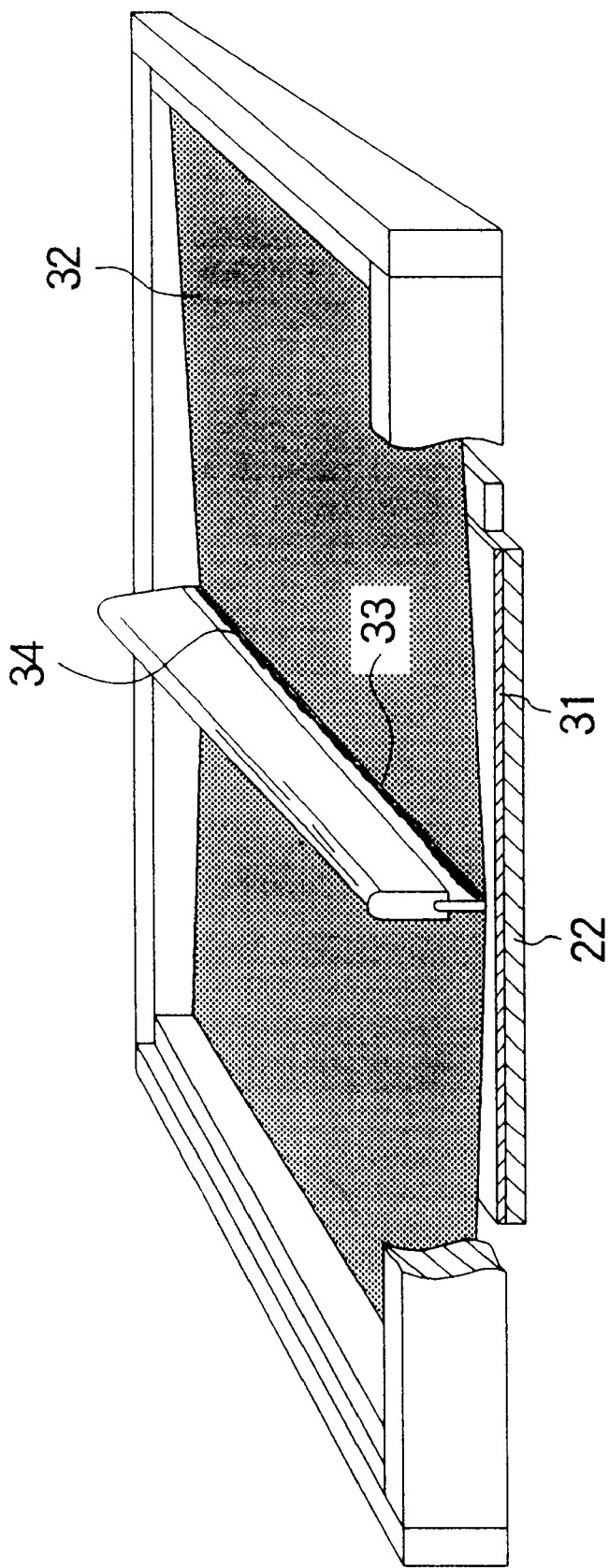

FIG. 15C is a figure for explaining an example of the screen printing.

In this case, a conductive resin obtained by mixing a solvent with a material obtained by kneading silver fine particles with a binder resin of epoxy system was used as the conductive resin 33. Although the conductive resin 33 is generally used in a state where it is usually adjusted to be several hundred poises in viscosity, the present invention used the conductive resin 33 in a state where its viscosity was adjusted to be much greater than this in order to control the shape of a conductive pillar. In addition, if necessary, the conductive resin 33 may be used after adjusting its thixotropy (in case that the conductive resin 33 is thixotropic).

Figure 15D:
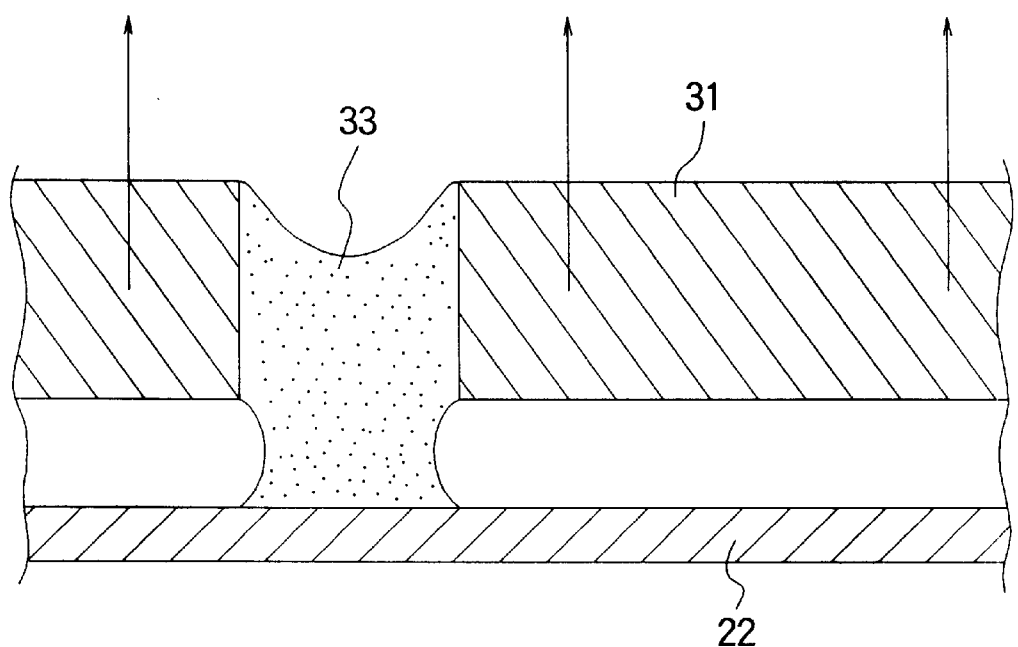
Figure 15E:
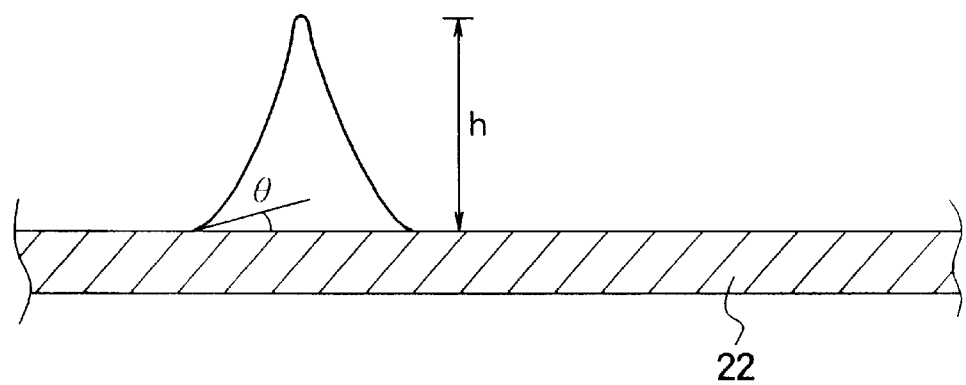

After filling the hole 31a of the metal mask 31 with the conductive resin 33 whose viscosity has been adjusted in such a way, the metal mask 31 and a first wiring layer 22 is separated from each other in the direction of a normal line of the first wiring layer 22 (see FIG. 15D). At this time the conductive resin 33 was deformed as being stretched between the first wiring layer 22 and the metal mask 31, and a conductive pillar 24 having a nearly conical shape was formed on the first wiring layer 22 (see FIG. 15E). The diameter r of the bottom face of the formed conductive pillar having a nearly conical shape was about 300 μm and its height h was about 250 μm. In addition, a part of the conductive resin 33 was attached to the hole 31a of the metal mask 31.

A connection shape which has a small contact angle θ made between the conductive pillar 24 and the surface of the first wiring layer 22 and which reduces a notch effect can be obtained by means of such a method as this. In case of attempting to form a conductive pillar 24 of a higher aspect ratio (height(h)/diameter(r) of the bottom face), for example, it can do to adjust the shape of the through hole 31a and physical properties of the conductive resin 33, or it can also do to dispose the metal mask 31 at the same position and repeat the screen printing.

The formation of the conductive pillar 24 is not limited to screen printing. The stamp method, in which conductive paste is pushed out from the hole in the mask, may be used for the formation. By such a method as well, a conductive pillar 24 having a high aspect ratio can be formed from conductive paste, conductive resin, etc. in the same way as the screen printing. Also, a conductive pillar consisting of metal may be formed by the plating method. In any case, the height and diameter of the conductive pillar 24 may be set in accordance with the construction of the formed via connection, as described later.

Although the above-mentioned method for forming a conductive pillar was described as taking a via connection of a multilayer wiring board as an example, quite in the same way it can be also formed, for example, on an electrode of an electronic element such as a semiconductor chip and the like.

The following is a description of a method for controlling the joint shape of the conductive pillar 24 thus formed and the second wiring layer 23.

Figure 16:
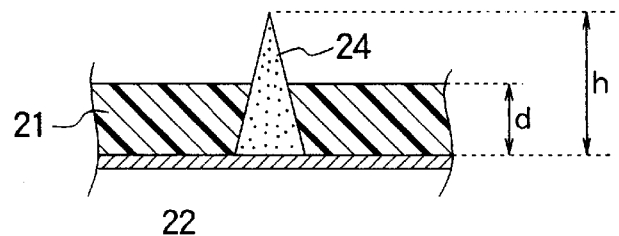
FIG. 16 is a diagram showing the relation between the conductive pillar 24 and an insulating layer 21.

FIG. 16 schematically shows the relationship between the conductive pillar 24 and the insulating layer 21, corresponding to the state shown in FIG. 14B in Example 3. The inventor found by experiments that the joint shape of the conductive pillar 24 and the second wiring layer 23 relates to the mass ratio between the portion where the conductive pillar 24 is embedded in the insulating layer 21 and the portion where the conductive pillar 24 protrudes from the surface of the insulating layer 21, and the physical property values of the conductive pillar 24 such as plastic deformability.

It was found that for example, when an electrolytic copper foil is used as the wiring layer and silver fine particles are used as a conductive filler composing the principal part of the conductive pillar 24, the height H of the conductive pillar is set so as to be greater by a factor of 1 to 5, preferably by a factor of 1.6 to 4, with respect to the thickness d of the insulating layer 21, by which the contact angle θ between the conductive pillar 24 and the surface of second wiring layer 23 is decreased, so that the joint shape such as to relax the notch effect can be obtained.

The reason why the height h of the conductive pillar 24 is set so as to be greater than the thickness d of the insulating layer 21 is as follows: For example, in the case where the insulating layer 21 is made of a thermosetting resin, the thickness thereof shrinks by about 0 to 30% when curing is made from B stage to C stage. Also, in the case of thermoplastic resin, the thickness shrinks by about 0 to 15% by the solidification from the soft state. Therefore, if the height h of the conductive pillar 24 exceeds at least 1.2 times the thickness of the insulating layer 21, at least the tip end of the conductive pillar 24 protrudes from the surface of the insulating layer 21. This protruding portion is a portion where the joint shape is formed by plastic deformation when the conductive pillar 24 is pressed together with the second wiring layer 23. If the height h of the conductive pillar 24 is 1.2 to 5 times, preferably 1.5 to 4 times, the thickness d of the insulating layer 21, the second wiring layer 23 is not broken, and a joint shape such that the contact angle θ is small and the notch effect is relaxed can be obtained.

The above description is applied to the case where the conductive pillar 24 is formed on either of two wiring layers connected to each other.

For example, when the interlayer connection is formed by pushing the conductive pillars 24 in a faced manner from both sides of the semi-cured insulating layer 21, it is preferable to set the height h of the conductive pillar 24 so as to be about 0.8 to 2 times the thickness d of the insulating layer 21.

Figure 17:
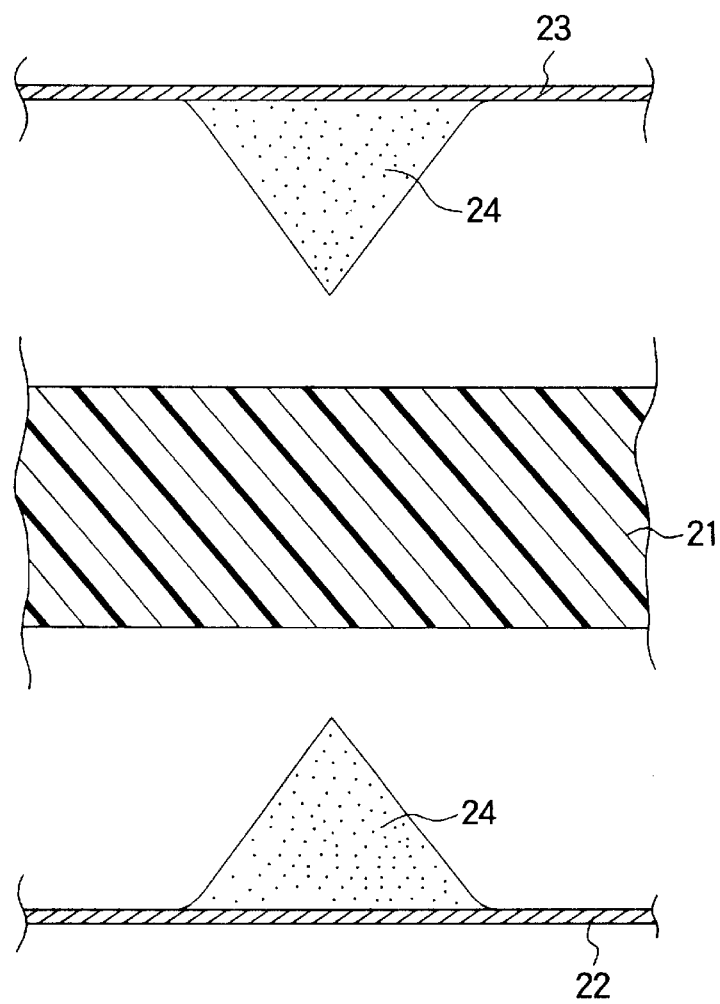
FIG. 17 is a diagram showing a state in which a first wiring layer and a second wiring layer are arranged so that conductive pillars may be opposite of each other with an insulating layer interposed between the pillars.
Figure 18:
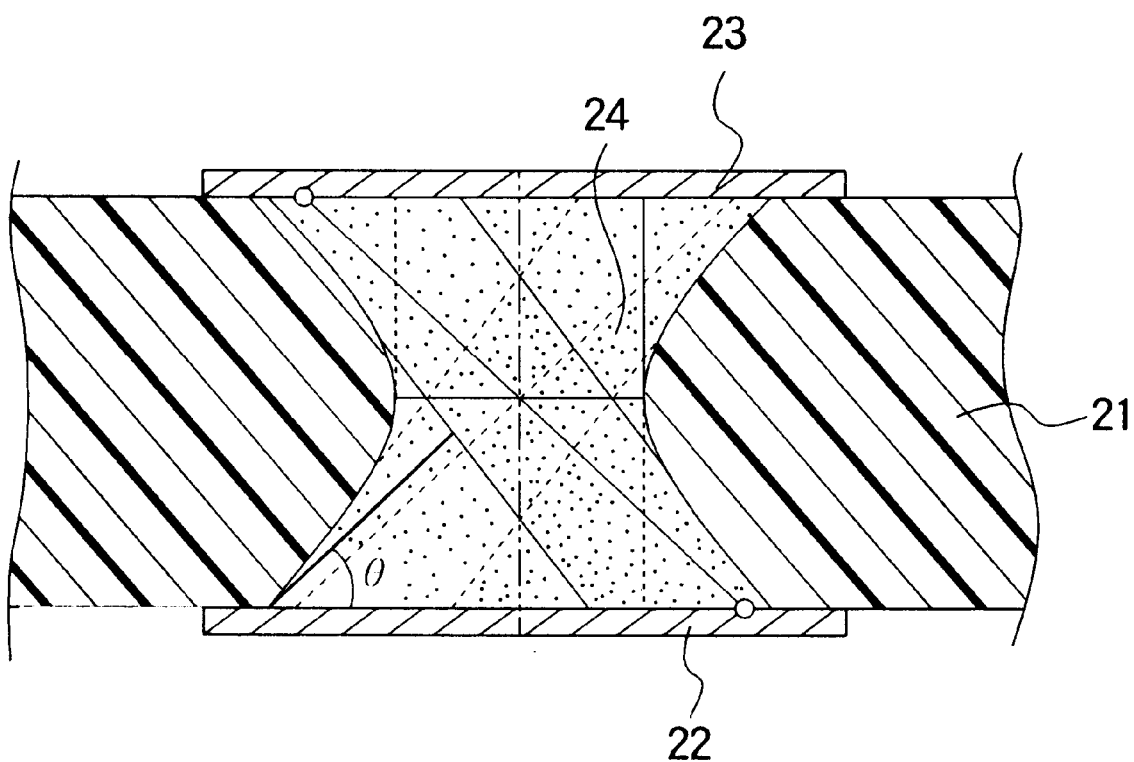
FIG. 18 is a cross-sectional view of a via connecting portion, formed by making the conductive pillars 24 penetrate from both sides of the insulating layer 21, of a multilayer wiring board consistent with the present invention.

FIG. 17 is a view showing a state in which the first wiring layer 22 and the second wiring layer 23 are arranged from both sides of the insulating layer 21 with the conductive pillars 24 being faced. FIG. 18 is a view schematically showing a construction of the multilayer wiring board of the present invention in which the interlayer connection is formed by pushing the conductive pillars 24 in a faced manner from both sides of the insulating layer 21.

On the other hand, when the interlayer connection is formed by forming the conductive pillar 24 on either of two wiring layers connected to each other as described above and by pushing the conductive pillar 24 from one side of the insulating layer 21, it is preferable to set the height h of the conductive pillar 24 so as to be about 1.6 to 4 times the thickness d of the insulating layer 21.

EXAMPLE 10

The sectional shape of the conductive pillar 24 and the contact angle between the conductive pillar 24 and the wiring layer 22, 23, 27a, 27b were observed by cutting the multilayer wiring board of the present invention manufactured in Example 4. The sectional shape in the plane in parallel with the axis of the conductive pillar 24 was a hand drum shape. The contact angle θ was in the range between 30° and 80°.

Five 4-layer multilayer wiring boards having 9000 points of conductive pillars 24, manufactured as described above, were prepared. These multilayer wiring boards were dipped in a solder bath of 288° C. for 20 seconds duration and pulled up to evaluate the change in wiring resistance. The measured wiring resistance values were in the measurement tolerance range before and after the evaluation test, and there was no substantial change. Even when the same test was repeated five times, a significant change in resistance value was not found.

Also, five 4-layer multilayer wiring boards having 9000 points of conductive pillars 24, manufactured as described above, were prepared, and thermal cycle test was conducted. For the thermal cycle test, a cycle, in which the multilayer wiring board was allowed to stand at −65° C. and +125° C. for 30 minutes each, was repeated 3000 times. A significant change in wiring resistance values was not observed before and after the test, and all the values were in the range of measurement tolerance.

Figure 11A:
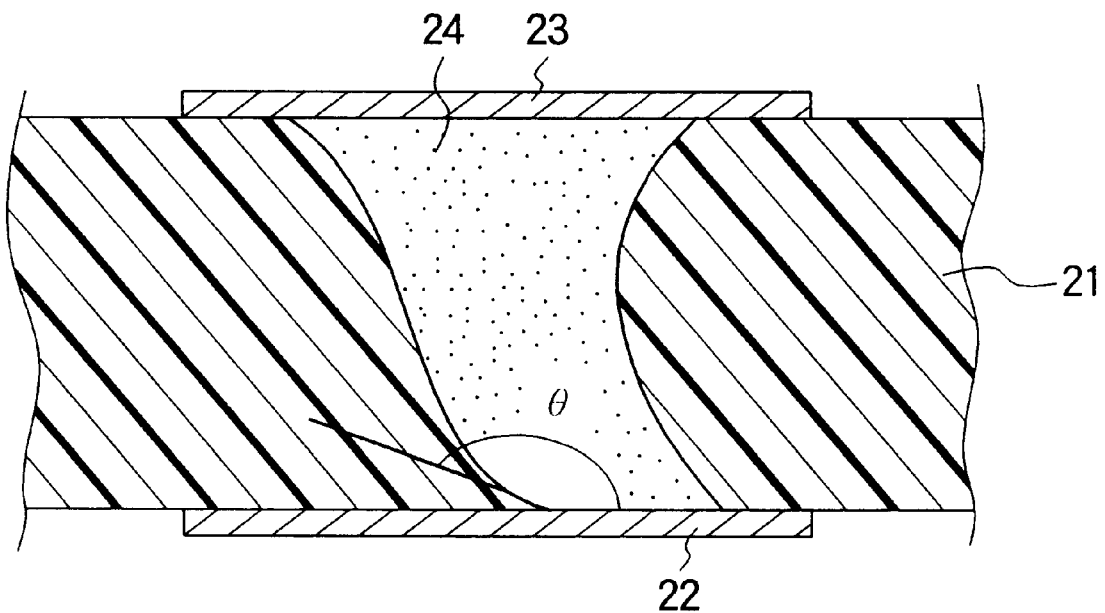
FIG. 11A and FIG. 11B are diagrams showing undesirable examples of the shape of a connecting portion between a conductive pillar and a first or second via land.
Figure 11B:
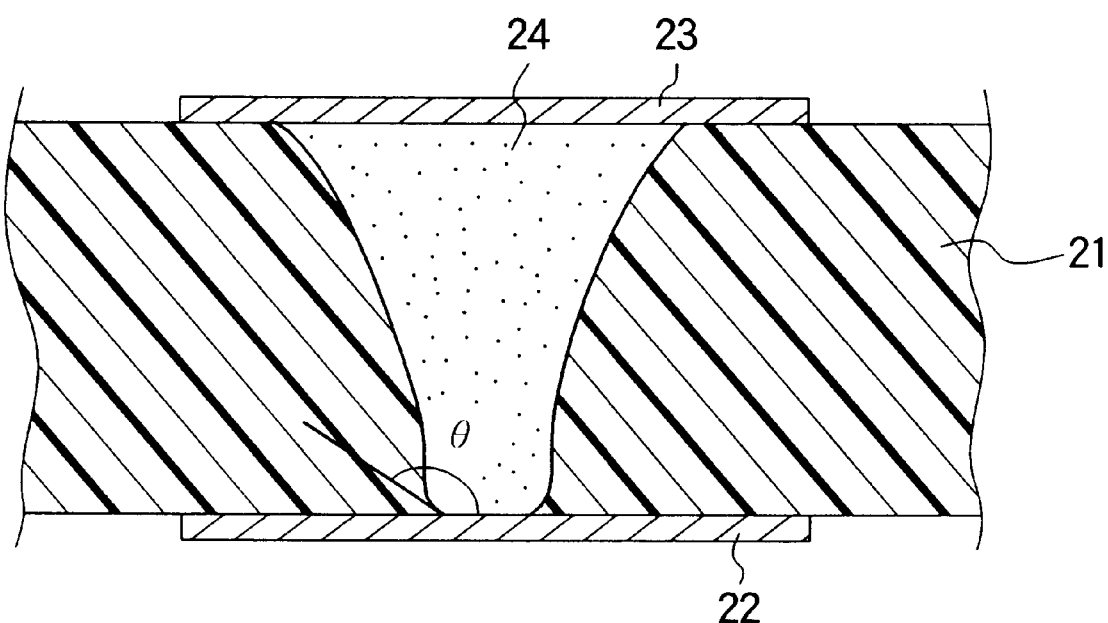

For comparison, a multilayer wiring board having four wiring layers, in which the height of the conductive pillar 24 was smaller than the thickness of the insulating layer 21 through which the tip end of the conductive pillar 24 pierced (considering the shrinkage of the insulating layer 21 due to thermohardening), was manufactured by the manufacturing method described in Examples C3 and C4. Materials for all elements including the insulating layers 21 and 21b, the wiring layers 22, 23, 27a, and 27b, and the conductive pillar 24 were the same as those used in Examples C3 and C4. The wiring circuit was formed into the same pattern. The sectional shape of the conductive pillar 24 and the contact angle between the conductive pillar and the wiring layer 22, 23, 27a, 27b were observed by cutting the multilayer wiring board. The sectional shape in the plane in parallel with the axis of the conductive pillar 24 was as shown in FIG. 11A and FIG. 11B. The contact angle was in the range between 30° and 150°.

This multilayer wiring board of comparative example was dipped in a solder bath of 288° for 20 seconds and then pulled up to test the change in wiring resistance. The result was that 95% in average of via connection was broken. The cross section was observed by cutting, and it was found that peeling occurred on the joint intersurface between the conductive pillar 24 and the wiring layer 22, 23, 27a, 27b. This is because the insulating layer 21, 21b thermally expanded greater than the conductive pillar 24 in the axial direction of the conductive pillar 24 due to a thermal load caused by the solder bath, and in the multilayer wiring board of comparative example, a high stress (tension) concentrated on the joint intersurface between the conductive pillar 24 and the wiring layer 22, 23, 27a, 27b, especially at the notch of the junction between the outer side surface of conductive pillar 24 and the wiring layer.

EXAMPLE 11

Next, the relationship between the height h of the conductive pillar 24 and the thickness d of the insulating layer 21 will be described. The inventor prepared multilayer wiring boards of the present invention by changing the height h of the conductive pillar 24, and conducted various tests.

For the insulating layer 21, a glass cloth filled epoxy resin prepreg with a thickness of 115 μm was used. On the other hand, for the first wiring layer 22 and the second wiring layer 23, an electrolytic copper foil with a thickness of 35 μm was used. For the conductive pillar 24, the screen printing, drying, and curing of conductive paste with fine silver particles being used as a conductive filler were repeated. Thus, six kinds of multilayer wiring boards with different height d of the conductive pillar 24 were manufactured. All conductive pillars 24 had a substantially conical shape having a substantially circular bottom surface, and the diameter of the bottom surface was about 250 μm. The height d was 100 μm, 140 μm, 200 μm, 300 μm, 570 μm, and 600 μm. The contact angle θ between the first wiring layer 22 and the conductive pillar 24 is, in any case, such that stresses do not concentrate. The insulating layer 21 shrinks by about 20% in curing, and the thickness thereof d becomes about 100 μm. Therefore, in the case where the height h of the conductive pillar 24 is 100 μm, the protruding height of the conductive pillar 24 is such that the conductive pillar 24 is exposed slightly, and in other cases, it is about 40 μm, 100 μm, 200 μm, 470 μm, or 500 μm.

The insulating layer 21 consisting of a glass cloth filled epoxy resin prepreg with a thickness of 115 μm was laminated on the first wiring layer 22 forming such conductive pillars 24, and the whole construction was pressed by means of a stainless steel plate so that the head of the conductive pillar 24 was crushed to be deformed plastically. Then, the second wiring layer 23 consisting of an electrolytic copper foil with a thickness of 35 μm was laminated, and the whole construction was pressed while being heated. The insulating layer was cured by heating, and on the other hand, the first wiring layer 22 and the second wiring layer 23 were connected to each other by the conductive pillars 24.

Figure 19A:
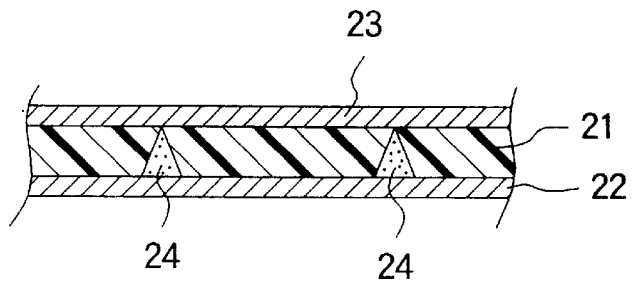
FIG. 19A, FIG. 19B, FIG. 19C, FIG. 19D, FIG. 19E, and FIG. 19F are diagrams showing via connecting portions of multilayer wiring boards, each manufactured using conductive pillars having a different height h.
Figure 19B:
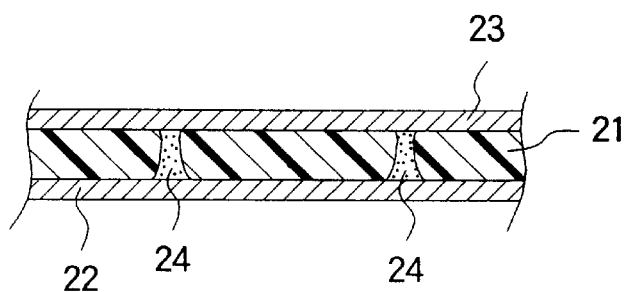
Figure 19C:
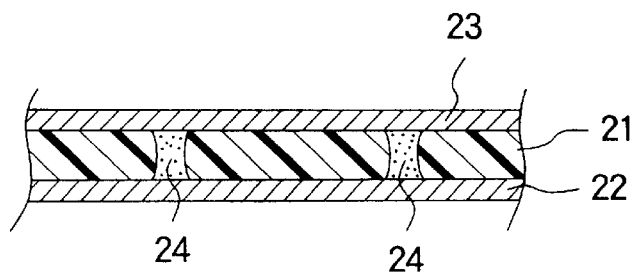
Figure 19D:
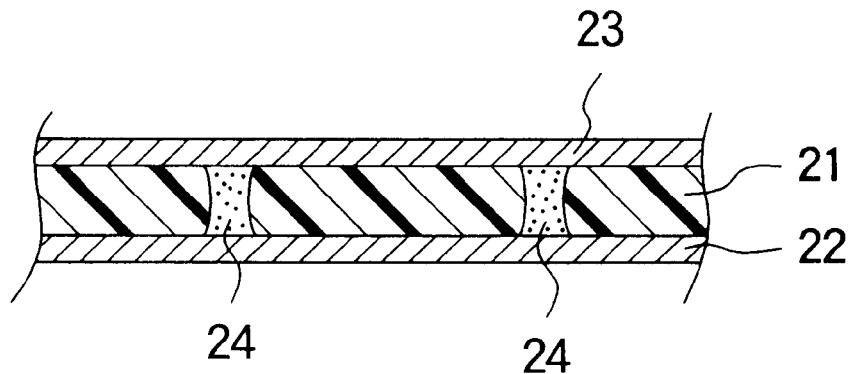
Figure 19E:
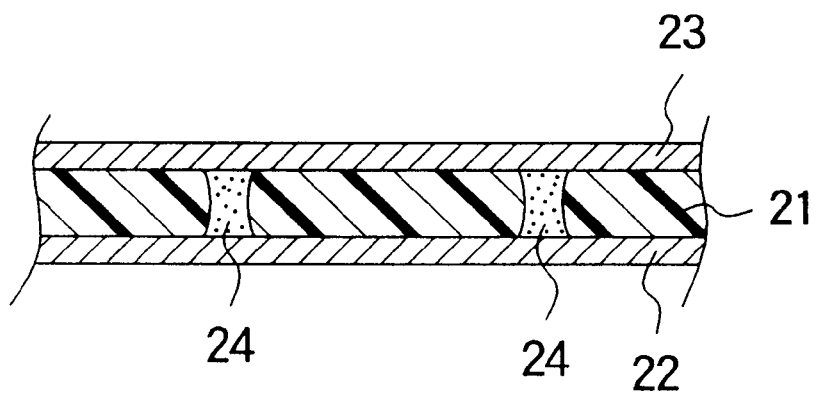

By cutting six kinds of multilayer wiring boards thus manufactured, photographic observation was made on the construction of interlayer connection including the conductive pillar 24. FIG. 19A schematically shows a construction of interlayer connection of the multilayer wiring board manufactured by adjusting the height h of the conductive pillar 24 to 100 μm. FIG. 19B, FIG. 19C, FIG. 19D, FIG. 19E, and FIG. 19F schematically show a construction of interlayer connection of the multilayer wiring board manufactured by adjusting the height d of the conductive pillar 24 to 140 μm, 200 μm, 300 μm, 570 μm, and 600 μm, respectively.

When the height h of the conductive pillar 24 is smaller than the thickness d of the insulating layer 21, the joint area with the second wiring layer 23 was not sufficient as shown in FIG. 19A. The contact angle θ was larger than 90°, being approximately in the range between 100° and 160°.

On the other hand, when the height h of the conductive pillar 24 was set so as to be greater than the thickness d of the insulating layer 21 (h=140 μm, 200 μm, 300 μm, 570 μm), the joint area with the second wiring layer 23 was sufficient, and the contact angle θ was smaller than 90°, being such that stresses are less prone to concentrate. The contact angle θ was in the range between 30° and 80°.

However, when the height h of the conductive pillar 24 exceeds five times the thickness of the insulating layer 21 (FIG. 19F), some parts of the second wiring layer 23 were damaged. A multilayer wiring board, in which the second wiring layer was formed on another insulating layer 21c, and a stress releasing means as typically shown in FIG. 2 was provided in the via land connecting to the conductive pillar 24 with a height h of 600 μm, was manufactured. On this multilayer wiring board, the damage to the second wiring layer 23, like the damage in FIG. 19F, was not found (FIG. 19G). The conductive pillar 24 had an intruded zone 24b in which part of the conductive pillar 24 intrudes in the insulating layer 21c.

The first wiring layer 22 and the second wiring layer 23 of the multilayer wiring board shown in FIG. 19A to FIG. 19F were patterned into a wiring circuit, and the multilayer wiring board was subjected to a test in which the multilayer wiring board was dipped in a solder bath of about 288° C. for 20 seconds and then pulled up, by which the change in wiring resistance before and after the test was investigated.

On the multilayer wiring board in which the height h of the conductive pillar 24 in formation was set at 100 μm and 600 μm, poor connection was found after the test, and the resistance value increased even at the portion where continuity was maintained.

On the other hand, on the multilayer wiring board in which the height h of the conductive pillar 24 in formation was set at 140 to 570 μm, a significant change in wiring resistance value before and after the test was not found, and the wiring resistance value was in the range within the measurement tolerance. Even when the same test was repeated five times, a significant change in wiring resistance value was not found, and the wiring resistance value was in the range within the measurement tolerance.

Apart from this, the first wiring layer 22 and the second wiring layer 23 of the multilayer wiring board shown in FIG.

Figure 19F:
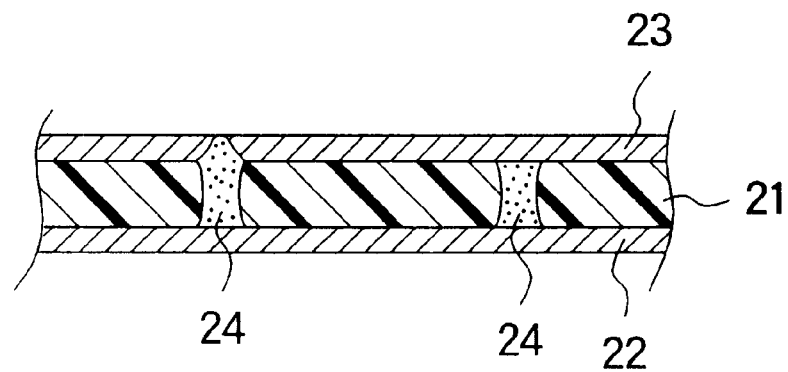
Figure 19G:
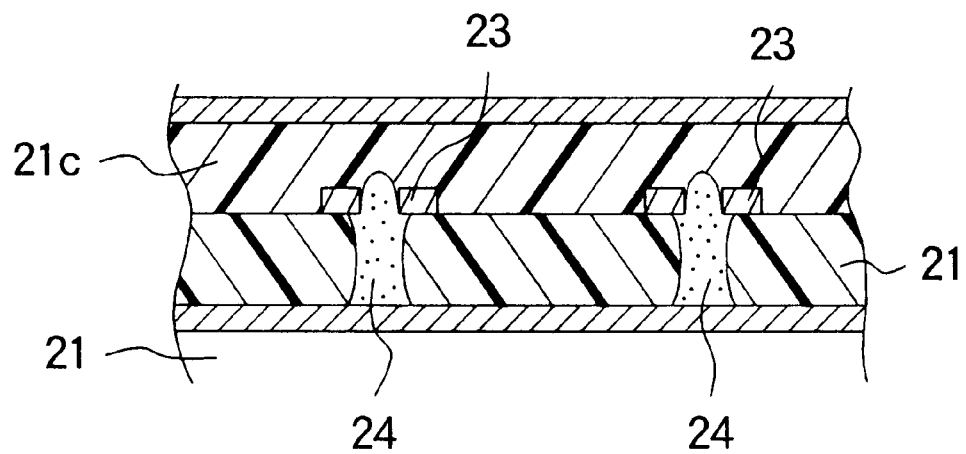
FIG. 19G is a diagram showing a via connection of the multilayer wiring board of FIG. 19F, having a stress releasing means formed in a via land.

19A to FIG. 19F were patterned into a wiring circuit, and a hot oil test, in which thermal load cycles of 20° C. for 20 seconds and 260° C. for 5 seconds were repeated, was conducted to investigate the change in wiring resistance before and after the test.

On the multilayer wiring board in which the height h of the conductive pillar 24 in formation was set at 100 µm and 600 µm, poor connection was found after the test, and the resistance value increased even at the portion where continuity was maintained.

On the other hand, on the multilayer wiring board in which the height h of the conductive pillar 24 in formation was set at 140 to 570 µm, a significant change in wiring resistance value before and after the test was not found, and the wiring resistance value was in the range within the measurement tolerance. Even when the same test was repeated five times, a significant change in wiring resistance value was not found, and the wiring resistance value was in the range within the measurement tolerance.

Figure 12A:
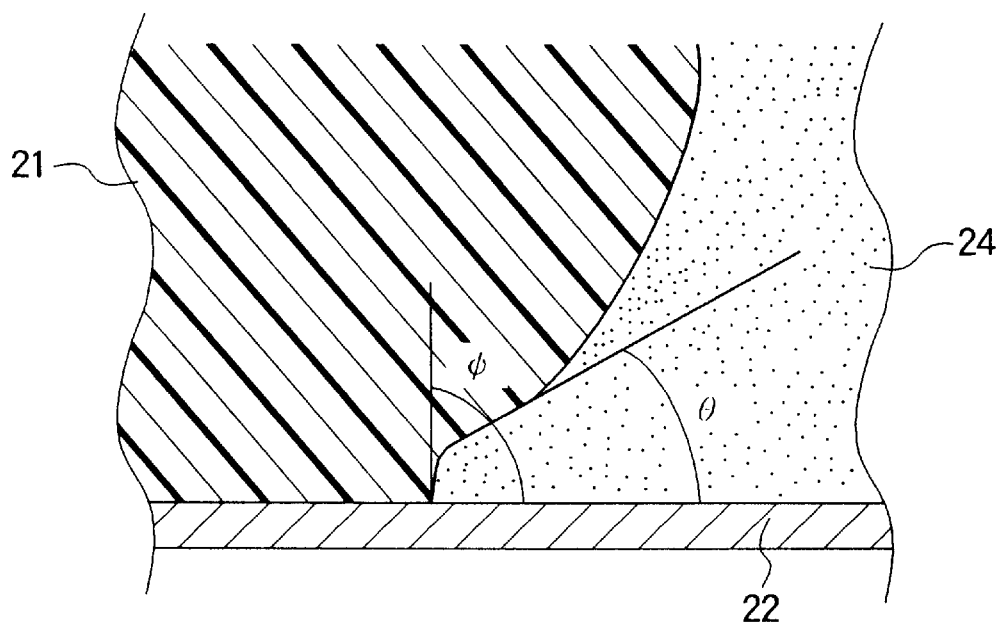
FIG. 12A and FIG. 12B are diagrams showing further examples of the shape of a connecting portion between a conductive pillar and a first or second via land.
Figure 12B:
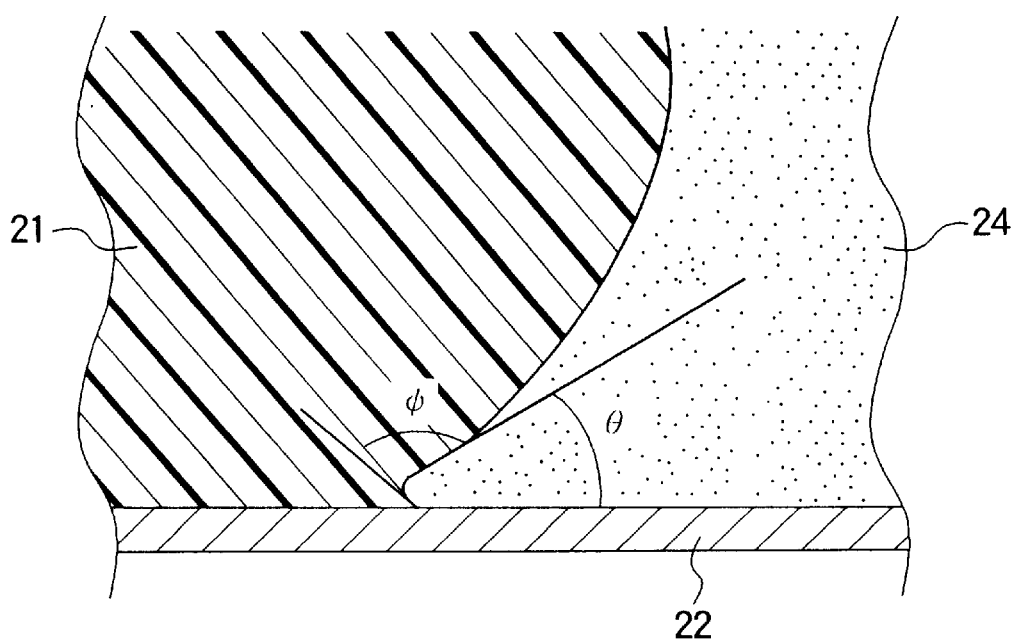

Also, a multilayer wiring board (four-layer board) of the present invention having interlayer connection using 10,000 points of conductive pillars was manufactured. On this multilayer wiring board, most connection shapes between the outer side surface of conductive pillar 24 and the surface of wiring layer (via land) were as shown in FIG. 10A, FIG. 10B, and FIG. 10C. In some connection shapes, the macroscopic contact angle θ as shown in FIG. 12A and FIG. 12B was smaller than 90°, but the microscopic contact angle φ included angles over 90°.

The hot oil test as described above was conducted on this multilayer wiring board to investigate the continuity of interlayer connection. The result was that the continuity was maintained at all connections. Also, a significant change in wiring resistance value was not found, and the wiring resistance value was in the range within the measurement tolerance. Even when the same test was repeated five times, a significant change in wiring resistance value was not found, and the wiring resistance value was in the range within the measurement tolerance. For comparison, a multilayer wiring board (four-layer board) having interlayer connection using 10,000 conductive pillars, which has a connection shape in which the macroscopic contact angle θ as shown in FIG. 11A and FIG. 11B was larger than 90°, was manufactured, and the same test was conducted. The result was that all connections had poor continuity.

Such a multilayer wiring board of the present invention has the construction of interlayer connection having conductive pillars such that stresses do not concentrate, so that the occurrence of peeling and breakage of the conductive pillar and wiring layer can be prevented even when a thermal load is applied in the mounting process, application environment, etc. Therefore, a multilayer wiring board having high reliability and simple construction can be provided. Also, the multilayer wiring board of the present invention has a small number of through holes, or need not have through holes, so that the electronic element mountable area is expanded, and high-density mounting can be achieved.

Also, according to the method for manufacturing the multilayer wiring board of the present invention, a multilayer wiring board having an increased joint strength between the conductive pillar and the wiring layer can be manufactured without a decrease in productivity. According to the method for manufacturing the multilayer wiring board of the present invention, the electrical connection between the wiring layers can be maintained easily and reliably. Accordingly, a highly reliable multilayer wiring board can be provided at a low cost.

The multilayer wiring board of the present invention is used not only as the wiring board for general electronic equipment, personal computers, etc. but also as the wiring board for multi chip modules (MCM) and chip sized package (CSP), by which the increase in reliability of connection and the increase in mounting density can be achieved.

EXAMPLE 12

Figure 20A:
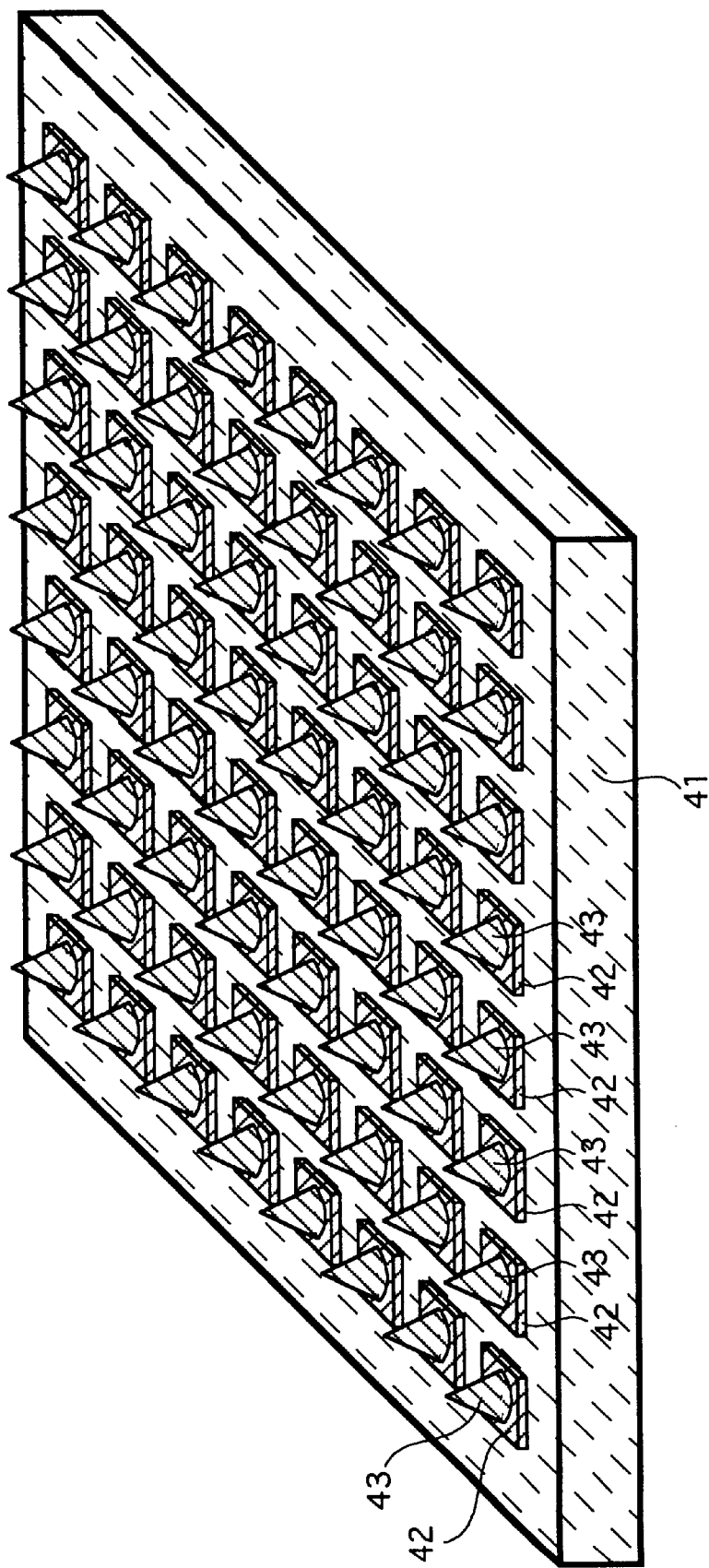
Figure 20B:
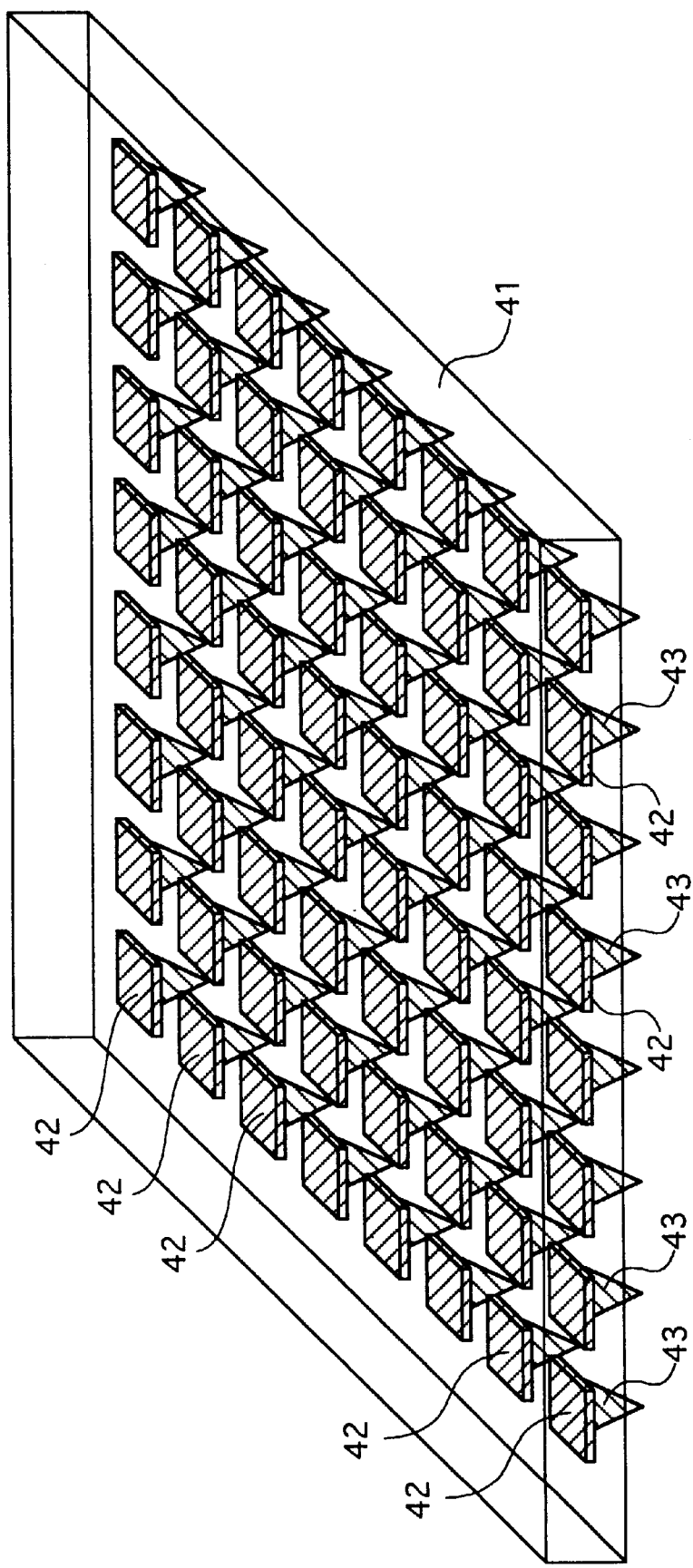
FIG. 20B is a second perspective view that is opposite of the first perspective view of FIG. 20A.

FIG. 20A is a perspective view schematically showing an example of an electronic element of the invention, and FIG. 20B is a perspective view schematically showing construction of the electronic element seen through from its reverse side. Here, a semiconductor device is shown as an example of the electronic element. This semiconductor device 41 is in a bare-chip state and has 64 electrodes 42 for connecting to an external circuit. A conductive pillar 43 having a nearly conical shape as described above is formed on each of the electrodes 42. As an electronic element, not only a semiconductor device but also a surface acoustic wave device for example may be used. In addition, an electronic element may be not only in a bare-chip state but also in a state of being molded with resin and the like or in a state of being sealed in a metal case and the like.

Figure 21A:
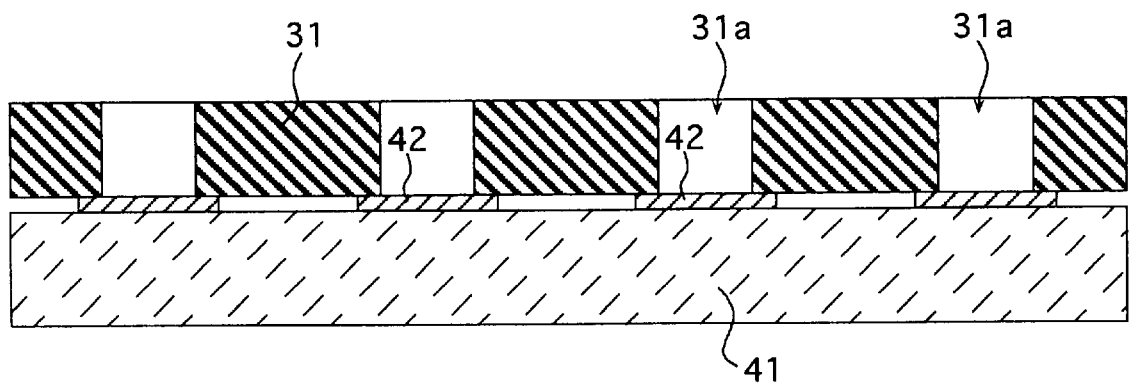
FIG. 21A, FIG. 21B, and FIG. 21C are diagrams for explaining a method for forming a conductive pillar on an electrode of an electronic element consistent with the present invention.
Figure 21B:
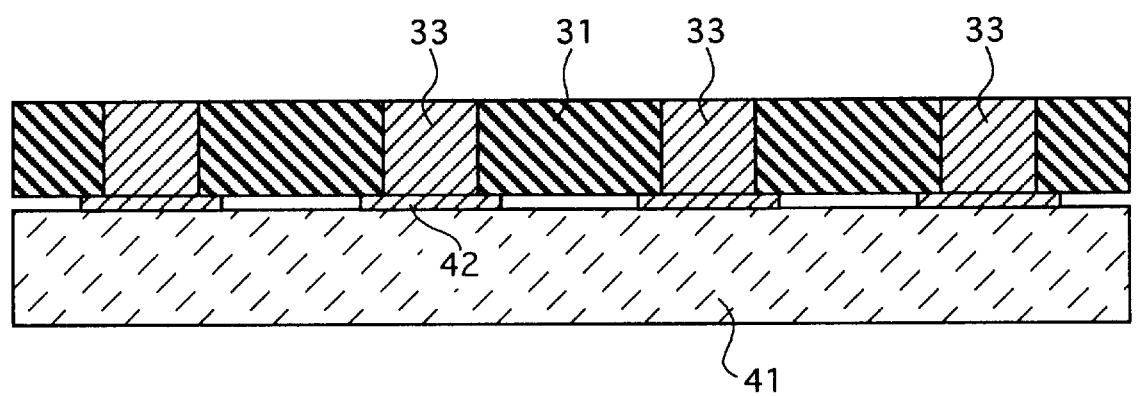
Figure 21C:
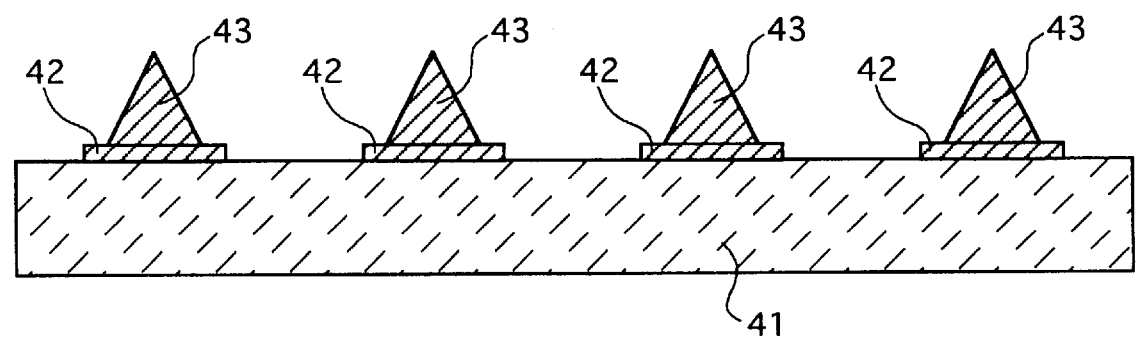

This conductive pillar 43 was formed by means of the same method as described above. FIG. 21A, FIG. 21B, and FIG. 21C are figures for explaining an example of a method for forming a conductive pillar on an electrode of an electronic element. First, a metal mask 31 having through holes 31a in the shape of a cylinder was arranged at a specified position on the upper side of electrodes 42 (see FIG. 21A). In addition, the holes 31a were filled with the conductive resin 33 by means of a screen printing (FIG. 21B), and then by drawing up the metal mask 31 in the direction of a normal line of the surface of the electrode 42, a conductive pillar 43 having a nearly conical shape was formed on the electrode 42 (FIG. 21C). The conductive pillar 43 formed in such a way was fixed in shape by heating and hardening its binder resin.

The contact portion between the conductive pillar 43 and the electrode 42 had a shape where the outer circumferential surface of the conductive pillar 43 and the surface of the electrode 42 were smoothly joined to each other and a stress was hard to concentrate.

An electronic element of the invention such as this which has a conductive pillar as a connecting means to an external circuit can give an electronic element package of the invention by being mounted on a multilayer wiring board by means of the same method as a multilayer-manufacturing process for making a multilayer wiring board according to the invention.

For example, first, a wiring layer of a specified pattern having a via land at a position corresponding to an electrode of an electronic element and the electronic element having a conductive pillar formed on the electrode are arranged so as to be opposite to each other with interposing an unhardened insulating resin layer between them. In addition, when they are pressed from both sides of them, the conductive pillar penetrates the semicured insulating resin layer and is connected to the via land as being deformed by plastic deformation. At the same time the insulating resin layer is hardened by heating.

As described above, an electronic element of the invention has a great advantage that soldering is not needed in mounting. In addition, since wiring of lead wires from an electronic element can be performed on a plurality of wiring layers by mounting the electronic element on a multilayer wiring board of the invention, the mounting density is remarkably improved.

EXAMPLE 13

Figure 22:
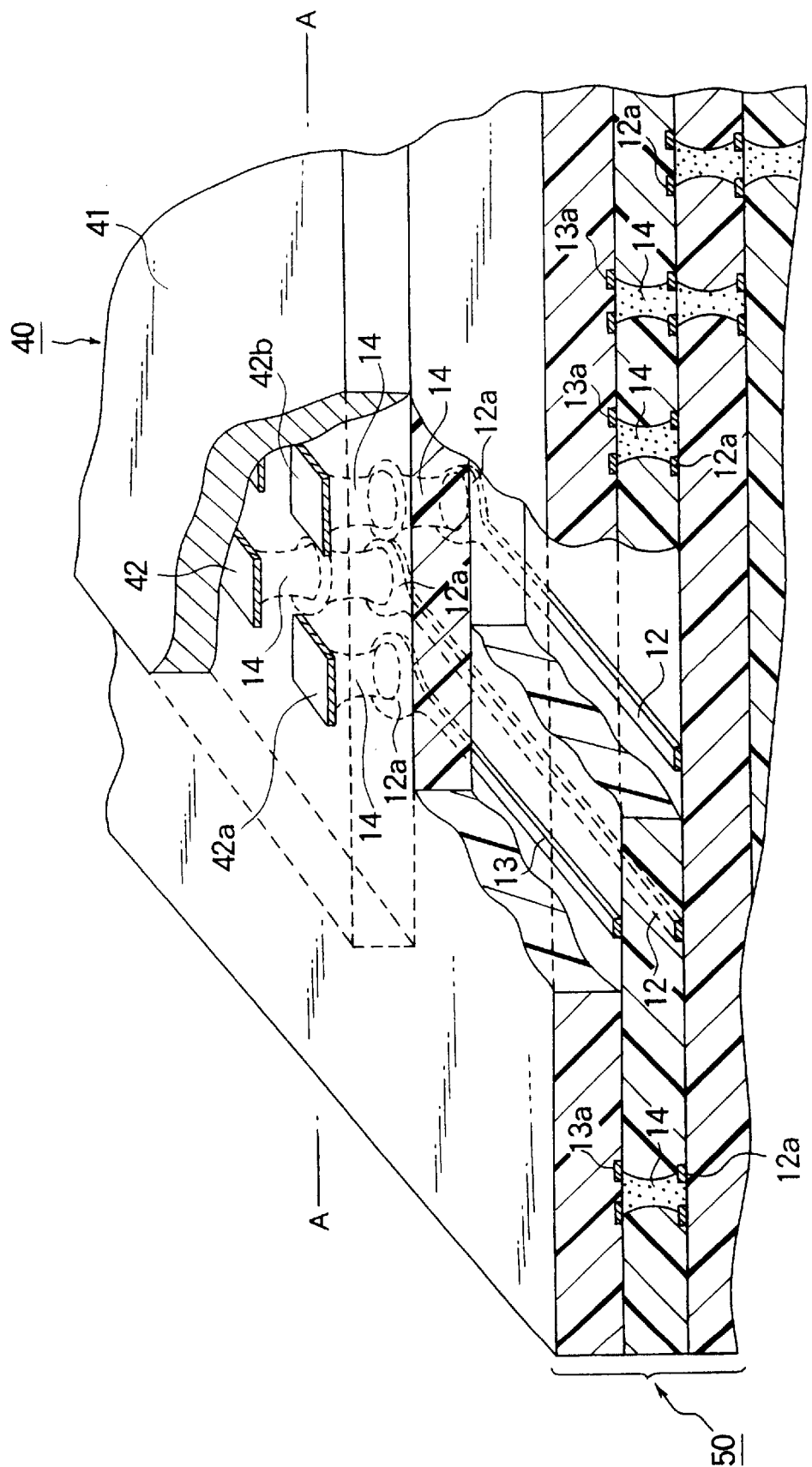
FIG. 22 is a perspective view of an electronic element package consistent with the present invention.
Figure 23:
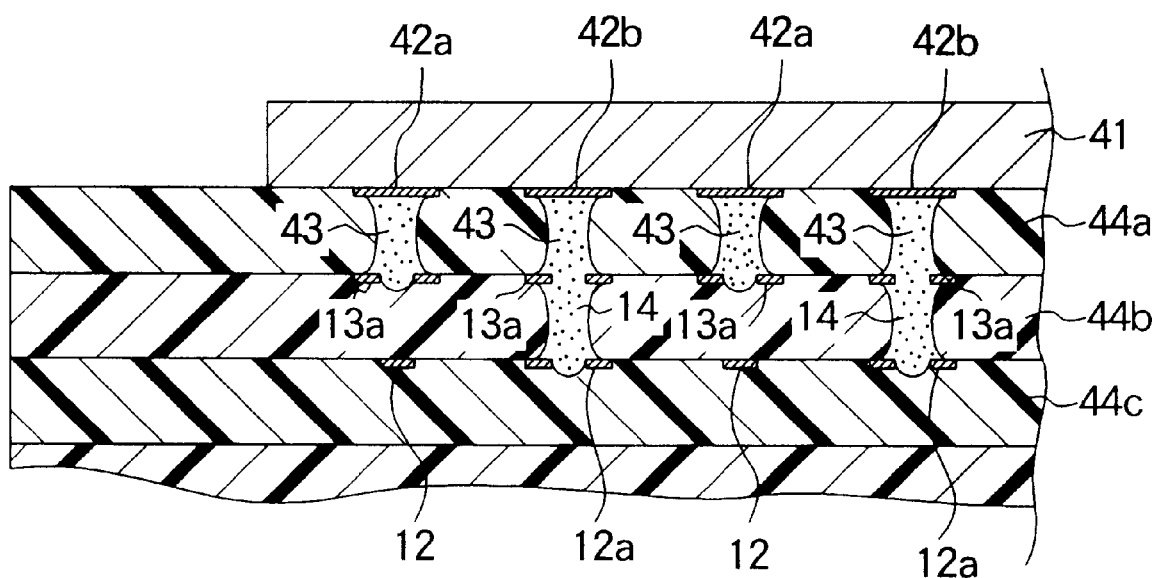
FIG. 23 is a cross-sectional view of the electronic element package of FIG. 22, taken along the line A—A.
Figure 24:
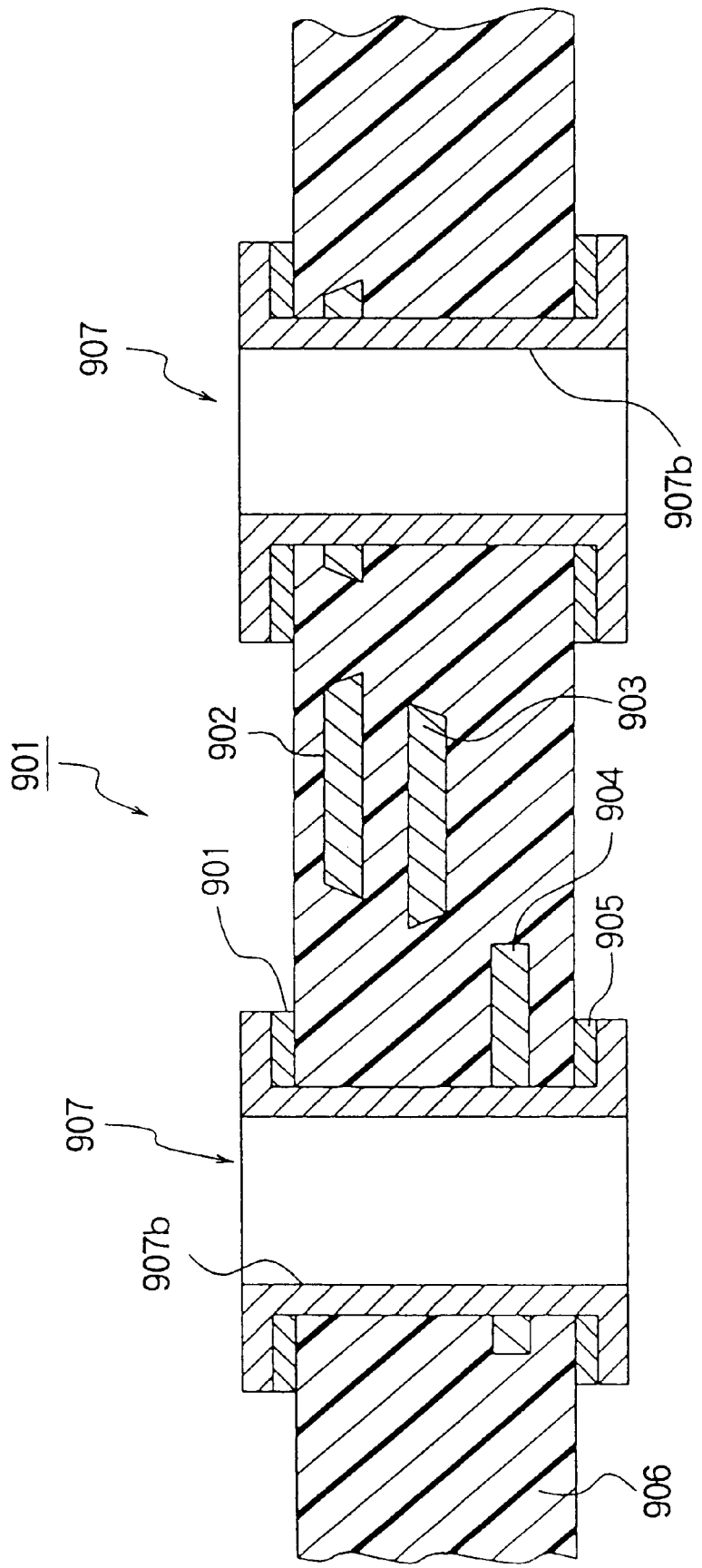
FIG. 24 is a cross-sectional view of a conventional multilayer wiring board.
Figure 25A:
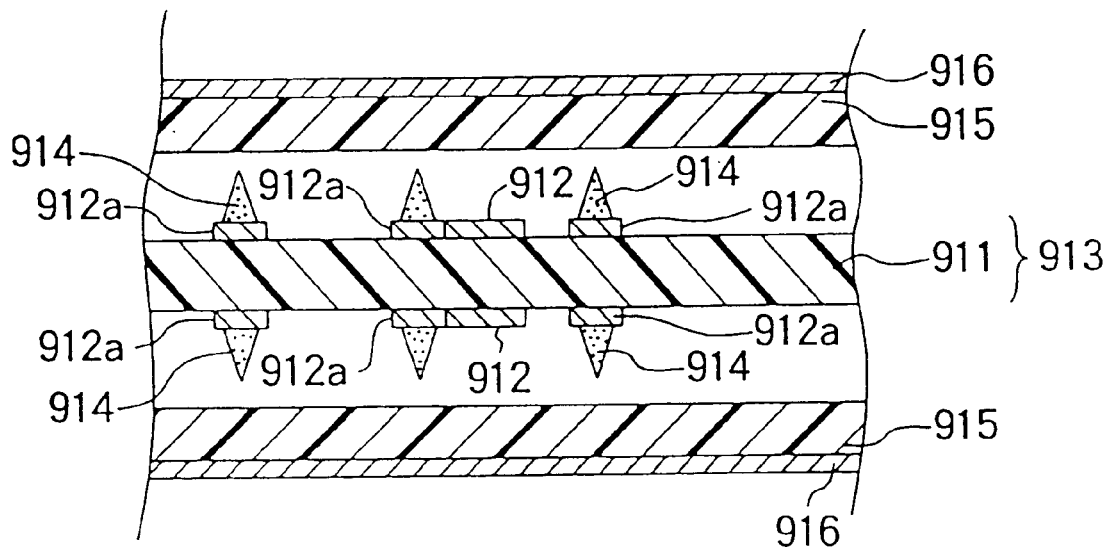
FIG. 25A and FIG. 25B are diagrams for explaining a manufacturing process of a multilayer wiring board having wiring layers connected to each other by conductive bumps.
Figure 25B:
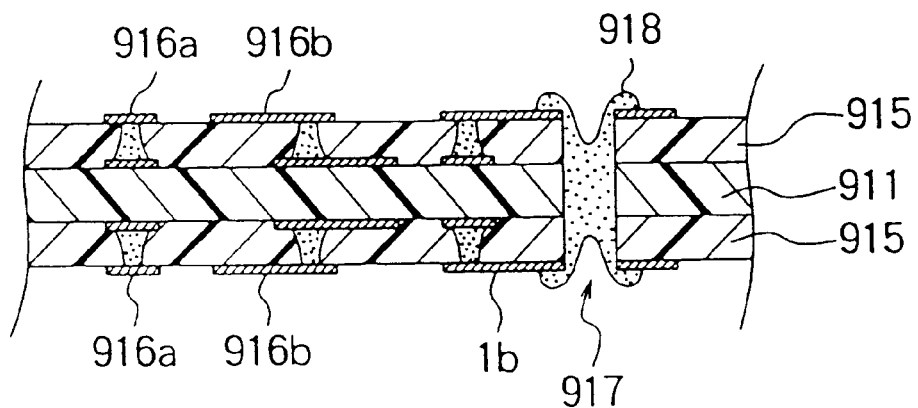
Figure 26A:
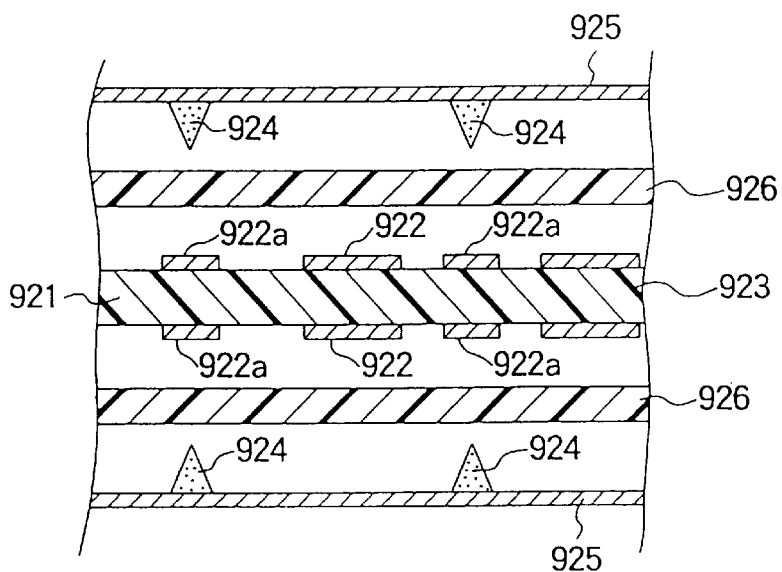
FIG. 26A and FIG. 26B are diagrams for explaining another manufacturing process of a multilayer wiring board having wiring layers connected to each other by conductive bumps.
Figure 26B:
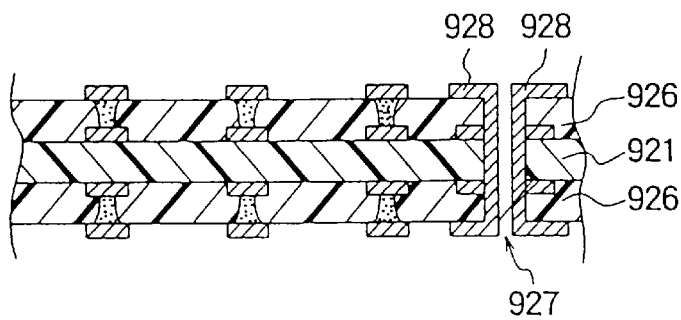

FIG. 22 is a perspective view schematically showing an example of an electronic element package of the invention. FIG. 23 is a figure schematically showing a sectional construction taken along line A—A of the electronic element package shown in FIG. 22.

This electronic element package is an electronic element package which is obtained by mounting an electronic element 40 of the invention described above on a multilayer wiring board 50 of the invention as described above and in which the semiconductor device 41 and the multilayer wiring board 50 are electrically connected to each other through the conductive pillars 43.

An electrode 42 of the semiconductor device 41 and a via land 13a of the wiring board are connected with each other by the conductive pillar 43. This via land 13a has a through hole illustrated in FIG. 2 and can release a normal line stress acting on the conductive pillar in its axial direction. Some via lands 13a are directly connected to via lands of another wiring layer through conductive pillars 14. In the electronic element package of FIG. 22, the electrodes 42 of the semiconductor device 41 are connected to via lands formed on a plurality of different wiring layers. For example, an electrode 42a is connected to a wiring layer which the via land 13a belongs to, while an electrode 42b is connected to a wiring layer which the via land 12a belongs to. Therefore, according to the invention, even an electronic element having a number of electrodes can make wiring of its lead wires easier and can make its mounting area smaller. In addition, a connecting portion between an electronic element package and an external circuit may be made at a peripheral area or at the reverse side of the electronic element mounting side of the multilayer wiring board 50 so as to form a pad for PGA, BGA, or wire bonding, for example. It is a matter of course that a via connection adopting a via land and a conductive pillar which a multilayer wiring board of the invention is provided with as described above may be used also in a connecting portion between such an electronic element package and an external circuit.

The construction of such an electronic element package can be applied to a chip-sized package (CSP) whose package size is very close to a chip size.

In this way, an electronic element package suitable for high-density mounting can be obtained by combining together a multilayer wiring board and an electronic element according to the present invention. The number of electronic elements to be mounted on a board is not limited to one, but a plurality of electronic elements of different kinds may be mounted on a single multilayer wiring board. For example, also in case of forming a multi chip module by mounting a semiconductor device, a chip capacitor and the like, the invention can be applied quite in the same way.

INDUSTRIAL APPLICABILITY

As described above, a multilayer wiring board of the invention can release a stress acting on a conductive pillar in its axial direction by being provided with a via land having a stress releasing means. In addition, a stress acting on the via land in its tangential direction (tangential stress) can be relaxed mainly by plastic deformation of the conductive pillar. Accordingly, it can avoid breakage of a via land and a wiring circuit, and can establish a via connection of high reliability. In addition, since it can minimize within necessity the number of via connections made by through holes, it can cope with high-density mounting.

And since a multilayer wiring board of the invention has a shape in which a stress is not concentrated on a contact portion between a conductive pillar and a via land or a wiring layer, it can prevent occurrence of exfoliation or disconnection between the conductive pillar and the wiring layer even in case that a thermal load is imposed on it in a manufacturing process, a mounting process, an environment of use, or the like. Accordingly, it can provide a multilayer wiring board of high reliability and simple structure. In addition, since a multilayer wiring board of the invention can do with a few or no through holes, it can have a larger area where an electronic element can be mounted and can cope with high-density mounting. Additionally, furthermore, by using it in combination with a stress releasing means, breakage of a via connection can be prevented and the function of a via connection can be kept stable, even in case that a pressure or a tension acts between a conductive pillar and a via land.

Reliability of connection and density of mounting can be improved by using such a multilayer wiring board of the invention not only as a wiring board of a general electronic machine, a personal computer, or the like but also as a wiring board of a multi chip module (MCM) or a chip-sized package (CSP).

According to a prefabricated material for a multilayer wiring board of the invention, it is possible to easily manufacture a multilayer wiring board having via connecting portions of simple structure and of high reliability using conductive pillars.

And according to a method for manufacturing a multilayer wiring board of the invention, it is possible to suppress occurrence of defective connections as keeping a high productivity of the method for manufacturing a multilayer wiring board using conductive pillars. Furthermore, the productivity can be also improved.

And according to a method for manufacturing a multilayer wiring board of the invention, it is possible to manufacture a multilayer wiring board in which a joining strength of a conductive pillar with a wiring layer has been improved, without lowering the productivity. According to a method for manufacturing a multilayer wiring board of the invention, it is possible to easily and surely secure an electrical connection between wiring layers. Therefore, it is possible to provide a multilayer wiring board of high reliability at a low cost.

And according to a method for forming a conductive pillar of the invention, it is possible to form a conductive pillar of high connection reliability which makes a stress hard to concentrate, for example, on an electrode of an electronic element, a conductor layer or a via land of a wiring board, or the like.

An electronic element of the invention can be mounted without using solder. Accordingly, it is possible to protect workers' health in a manufacturing process and prevent environmental pollution. In addition, since an electronic element of the invention can perform wiring of lead wires from the electronic element on a plurality of wiring layers by mounting the electronic element on a multilayer wiring board, it is possible to remarkably promote the mounting density.

According to an electronic element package of the invention, it is possible to make the electronic element mounting side be multilayered to use it and to cope with mounting an electronic element having a number of electrodes in a small mounting area. Therefore, it is possible to make smaller in size various kinds of electronic element mounting packages including CSP and MCM or to more greatly improve their mounting density. Since wiring of lead wires from electrodes of an electronic element becomes easy, it is possible to greatly improve the degree of freedom in design.

What is claimed is:

1. A multilayer wiring board having a lamination of wiring layers and at least an insulating layer, comprising:
   a first insulating layer having a first face;
   a first writing layer formed on the first face of the first insulating layer, the first wiring layer having a first via land, and the first via land having a through hole;
   a second insulating layer formed on the first wiring layer;
   a second via land formed on the second insulating layer, the second via land in face with the first via land; and
   a conductive pillar connecting the first via land and the second via land, the pillar having an intruded zone in the first insulating layer through the hole of the first via land.

2. A multilayer wiring board as set forth in claim 1, wherein a rigidity of the conductive pillar is higher than a rigidity of the first insulating layer.

3. A multilayer wiring board as set forth in claim 1, wherein the conductive pillar is made of a conductive resin.

4. A multilayer wiring board as set forth in claim 1, wherein a contact portion of an outer side surface of the conductive pillar and a surface of the first and the second via land has a shape for reducing a stress that causes the conductive pillar to peel apart from the first and the second via lands.

5. A multilayer wiring board as set forth in claim 1, wherein a contact portion of an outer side surface of the conductive pillar and a surface of the first and the second via land are continuously smooth.

6. A multilayer wiring board as set forth in claim 1, wherein
   an angle of an outer side surface of the conductive pillar and a surface of the first and the second via land is an acute angle.

7. A multilayer wiring board having a lamination of wiring layers and at least an insulating layer, comprising:
   a first insulating layer having a first face;
   a first wiring layer formed on the first face of the first insulating layer, the first wiring layer having a first via land;
   a second insulating layer formed on the first wiring layer;
   a second via land formed on the second insulating layer, and the second via land being formed in face with the first via land;
   a conductive pillar connecting the first via land and the second via land; and
   a stress releasing means formed in the first via land or the second via land for reducing a stress when a force is applied perpendicular to a surface of the first via land or the second via land.

8. A multilayer wiring board as set forth in claim 7, wherein the stress releasing means is at least one through hole formed in the first via land or second via land.

9. A multilayer wiring board as set forth in claim 7, wherein a rigidity of the conductive pillar is higher than a rigidity of the first insulating layer.

10. A multilayer wiring board as set forth in claim 7, wherein the conductive pillar is made of a conductive resin.

11. A multilayer wiring board as set forth in claim 7, wherein a contact portion of an outer side surface of the conductive pillar and the surface of the first and the second via land has a shape for reducing a stress that causes the conductive pillar to peel apart from the first and the second via lands.

12. A multilayer wiring board as set forth in claim 7, wherein a contact portion of an outer side surface of the conductive pillar and a surface of the first and the second via land are continuously smooth.

13. A multilayer wiring board as set forth in claim 7, wherein
   an angle of an outer side surface of the conductive pillar and the surface of the first and the second via land is an acute angle.

14. A multilayer wiring board having a lamination of a wiring layer and an insulating layer, comprising:
   an insulating layer having a first face and a second face;
   a first wiring layer formed on the first face of the insulating layer, and the first wiring layer having a first via land;
   a second wiring layer formed on the second face of the insulating layer, the second wiring layer having a second via land, and the second via land formed in face with the first via land; and
   a conductive pillar connecting the first via land and the second via land,
   wherein a contact portion of an outer side surface of the conductive pillar and a surface of the first and the second via land have a shape for reducing a stress that causes the conductive pillar to peel apart from the first and the second via lands.

15. A multilayer wiring board as set forth in claim 14, wherein the conductive pillar is made of a conductive resin.

16. A multilayer wiring board as set forth in claim 14, wherein an linear thermal expansion coefficient in the axial direction of the conductive pillar is larger than that of the insulating layer.

17. A multilayer wiring board as set forth in claim 14, wherein the contact portion of the outer side surface of the conductive pillar and the surface of the first and second via land are continuously smooth.

18. A multilayer wiring board as set forth in claim 17, wherein the conductive pillar is made of a conductive resin.

19. A multilayer wiring board as set forth in claim 17, wherein an linear thermal expansion coefficient in the axial direction of the conductive pillar is larger than that of the insulating layer.

20. A multilayer wiring board as set forth in claim 14, wherein
   the shape of the contact portion having a part of an angle of the outer side surface of the conductive pillar and the surface of the first and the second via land is an acute angle.

21. A multilayer wiring board as set forth in claim 20, wherein the conductive pillar is made of a conductive resin.

22. A multilayer wiring board as set forth in claim 20, wherein an linear thermal expansion coefficient in the axial direction of the conductive pillar is larger than that of the insulating layer.

23. A prefabricated material for a multilayer wiring board, comprising:
   a conductor layer;
   a conductive pillar formed on the conductor layer, the conductive pillar having a substantially conical shape and a contact portion located at an outer side surface of the conductive pillar and a surface of the conductor layer, the contact portion having a shape for reducing a stress that causes the conductive pillar to peel apart from the conductor layer; and an insulating layer formed so that a part of the conductive pillar is exposed on the insulating layer, the insulating layer being made of an uncured insulating resin, wherein the height of the conductive pillar h is approximately in the range from 1.2 d to 5 d, wherein d represents the thickness of the insulating layer.

24. A prefabricated material for a multilayer wiring board as set forth in claim 23, wherein the contact portion of the outer side surface of the conductive pillar and the surface of the conductor layer are continuously smooth.

25. A method for manufacturing a multilayer wiring board, comprising:

a step of forming a first wiring layer having a first via land with a stress releasing means on a first insulating layer;

a step of forming a conductive pillar having a substantially conical shape at a region of a conductor layer in face with the first via land when opposed to the first wiring layer;

a step of arranging the first insulating layer and the conductor layer so as to face the first via land with the conductive pillar; and a step of pressing the first insulating layer and the conductor layer in the axial direction of the conductive pillar so as to connect the first via land and the conductive pillar.

26. A method for manufacturing a multilayer wiring board as set forth in claim 25, wherein the stress releasing means is a hole formed in the first via land, and in the step of pressing the first insulating layer and the conductor layer, wherein the first insulating layer and the conductor layer are pressed so that a part of the conductive pillar intrudes into the first insulating layer through the hole of the first via land.

27. A method for manufacturing a multilayer wiring board, comprising:

a step of forming a first wiring layer having a first via land with a stress releasing means on a first face of a first insulating layer;

a step of forming a conductive pillar having a substantially conical shape on a first via land;

a step of laminating a second insulating layer made of an uncured resin so that a part of the conductive pillar is exposed;

a step of opposing the first face of the first insulating layer and a conductor layer; and a step of pressing the first insulating layer and the conductor layer in the axial direction of the conductive pillar so as to connect the conductive pillar and the conductor layer.

28. A method for manufacturing a multilayer wiring board as set forth in claim 27, wherein the stress releasing means is a hole formed in the first via land, and in the step of pressing the first insulating layer and the conductor layer, wherein the first insulating layer and the conductor layer are pressed so that a part of the conductive pillar intrudes into the first insulating layer through the hole of the first via land.

29. A method for manufacturing a multilayer wiring board, comprising:

a step of forming a first wiring layer having a first via land with a stress releasing means on a first face of a first insulating layer;

a step of forming a first conductive pillar having a substantially conical shape on the first via land;

a step of forming a second conductive pillar having a substantially conical shape at a region of a conductor layer in face with the first conductive pillar when opposed to the first wiring layer;

a step of arranging a second insulating layer made of an uncured resin intervened between the first insulating layer and the conductor layer so as to face the first conductive pillar with the second conductive pillar; and a step of pressing the first insulating layer and the conductor layer in the axial direction of the conductive pillar so as to connect the first conductive pillar and the second conductive pillar.

30. A method for manufacturing a multilayer wiring board as set forth in claim 29, wherein the stress releasing means is a hole formed in the first or the second via land, and in the step of pressing the first insulating layer and the conductor layer, wherein the first insulating layer and the conductor layer are pressed so that a part of the first conductive pillar intrudes into the first insulating layer through the hole of the first via land.

31. A method for manufacturing a multilayer wiring board, comprising:

a step of forming a conductive pillar having a substantially conical shape on a first conductor layer so that a contact portion of an outer side surface of the conductive pillar and a surface of the first conductor layer has a shape for reducing a stress that causes the conductive pillar to peel apart from the first conductor layer;

a step of laminating an insulating layer made of an uncured resin so that a part of the conductive pillar is exposed;

a step of pressing the conductive pillar in its axial direction so that the exposed part of the conductive pillar is plastically crushed;

a step of arranging a second conductor layer on the insulating layer;

a step of pressing the first conductor layer and the second conductor layer such that the first conductor layer and the second conductor layer are connected in the axial direction of the conductive pillar; and a step of curing the insulating layer.

32. A method for manufacturing a multilayer wiring board as set forth in claim 31, in the step of pressing the first and the second conductor layers, wherein the first and the second conductor layers are pressed so that a contact portion of the outer side surface of the conductive pillar and a surface of the second conductor layer has a shape for reducing a stress that causes the conductive pillar to peel apart from the second conductor layer.

33. A method for manufacturing a multilayer wiring board as set forth in claim 31, in the step of pressing the first and the second conductor layer, wherein the first and the second conductor layers are pressed so that the contact portion of the outer side surface of the conductive pillar and a surface of the second conductor layer are continuously smooth.

34. A method for manufacturing a multilayer wiring board as set forth in claim 31, wherein in the step of forming the conductive pillar, a height of the conductive pillar h is approximately in the range of 1.2 d to 5 d, wherein d represents a thickness of the uncured insulating layer.

35. A method for manufacturing a multilayer wiring board as set forth in claim 31, in the step of forming the conductive pillar, a thickness of the uncured insulating layer d is approximately in the range of 0.02 h to 0.8 h, wherein h represents a height of the conductive pillar.

36. A method for manufacturing a multilayer wiring board, comprising:

a step of forming a first conductive pillar on a first conductor layer so that a contact portion of an outer side surface of the first conductive pillar and a surface of the first conductor layer are continuously smooth;

a step of forming a second conductive pillar on a second conductor layer so that a contact portion of an outer side surface of the second conductive pillar and a surface of the second conductor layer are continuously smooth;

a step of arranging an insulating layer made of an uncured resin intervened between the first and the second conductor layers so as to face the first conductive pillar with the second conductive pillar;

a step of pressing the first and the second conductor layers in the axial direction of the conductive pillar so as to connect the first conductive pillar and the second conductive pillar; and a step of curing the insulating layer.

37. A method for manufacturing a multilayer wiring board as set forth in claim 36, wherein a step of forming the conductive pillar, a height of the conductive pillar h is approximately in the range of 1.2 d≦h≦5 d, wherein d represents a thickness of the uncured insulating layer.

38. A method for manufacturing a multilayer wiring board as set forth in claim 36, wherein a step of forming the conductive pillar, a thickness of the uncured insulating layer d is approximately in the range of 0.02 h≦d≦0.8 h, wherein h represents a height of the conductive pillar.

39. An electronic element, comprising:

an electrode formed on a first face of the electronic element; and a conductive pillar formed on the electrode of the electronic element, wherein a contact portion of an outer side surface of the conductive pillar and a surface of the electrode has a shape for reducing a stress that causes the conductive pillar to peel apart from the electrode.

40. An electronic element as set forth in claim 39, wherein the contact portion of the outer side surface of the conductive pillar and the surface of the electrode are continuously smooth.

41. An electronic element as set forth in claim 39, wherein an angle of the outer side surface of the conductive pillar and a surface of the electrode is an acute angle.

42. An electronic element as set forth in claim 39, wherein the electronic element is a semiconductor element.

43. An electronic element package, comprising:

an electronic element having an electrode formed on a first face of the electronic element; and a wiring board on which the electronic element is mounted, the wiring board comprising:

an insulating layer having a first face and a second face, the first face of the insulating layer being faced with the first face of the electronic element, a wiring layer formed on the second face of the insulating layer, the wiring layer having a via land, and a conductive pillar connecting the via land and the electrode of the electronic element, wherein the via land has a stress releasing means.

44. An electronic element package as set forth in claim 43, wherein a contact portion of an outer side surface of the conductive pillar and a surface of the electrode has a shape for reducing a stress that causes the conductive pillar to peel apart from the electrode.

45. An electronic element package as set forth in claim 43, wherein a contact portion of an outer side surface of the conductive pillar and the surface of the electrode are continuously smooth.

46. An electronic element package as set forth in claim 43, wherein an angle of an outer side surface of the first conductive pillar and a surface of the electrode is an acute angle.

47. An electronic element package as set forth in claim 43, wherein the electronic element is a semiconductor element.

48. An electronic element package as set forth in claim 47, wherein the semiconductor element is a bare semiconductor chip.

49. An electronic element package, comprising:

an electronic element having an electrode formed on a first face of the electronic element; and a wiring board on which the electronic element is mounted, the wiring board comprising:

a first insulating layer having a first face and a second face, the first face of the insulating layer facing the first face of the electronic element, a first wiring layer formed on the second face of the first insulating layer, the first wiring layer having a first via land, and a first conductive pillar connecting the first via land and the electrode of the electronic element, a second insulating layer having a first face and a second face, the first face of the second insulating layer facing the second face of the first insulating layer, a second wiring layer formed on the second face of the second insulating layer, the second wiring layer having a second via land, and a second conductive pillar connecting the first via land and the second via land, wherein the first via land has a stress releasing means.

50. An electronic element package as set forth in claim 49, wherein a contact portion of an outer side surface of the conductive pillar and a surface of the electrode has a shape for reducing a stress that causes the first conductive pillar to peel apart from the electrode.

51. An electronic element package as set forth in claim 49, wherein a contact portion of an outer side surface of the first conductive pillar and the surface of the electrode are continuously smooth.

52. An electronic element package as set forth in claim 49, wherein an angle of an outer side surface of the first conductive pillar and a surface of the electrode is an acute angle.

53. An electronic element package as set forth in claim 49, wherein the electronic element is a semiconductor element.

54. An electronic element package as set forth in claim 49, wherein the semiconductor element is a bare semiconductor chip.

55. A method for forming a conductive pillar, comprising the steps of;

a step of arranging a mask having a through hole onto a conductor layer;

a step of filling a conductive resin into the through hole of the mask; and a step of removing the mask and the conductor layer from each other in the normal direction of the conductor layer, thereby forming the conductive resin to have a substantially conical shape on the conductor layer, and wherein a contact portion of an outer side surface of the conductive resin and a surface of the conductor layer has a shape for reducing a stress that causes the conductive resin to peel apart from the conductor layer.

56. A method for forming a conductive pillar as set forth in claim 55, wherein the step of removing the mask and the conductor layer from each other in the normal direction of the conductor layer forms the conductive resin such that the contact portion of the outer side surface of the conductive resin and the surface of the conductor layer are continuously smooth.

57. A method for forming a conductive pillar as set forth in claim 55, wherein the step of removing the mask and the conductor layer from each other in the normal direction of the conductor layer so that the conductive resin is forming a substantially conical shape on the conductor layer, and wherein an angle of the outer side surface of the conductive resin and a surface of the conductive layer is an acute angle.

58. A method for forming a conductive pillar as set forth in claim 55, wherein the step of filling a conductive resin, a viscosity of the conductive resin is determined so that a part of the conductive resin remains on the inner surface of the through hole of the mask in the step of removing the mask from the conductor layer.

59. A method for forming a conductive pillar as set forth in claim 55, the step of filling a conductive resin is carried out by a screen printing.

\* \* \* \* \*